US012787481B2

(12) United States Patent
Tong et al.

(10) Patent No.: US 12,787,481 B2
(45) Date of Patent: Nov. 3, 2026

(54) BACK CONTACT SOLAR CELL, METHOD FOR MANUFACTURING SAME, AND PHOTOVOLTAIC MODULE

(71) Applicant: LONGI GREEN ENERGY TECHNOLOGY CO., LTD., Xi'an (CN)

(72) Inventors: Hongbo Tong, Xi'an (CN); Long Yu, Xi'an (CN); Chang Liu, Xi'an (CN); Yupeng Jin, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/149,194

(22) PCT Filed: Jan. 26, 2025

(86) PCT No.: PCT/CN2025/075203
§ 371 (c)(1),
(2) Date: Jul. 18, 2025

(87) PCT Pub. No.: WO2025/167798
PCT Pub. Date: Aug. 14, 2025

(65) Prior Publication Data

US 2026/0114074 A1 Apr. 23, 2026

(30) Foreign Application Priority Data

Feb. 7, 2024 (CN) ......................... 202410175657.5
Feb. 7, 2024 (CN) ......................... 202410175669.8

(51) Int. Cl.
*H10F 77/14* (2025.01)
*H10F 77/20* (2025.01)
*H10F 77/30* (2025.01)

(52) U.S. Cl.
CPC ......... *H10F 77/147* (2025.01); *H10F 77/219* (2025.01); *H10F 77/311* (2025.01)

(58) Field of Classification Search
CPC ..... H10F 77/147; H10F 77/219; H10F 77/311
See application file for complete search history.

(56) References Cited

U.S. PATENT DOCUMENTS

2006/0130891 A1* 6/2006 Carlson ................. H10F 77/703 136/246
2011/0197951 A1* 8/2011 Abiko ................... B23P 11/022 136/246

(Continued)

FOREIGN PATENT DOCUMENTS

CN 108987503 A 12/2018
CN 216488083 U 5/2022

(Continued)

OTHER PUBLICATIONS

Chen, et al., Solar Energy, 178, (2019) 308-313 (Year: 2019).*

(Continued)

*Primary Examiner* — Sadie White
(74) *Attorney, Agent, or Firm* — Fish & Richardson P.C.

(57) ABSTRACT

The present application discloses a back contact solar cell, a method for manufacturing the same, and a photovoltaic module. An example back contact solar cell includes a semiconductor substrate, a first doped region, a second doped region, and at least one conductive semiconductor structure. Each conductive semiconductor structure includes a first conductive semiconductor portion and a second conductive semiconductor portion. The first conductive semiconductor portion is located in a spacer region between the first doped region and the second doped region. A part of the first doped region and a part of the second doped region are electrically connected to the first conductive semiconductor portion. The second conductive semiconductor por- (Continued)

tion is disposed above a part of the first doped region and/or the second doped region that faces away from the semiconductor substrate.

18 Claims, 26 Drawing Sheets

(56) References Cited

U.S. PATENT DOCUMENTS

| | | | | |
|---|---|---|---|---|
| 2012/0171799 | A1 | 7/2012 | Rim et al. | |
| 2014/0020740 | A1* | 1/2014 | Hasegawa | H10F 10/146 136/255 |
| 2014/0352770 | A1 | 12/2014 | Hwang et al. | |
| 2016/0087122 | A1* | 3/2016 | Westerberg | H10F 71/131 136/258 |
| 2016/0284924 | A1 | 9/2016 | Bronsveld et al. | |
| 2017/0194520 | A1 | 7/2017 | Deshpande et al. | |
| 2020/0335642 | A1 | 10/2020 | Rim et al. | |
| 2023/0420593 | A1 | 12/2023 | Zhang et al. | |

FOREIGN PATENT DOCUMENTS

| | | | |
|---|---|---|---|
| CN | 115832065 | A | 3/2023 |
| CN | 116417522 | A | 7/2023 |
| CN | 219626673 | U | 9/2023 |
| CN | 2197389730 | | 9/2023 |
| CN | 117253934 | A | 12/2023 |
| CN | 117317036 | A | 12/2023 |
| CN | 117374169 | A | 1/2024 |
| CN | 117393624 | A | 1/2024 |
| CN | 118198159 | A | 6/2024 |
| CN | 118522803 | A | 8/2024 |
| KR | 20180050020 | A | 5/2018 |
| WO | WO 2009074468 | A2 | 6/2009 |

OTHER PUBLICATIONS

Franklin, et al., Prog. Photovolt: Res. Appl. 2016: 24: 411-417 (Year: 2016).*

International Search Report in International Appln. No. PCT/CN2025/075203, mailed on May 13, 2025, 9 pages (with machine translation).

Office Action and Search Report in Chinese Appln. No. 202410175657.5, dated Oct. 13, 2024, 12 pages (with English translation).

Office Action and Search Report in Chinese Appln. No. 202410175669.8, dated Sep. 3, 2024, 45 pages (with English translation).

Supplemental Search Report in Chinese Appln. No. 202410175657.5, dated Oct. 22, 2024, 5 pages (with machine translation).

Extended European Search Report in European Appln. No. 25743249.2, mailed on Jun. 9, 2026, 10 pages.

Office Action in Japanese Appln. No. 2026-509042, mailed on Jul. 10, 2026, 10 pages (with machine translation).

Office Action in Japanese Appln. No. 2026-509134, mailed on Jul. 10, 2026, 8 pages (with machine translation).

* cited by examiner

BACK CONTACT SOLAR CELL, METHOD FOR MANUFACTURING SAME, AND PHOTOVOLTAIC MODULE

CROSS-REFERENCE TO RELATED APPLICATIONS

This application is a 371 national stage application of PCT Application No. PCT/CN2025/075203, filed on Jan. 26, 2025, which claims priorities to Chinese Patent Application Nos. 202410175669.8 and 202410175657.5, both filed on Feb. 7, 2024. The disclosures of the aforementioned applications are hereby incorporated by reference in their entireties.

TECHNICAL FIELD

The present application relates to the field of photovoltaic technologies, and in particular, to a back contact solar cell, a method for manufacturing the same, and a photovoltaic module.

BACKGROUND

A back contact solar cell is a solar cell in which no electrode is arranged on a light receiving surface of a cell and positive and negative electrodes are all arranged on a back surface of the solar cell, so that blocking of the electrodes to the cell can be reduced, a short-circuit current of the cell can be increased, and the energy conversion efficiency of the cell can be improved. Specifically, in a conventional back contact solar cell, two doped layers that are located on a back surface and have opposite conduction types are partially separated by using a discontinuous spacer region, to reduce a reverse breakdown voltage of the back contact solar cell and reduce a risk of hot spots in the module.

However, for the module, if the two doped layers having opposite conduction types are completely separated from each other, the back contact solar cell has a high reverse breakdown voltage, which further causes a high risk of hot spots in an actual operation process of a photovoltaic module including the conventional back contact solar cell.

SUMMARY

An objective of the present application is to provide aback contact solar cell, a method for manufacturing the same, and a photovoltaic module, so that a first doped region and a second doped region having opposite conduction types are locally electrically connected by using a conductive semiconductor structure, thereby effectively reducing a reverse breakdown voltage of the back contact solar cell.

To achieve the foregoing objective, according to a first aspect, the present application provides a back contact solar cell.

A back contact solar cell according to the first aspect of the present application includes: a semiconductor substrate, a first doped region, a second doped region, and at least one conductive semiconductor structure. The first doped region and the second doped region are alternately spaced apart on a back surface of the semiconductor substrate, and the first doped region and the second doped region have opposite conduction types. A region located between the first doped region and the second doped region is a spacer region along an arrangement direction of the first doped region and the second doped region. The conductive semiconductor structure includes a first conductive semiconductor portion and a second conductive semiconductor portion in electrical contact with each other. The first conductive semiconductor portion is located in the spacer region, and a conduction type of the first conductive semiconductor portion is opposite to the conduction type of one of the first doped region and the second doped region. Only a part of the first doped region and only a part of the second doped region are at least electrically connected to the first conductive semiconductor portion, respectively. The second conductive semiconductor portion is disposed above a part, facing away from the semiconductor substrate, of the first doped region and/or the second doped region.

In a case that the foregoing technical solution is adopted, the first doped region and the second doped region having opposite conduction types are alternately spaced apart on a back surface of the semiconductor substrate, so as to effectively shunt carriers when the back contact solar cell is in an operating state, thereby facilitating formation of a photocurrent. Also, the back contact solar cell provided in the present application further includes at least one conductive semiconductor structure at least partially located between the first doped region and the second doped region. Based on this, each conductive semiconductor structure has a conduction property, and a conduction type of the conductive semiconductor structure is opposite to a conduction type of one of the first doped region and the second doped region. Therefore, in a case that the conductive semiconductor structure is separately in electrical contact with a part of the first doped region and a part of the second doped region, the first doped region and the second doped region may be electrically connected in a manner of manufacturing a local leakage point to form a built-in diode having a low reverse breakdown voltage, thereby facilitating enabling the back contact solar cell to have a low reverse breakdown voltage when the back contact solar cell is blocked.

In addition, only a part of the first doped region and only a part of the second doped region are respectively in electrical contact with at least one conductive semiconductor structure. In other words, a part of the first doped region and a corresponding part of the second doped region are respectively in electrical contact with at least one conductive semiconductor structure, and the remaining part of the first doped region and the corresponding part of the second doped region are still physically isolated by using an insulation channel, an insulation material, or the like, so as to prevent low operating efficiency of the back contact solar cell caused by a large leakage current in a normal operating situation of the back contact solar cell due to that the conductive semiconductor structure is disposed between the first doped region and the second doped region, thereby ensuring high photoelectric conversion efficiency of a photovoltaic module including the back contact solar cell provided in the present application in a forward voltage region. Also, the conductive semiconductor structure includes the first conductive semiconductor portion and the second conductive semiconductor portion, thereby preventing that the etching precision is strictly required to obtain only the conductive semiconductor structure located only between the first doped region and the second doped region, and reducing the etching difficulty. Meanwhile, it can be further ensured that the first doped region may be locally electrically connected by using the conductive semiconductor structure. Also, regardless of whether a disposition manner corresponding to the second conductive semiconductor portion is insulation disposition or electrical disposition, the second conductive semiconductor portion may participate in actual carrier recombination by using the first conductive semiconductor portion. To be specific, the existence of the second conductive semiconductor portion can increase, to some extent, a magnitude of a leakage current of leakage of the first doped region and the second doped region by using a single conductive semiconductor structure, so as to facilitate achieving the same objective of reducing a risk of hot spots when the conductive semiconductor structure has a small size. Another adjustment factor can be provided for adjusting the conductive semiconductor structure while reducing the risk of hot spots and ensuring a high operating efficiency. This is beneficial to improving applicability of the back contact solar cell provided in the present application to different application scenarios.

In a possible implementation, the first conductive semiconductor portion and the second conductive semiconductor portion have a same conduction type and are integrally continuous. In this case, the first conductive semiconductor portion and the second conductive semiconductor portion may be simultaneously manufactured based on a same process, so as to reduce the manufacturing difficulty of the conductive semiconductor structure, simplify the manufacturing procedure of the conductive semiconductor structure, and improve the manufacturing efficiency of the back contact solar cell.

In a possible implementation, a contact surface between one of the first doped region and the second doped region that has a conduction type opposite to that of the conductive semiconductor structure, and the conductive semiconductor structure includes a side effective electrical contact surface. A height of the side effective electrical contact surface is a side effective electrical contact height Z. An extension direction of the side effective electrical contact surface is parallel to a thickness direction of the semiconductor substrate. In this case, one of the first doped region and the second doped region that has a conduction type opposite to that of the conductive semiconductor structure, and the conductive semiconductor structure have regular side shapes, which is beneficial to reducing the manufacturing difficulty of the conductive semiconductor structure and to improving the yield of the back contact solar cell.

In a possible implementation, both the first doped region and the second doped region include a plurality of strip-shaped doped regions. The strip-shaped doped regions included in the first doped region and the strip-shaped doped regions included in the second doped region are spaced apart in parallel. The first conductive semiconductor portion included in the conductive semiconductor structure is located between two adjacent strip-shaped doped regions respectively belonging to the first doped region and the second doped region, and a width direction of the conductive semiconductor structure is parallel to an extension direction of the strip-shaped doped regions.

In a possible implementation, in a case that the first doped region and the second doped region are interdigitated alternately, both the first doped region and the second doped region include a plurality of strip-shaped doped regions and at least one connection region. The strip-shaped doped regions included in the first doped region and the strip-shaped doped regions included in the second doped region are alternately spaced apart in parallel. Each connection region is electrically connected to the corresponding strip-shaped doped region having a same conduction type as the connection region. An extension direction of the connection region is different from an extension direction of the strip-shaped doped regions. Moreover, the first conductive semiconductor portion included in at least one conductive semiconductor structure is located between two adjacent strip-shaped doped regions respectively belonging to the first doped region and the second doped region, and a width direction of the conductive semiconductor structure is parallel to an extension direction of the strip-shaped doped regions. Additionally or alternatively, the first conductive semiconductor portion included in at least one conductive semiconductor structure is located between one strip-shaped doped region included in one of the first doped region and the second doped region and an adjacent connection region included in the other doped region, and a width direction of the conductive semiconductor structure is parallel to a distribution direction of the strip-shaped doped regions having the opposite conduction types.

Another back contact solar cell according to the first aspect of the present application includes: a semiconductor substrate, a first doped region, a second doped region, and at least one conductive semiconductor structure. Each conductive semiconductor structure is at least partially located between the first doped region and the second doped region, and only a part of the first doped region and only a part of the second doped region are in electrical contact with at least one conductive semiconductor structure respectively. The first doped region and the second doped region have opposite conduction types, and a conduction type of the conductive semiconductor structure is opposite to the conduction type of one of the first doped region and the second doped region. Both the first doped region and the second doped region include a plurality of strip-shaped doped regions and at least one connection region. The strip-shaped doped regions included in the first doped region and the strip-shaped doped regions included in the second doped region are alternately spaced apart in parallel on a back surface of the semiconductor substrate. Each connection region is electrically connected to the corresponding strip-shaped doped region having a same conduction type as the connection region. An extension direction of the connection region is different from an extension direction of the strip-shaped doped regions. At least one conductive semiconductor structure is at least partially located between one strip-shaped doped region included in one of the first doped region and the second doped region and an adjacent connection region included in the other doped region. Another back contact solar cell according to the first aspect is intended to locally electrically connect the first doped region and the second doped region having opposite conduction types by using the conductive semiconductor structure, thereby effectively reducing a reverse breakdown voltage of the back contact solar cell. In addition, a width of each conductive semiconductor structure along an extension direction of a spacer region is properly set, so that leakage losses of the back contact solar cell are effectively controlled, thereby enabling the back contact solar cell to have a high operating efficiency.

In a case that the foregoing technical solution is adopted, the first doped region and the second doped region having opposite conduction types are distributed on a back surface of the semiconductor substrate, so as to effectively shunt carriers when the back contact solar cell is in an operating state, thereby facilitating formation of a photocurrent. Also, the back contact solar cell provided in the present application further includes at least one conductive semiconductor structure at least partially located between the first doped region and the second doped region. Based on this, each conductive semiconductor structure has a conduction property, and a conduction type of the conductive semiconductor structure is opposite to a conduction type of one of the first doped region and the second doped region. Therefore, in a case that the conductive semiconductor structure is separately in electrical contact with a part of the first doped region and a part of the second doped region, the first doped region and the second doped region may be electrically connected in a manner of manufacturing a local leakage point to form a built-in diode having a low reverse breakdown voltage, thereby facilitating enabling the back contact solar cell to have a low reverse breakdown voltage when the back contact solar cell is blocked.

In addition, only a part of the first doped region and only a part of the second doped region are respectively in electrical contact with at least one conductive semiconductor structure. In other words, a part of the first doped region and a corresponding part of the second doped region are respectively in electrical contact with at least one conductive semiconductor structure, and the remaining part of the first doped region and the corresponding part of the second doped region are still physically isolated by using an insulation channel, an insulation material, or the like, so as to prevent low operating efficiency of the back contact solar cell caused by a large leakage current in a normal operating situation of the back contact solar cell due to that the conductive semiconductor structure is disposed between the first doped region and the second doped region, thereby ensuring high photoelectric conversion efficiency of a photovoltaic module including the back contact solar cell provided in the present application in a forward voltage region. At least one conductive semiconductor structure is at least partially located between one strip-shaped doped region included in one of the first doped region and the second doped region and an adjacent connection region included in the other doped region, so that the reverse breakdown voltage and a forward leakage loss of the back contact solar cell can be regulated in a manner of adjusting a size of the conductive semiconductor structure according to an actual application scenario, thereby improving operating performance of the back contact solar cell provided in the present application.

In a possible implementation, a region located between the first doped region and the second doped region is a spacer region. The conductive semiconductor structure includes a first conductive semiconductor portion and a second conductive semiconductor portion in electrical contact with each other. The first conductive semiconductor portion is located in the spacer region, and the second conductive semiconductor portion is disposed above a part, facing away from the semiconductor substrate, of the first doped region and/or the second doped region.

In a case that the foregoing technical solution is adopted, it can be prevented that the etching precision is strictly required to obtain only the conductive semiconductor structure located only between the first doped region and the second doped region, thereby reducing the etching difficulty. Meanwhile, it can be further ensured that the first doped region may be locally electrically connected by using the conductive semiconductor structure.

In a possible implementation, a width of a strip-shaped doped region in contact with the conductive semiconductor structure in the first doped region is D2. A width of a strip-shaped doped region in contact with the conductive semiconductor structure in the second doped region is D3. Moreover, a disposition width of a part, disposed above the strip-shaped doped regions included in the first doped region and/or the strip-shaped doped regions included in the second doped region along a width direction of the strip-shaped doped regions, of the second conductive semiconductor portion is X1. In the foregoing case, when the second conductive semiconductor portion is disposed above the strip-shaped doped regions included in the first doped region, $0.1D2 \leq X1 < 0.5D2$. Additionally or alternatively, when the second conductive semiconductor portion is disposed above the strip-shaped doped regions included in the second doped region, $0.1D3 \leq X1 < 0.5D3$.

In a case that the foregoing technical solution is adopted, descriptions are provided by using an example in which the second conductive semiconductor portion is disposed above the strip-shaped doped regions included in the first doped region along the width direction of the strip-shaped doped regions: Carriers collected by the first doped region need to be exported from the first doped region through an electrode structure in ohmic contact with the first doped region. Based on this, along the width direction of the strip-shaped doped regions, a part of the strip-shaped doped regions included in the first doped region and along an extension direction of the strip-shaped doped regions need to be directly in ohmic contact with the electrode structure, and the ohmic contact region occupies a particular width. In this case, when $0.1D2 \leq X1 < 0.5D2$, it can be prevented that the etching precision is strictly required to form the second conductive semiconductor portion having a small disposition width due to a small disposition width X1 corresponding to the second conductive semiconductor portion, thereby reducing the etching difficulty. Meanwhile, it can be further prevented that an effective electrical contact area corresponding to the conductive semiconductor structure is also small due to a small disposition width X1, resulting in a poor effect of reducing a risk of hot spots in the back contact solar cell by disposing the conductive semiconductor structure in a case that a disposition manner corresponding to the second conductive semiconductor portion is electrical disposition. In addition, it can be prevented that the electrode structure cannot be in ohmic contact with the strip-shaped doped regions included in the first doped region due to a large disposition width X1 of the second conductive semiconductor portion, to ensure that current collected by the first doped region can be exported through the electrode structure, thereby facilitating formation of a photocurrent. In addition, beneficial effects when $0.1D3 \leq X1 < 0.5D3$ are similar to beneficial effects when $0.1D2 \leq X1 < 0.5D2$. Details are not described herein again.

In a possible implementation, a disposition width of a part, disposed above the strip-shaped doped regions included in the first doped region and/or the strip-shaped doped regions included in the second doped region along a width direction of the strip-shaped doped regions, of the second conductive semiconductor portion is X1. A width of the conductive semiconductor structure along an extension direction of the spacer region is W. In a case that a disposition manner between the second conductive semiconductor portion and the corresponding strip-shaped doped region is electrical disposition, $X1 \leq W \leq 40X1$. Additionally or alternatively, a side effective electrical contact height between the first doped region and the second doped region electrically connected to each other through the conductive semiconductor structure is Z, and $X1/1500 \leq Z \leq X1/400$.

In a case that the foregoing technical solution is adopted, when a disposition manner between the second conductive semiconductor portion and the corresponding strip-shaped doped regions is electrical disposition, an effective electrical contact area corresponding to the conductive semiconductor structure not only includes a side effective electrical contact area between a side wall of the conductive semiconductor structure and the first doped region or the second doped region, but also includes a contact area between the second conductive semiconductor portion and the corresponding strip-shaped doped regions. Based on this, a value of at least one of X1, W, and Z may be adjusted to adjust a size of the effective electrical contact area, thereby affecting sizes of the reverse breakdown voltage corresponding to the back contact solar cell and the leakage current in a normal operating state. In this case, when X1≤W≤40X1, the width W of the conductive semiconductor structure has a large alternative range. The reverse breakdown voltage corresponding to the back contact solar cell and the leakage current in the normal operating state can be adjusted by adjusting the width W of the conductive semiconductor structure, thereby facilitating improving applicability of the back contact solar cell provided in this embodiment of the present application to different application scenarios. In addition, W is within the foregoing range, which can prevent a high requirement on manufacturing precision for manufacturing the conductive semiconductor structure due to a small W, thereby facilitating reducing the manufacturing difficulty of the back contact solar cell. It can be further prevented that large values of X1 and/or Z are set to reduce the reverse breakdown voltage corresponding to the back contact solar cell to within an operating requirement due to a small W, thereby affecting forming quality of the electrode structure and the like, and improving the yield of the back contact solar cell. Meanwhile, a large leakage current corresponding to a single conductive semiconductor structure due to a large W can be further prevented, thereby ensuring that the back contact solar cell has high operating performance in normal operation. In addition, beneficial effects when X1/1500≤Z≤X1/400 are similar to beneficial effects when X1≤W≤40X1. Details are not described herein again.

In a possible implementation, a width of the conductive semiconductor structure along an extension direction of the spacer region is W. In a case that the disposition manner corresponding to the second conductive semiconductor portion is electrical disposition, 0.03 mm≤X1≤0.2 mm. Additionally or alternatively, 0.03 mm≤W≤8 mm.

In a case that the foregoing technical solution is adopted, X1 is within the foregoing range, which can prevent a high requirement on manufacturing precision due to a small X1, thereby reducing the difficulty of manufacturing the back contact solar cell. It can be further prevented that the effective electrical contact area corresponding to the conductive semiconductor structure is also small due to a small X1, resulting in a poor effect of reducing a risk of hot spots on the back contact solar cell by disposing the conductive semiconductor structure. In addition, it can be prevented that a width of a part that is reserved for the strip-shaped doped region along the width direction thereof and is in ohmic contact with the electrode structure is small due to a large X1, resulting in high manufacturing difficulty of the electrode structure and/or high contact resistance between the electrode structure and the strip-shaped doped region, thereby facilitating improvement of the yield of the back contact solar cell and the contact performance between the electrode structure and the strip-shaped doped region. In addition, for beneficial effects of W within the foregoing range, refer to the foregoing descriptions. Details are not described herein again.

In a possible implementation, in a case that the first conductive semiconductor portion is located between two adjacent strip-shaped doped regions respectively belonging to the first doped region and the second doped region, a width of a strip-shaped doped region corresponding to the conductive semiconductor structure in the first doped region is D2. A width of a strip-shaped doped region corresponding to the conductive semiconductor structure in the second doped region is D3. A width of a spacer region located between the first doped region and the second doped region is D1. Along a distribution direction of the strip-shaped doped regions having opposite conduction types, a length of the conductive semiconductor structure is D, and $$D1 \le D \le D1 + \frac{1}{2}D2 + \frac{1}{2}D3.$$

In a case that the foregoing technical solution is adopted, carriers collected by the first doped region and the second doped region need to be exported through electrode structures in ohmic contact with the first doped region and the second doped region. Based on this, along the width direction of the strip-shaped doped regions, a part of the strip-shaped doped regions included in the first doped region and the second doped region and along an extension direction of the strip-shaped doped regions need to be directly in ohmic contact with the electrode structure, and the ohmic contact region occupies a particular width. In this case, when $$D \le D1 + \frac{1}{2}D2 + \frac{1}{2}D3,$$

it can be prevented that the etching precision is strictly required to form the conductive semiconductor structure having a small disposition width due to a small disposition width corresponding to the conductive semiconductor structure, thereby reducing the etching difficulty. Meanwhile, it can be further prevented that an effective electrical contact area corresponding to the conductive semiconductor structure is also small due to a small disposition width, resulting in a poor effect of reducing a risk of hot spots in the back contact solar cell by disposing the conductive semiconductor structure in a case that a disposition manner corresponding to the conductive semiconductor structure is electrical disposition. In addition, it can be further prevented that the electrode structure cannot be in ohmic contact with the strip-shaped doped regions included in the first doped region and the second doped region due to a large disposition width of the conductive semiconductor structure, to ensure that current collected by the first doped region and the second doped region can be exported through the electrode structure, thereby facilitating formation of a photocurrent.

In a possible implementation, the first doped region and the second doped region are interdigitated alternately. A width of a strip-shaped doped region in contact with the conductive semiconductor structure in the first doped region is D2. A width of a strip-shaped doped region in contact with the conductive semiconductor structure in the second doped region is D3. Moreover, a disposition width of a part, disposed on the strip-shaped doped regions included in the first doped region and/or the strip-shaped doped regions included in the second doped region along the extension direction of the strip-shaped doped regions, of the second conductive semiconductor portion is X2. In the foregoing case, when the second conductive semiconductor portion is disposed on the strip-shaped doped regions included in the first doped region, 0.1D2≤X2≤1.2D2. Additionally or alternatively, when the second conductive semiconductor portion is disposed above the strip-shaped doped regions included in the second doped region, 0.1D3≤X2≤1.2D3.

In a case that the foregoing technical solution is adopted, descriptions are provided by using an example in which the conductive semiconductor structure is disposed on the strip-shaped doped regions included in the first doped region along the extension direction of the strip-shaped doped regions: As described above, carriers collected by the first doped region need to be exported from the first doped region through an electrode structure in ohmic contact with the first doped region. Moreover, an extension length of the electrode structure on the strip-shaped doped region included in the first doped region affects the contact resistance with the first doped region, and carriers collected by each part of the strip-shaped doped region included in the first doped region can be exported from the electrode structure in time. Based on this, when $0.1D2 \leq X2 \leq 1.2D2$, it can be prevented that the etching precision is strictly required to form the conductive semiconductor structure having a small disposition width due to a small disposition width X2 of the second conductive semiconductor portion, thereby facilitating reducing the manufacturing difficulty of the back contact solar cell. Meanwhile, it can be further prevented that an effective electrical contact area corresponding to the conductive semiconductor structure is also small due to a small disposition width X2, resulting in a poor effect of reducing a risk of hot spots in the back contact solar cell by disposing the conductive semiconductor structure in a case that the disposition manner corresponding to the second conductive semiconductor portion is electrical disposition. In addition, it can be further prevented that carriers collected by an edge part of the strip-shaped doped region along the length direction cannot be exported in time due to a large spacing between an end of the electrode structure along the extension direction of the strip-shaped doped region and the strip-shaped doped region caused by a large disposition width X2 of the second conductive semiconductor portion, thereby ensuring good operating performance of the back contact solar cell. For beneficial effects when $0.1D3 \leq X2 \leq 1.2D3$, refer to the analysis of the beneficial effects when $0.1D2 \leq X2 \leq 1.2D2$. Details are not described herein again.

In a possible implementation, the first doped region and the second doped region are interdigitated alternately. A width of the connection regions, in contact with the conductive semiconductor structure, in the first doped region and the second doped region is W1. Moreover, a disposition width of a part, disposed above the connection region included in the first doped region and/or the connection region included in the second doped region along the extension direction of the strip-shaped doped regions, of the second conductive semiconductor portion is X3. $0.1W1 \leq X3 \leq 0.3W1$.

In a case that the foregoing technical solution is adopted, in an actual application process, the electrode structure may alternatively be formed above the connection region, and may even be in ohmic contact with the connection region. Based on this, the part of the electrode structure located above the connection region needs to occupy a particular width of the connection region. In this case, when $0.1W1 \leq X3 \leq 0.3W1$, it can be prevented that the etching precision is strictly required to form the conductive semiconductor structure having a small disposition width due to a small disposition width X3 of the second conductive semiconductor portion, thereby reducing the etching difficulty. Meanwhile, it can be further prevented that an effective electrical contact area corresponding to the conductive semiconductor structure is also small due to a small disposition width X3, resulting in a poor effect of reducing a risk of hot spots in the back contact solar cell by disposing the conductive semiconductor structure in a case that the disposition manner corresponding to the second conductive semiconductor portion is electrical disposition. In addition, it can be further prevented that the electrode structure cannot be formed in a small-width region of the connection region exposed outside the second conductive semiconductor portion due to a large X3, thereby facilitating reducing the manufacturing difficulty of the electrode structure. It can be further prevented that the transmission resistance corresponding to the electrode structure is large due to a small width of the electrode structure formed in the connection region, thereby ensuring good transmission performance of the electrode structure.

In a possible implementation, in a case that the conductive semiconductor structure is at least partially located between one strip-shaped doped region included in one of the first doped region and the second doped region and an adjacent connection region included in the other doped region, a width of the connection region that belongs to one of the first doped region and the second doped region and is in contact with the conductive semiconductor structure is W1. A length of the strip-shaped doped region that belongs to the other of the first doped region and the second doped region and is in contact with the conductive semiconductor structure is W2. A width of a spacer region located between the first doped region and the second doped region is D1. Moreover, a length of the conductive semiconductor structure along a width direction of the spacer region is D, and $$D1 \leq D \leq D1 + \frac{1}{2}W1 + \frac{1}{10}W2.$$

In a case that the foregoing technical solution is adopted, after a model of the back contact solar cell is determined, D1, W1, and W2 are determined fixed values. Based on this, when D is equal to D1 in a case that the conductive semiconductor structure is at least partially located between one strip-shaped doped region included in one of the first doped region and the second doped region and an adjacent connection region included in the other doped region, the conductive semiconductor structure located between the strip-shaped doped region and the connection region that have opposite conduction types and are adjacent to each other can be separately in electrical contact with the strip-shaped doped region and the connection region that have opposite conduction types and are adjacent to each other along an arrangement direction of the first doped region and the second doped region, to ensure that the first doped region and the second doped region can be electrically connected through the conductive semiconductor structure. Meanwhile, an orthographic projection area of the conductive semiconductor structure on the back surface may be accurately regulated, to ensure that a risk of hot spots corresponding to the back contact solar cell and operating efficiency under normal operation can both accurately satisfy an operating requirement. Also, carriers collected by the first doped region and the second doped region need to be exported through electrode structures in ohmic contact with the first doped region and the second doped region. Based on this, along the extension direction of the strip-shaped doped regions, a part of the strip-shaped doped regions included in the first doped region and the second doped region and along an extension direction of the strip-shaped doped regions need to be directly in ohmic contact with the electrode structure, and the ohmic contact region occupies a particular length. In this case, when $$D \leq D1 + \frac{1}{2}W1 + \frac{1}{10}W2,$$

it can be prevented that the etching precision is strictly required to form the conductive semiconductor structure having a small disposition width due to a small corresponding disposition width of the conductive semiconductor structure above a part, facing away from the semiconductor substrate, of the first doped region and/or the second doped region, thereby reducing the etching difficulty. Meanwhile, it can be further prevented that an effective electrical contact area corresponding to the conductive semiconductor structure is also small due to a small disposition width, resulting in a poor effect of reducing a risk of hot spots in the back contact solar cell by disposing the conductive semiconductor structure in a case that a disposition manner corresponding to the conductive semiconductor structure is electrical disposition. In addition, it can be further prevented that the electrode structure cannot be in ohmic contact with the strip-shaped doped regions included in the first doped region and the second doped region due to a large disposition width of the conductive semiconductor structure, to ensure that current collected by the first doped region and the second doped region can be exported through the electrode structure, thereby facilitating formation of a photocurrent.

In a possible implementation, a width of the conductive semiconductor structure along an extension direction of the spacer region is W. A side effective electrical contact height between the first doped region and the second doped region electrically connected to each other through the conductive semiconductor structure is Z. In a case that the disposition manner corresponding to the second conductive semiconductor portion is insulation disposition, $W/160000 \leq Z \leq W/25$.

In a case that the foregoing technical solution is adopted, in an actual manufacturing process, corresponding physical spacer layers are respectively formed on the first doped region and the second doped region. The physical spacer layer may be formed when the first doped region and the second doped region are manufactured by using a diffusion process, or may be formed so that the formed first doped region and second doped region are not affected by a subsequent process (for example, to prevent the formed first doped region from being inversed when the second doped region is manufactured on the back surface after the first doped region is formed, and the physical spacer layer is formed on a surface thereof). Based on this, the physical spacer layer may be a non-conductive insulation layer. In this case, regardless of whether the conductive semiconductor structure is disposed on at least one of the first doped region and the second doped region, effective electrical contact areas between the conductive semiconductor structure and the first doped region and the second doped region respectively are only effective electrical contact areas between the side surfaces of the first doped region and the second doped region and the conductive semiconductor structure respectively, i.e., a product of W and Z. In the foregoing case, values of W and Z may be adjusted, to adjust the reverse breakdown voltage of the back contact solar cell and the leakage current under normal operation, which is beneficial to improving applicability of the back contact solar cell provided in this embodiment of the present application to different application scenarios. In other words, W and Z satisfy the foregoing size relationship range, so as to prevent a large leakage current in the normal operating state of the back contact solar cell caused by a large effective electrical contact area due to an improper disposition of a ratio relationship between W and Z, thereby ensuring high operating performance of the back contact solar cell. It can be further prevented that the reverse breakdown voltage of the back contact solar cell is less reduced due to a small effective electrical contact area caused by improper disposition of a proportional relationship between W and Z, thereby ensuring that the back contact solar cell has a low risk of hot spots.

In a possible implementation, the first doped region, the second doped region, and a part of the conductive semiconductor structure are all formed in the semiconductor substrate, and a surface of each of the first doped region, the second doped region, and the conductive semiconductor structure that faces away from a light receiving surface of the semiconductor substrate is level with a surface of a corresponding region of the back surface of the semiconductor substrate. In the foregoing case, a contact surface between one of the first doped region and the second doped region that has a conduction type opposite to that of the conductive semiconductor structure, and the conductive semiconductor structure includes a side effective electrical contact surface. A height of the side effective electrical contact surface is a side effective electrical contact height Z. The side effective electrical contact height Z is equal to a minimum value of a first depth and a second depth. The first depth is a depth of one of the first doped region and the second doped region that has a conduction type opposite to that of the conductive semiconductor structure. The second depth is a depth of a part of the conductive semiconductor structure in the semiconductor substrate.

In a possible implementation, both one of the first doped region and the second doped region that has a conduction type opposite to that of the conductive semiconductor structure, and the conductive semiconductor structure include a doped semiconductor layer located on the back surface of the semiconductor substrate. A contact surface between one of the first doped region and the second doped region that has a conduction type opposite to that of the conductive semiconductor structure, and the conductive semiconductor structure includes a side effective electrical contact surface. A height of the side effective electrical contact surface is a side effective electrical contact height Z. The side effective electrical contact height Z is equal to a minimum value of the first depth and the second depth. Along a direction facing away from the back surface of the semiconductor substrate in the extension direction of the side effective electrical contact surface, the first depth is a depth of a side effective electrical contact surface corresponding to one of the first doped region and the second doped region that has a conduction type opposite to that of the conductive semiconductor structure, and the second depth is a depth of a side effective electrical contact surface corresponding to the conductive semiconductor structure.

In a case that the foregoing technical solution is adopted, regardless of whether the first doped region, the second doped region, and the conductive semiconductor structure are all formed in the semiconductor substrate, or one of the first doped region and the second doped region that has a conduction type opposite to that of the conductive semiconductor structure and the conductive semiconductor structure include the doped semiconductor layer formed on the back surface of the semiconductor substrate, the size of the effective electrical contact area corresponding to the conductive semiconductor structure may be adjusted by adjusting a first thickness and a second thickness (or the first depth and the second depth). Further, a magnitude of a leakage current of leakage of the first doped region and the second doped region by using the conductive semiconductor structure is adjusted, thereby facilitating balancing the reverse breakdown voltage corresponding to the back contact solar cell and the operating efficiency.

In a possible implementation, in a case that the first doped region, the second doped region, and the conductive semiconductor structure all include the doped semiconductor layer formed on the back surface of the semiconductor substrate, when a height of disposing, close to the back surface of the semiconductor substrate, the doped semiconductor layer included in one of the first doped region and the second doped region that has a conduction type opposite to that of the conductive semiconductor structure is less than a height of disposing, close to the back surface of the semiconductor substrate, the doped semiconductor layer included in the conductive semiconductor structure, a part of a side surface of the doped semiconductor layer included in one of the first doped region and the second doped region that has a conduction type opposite to that of the conductive semiconductor structure is in electrical contact with the semiconductor substrate, and another part of the side surface of the doped semiconductor layer included in one of the first doped region and the second doped region that has a conduction type opposite to that of the conductive semiconductor structure is in electrical contact with the conductive semiconductor structure, the side effective electrical contact height Z is equal to the thickness of the conductive semiconductor structure. Alternatively, when heights of disposing, close to the back surface of the semiconductor substrate, the doped semiconductor layer included in one of the first doped region and the second doped region that has a conduction type opposite to that of the conductive semiconductor structure and the doped semiconductor layer included in the conductive semiconductor structure are different, and regions corresponding to the conductive semiconductor structure in a side surface of the doped semiconductor layer included in one of the first doped region and the second doped region that has a conduction type opposite to that of the conductive semiconductor structure are in electrical contact with the conductive semiconductor structure, the side effective electrical contact height Z is equal to the thickness of one of the first doped region and the second doped region that has a conduction type opposite to that of the conductive semiconductor structure.

In a case that the foregoing technical solution is adopted, an effective electrical contact area corresponding to the conductive semiconductor structure may be precisely adjusted according to different effective electrical contact thicknesses in each case, so as to precisely adjust the magnitude of the leakage current of leakage of the first doped region and the second doped region by using the conductive semiconductor structure, thereby improving the yield of the back contact solar cell.

In a possible implementation, in a case that the height of disposing, on the back surface of the semiconductor substrate, the doped semiconductor layer included in one of the first doped region and the second doped region that has a conduction type opposite to that of the conductive semiconductor structure is smaller than the height of disposing, on the back surface of the semiconductor substrate, the doped semiconductor layer included in the other doped region and a part of the side surface of the doped semiconductor layer included in one of the first doped region and the second doped region that has a conduction type opposite to that of the conductive semiconductor structure is in electrical contact with the semiconductor substrate, a difference between a height of a region surface corresponding to the conductive semiconductor structure and a height of a region surface corresponding to the doped semiconductor layer included in one of the first doped region and the second doped region that has a conduction type opposite to that of the conductive semiconductor structure is greater than or equal to 0.4 μm and is less than or equal to 2 μm in the back surface along the thickness direction of the semiconductor substrate.

In a case that the foregoing technical solution is adopted, descriptions are provided by using an example in which the doped semiconductor layer included in the first doped region and the conductive semiconductor structure have opposite conduction types: When the doped semiconductor layer included in the first doped region is formed, it is difficult to fill a material for manufacturing the doped semiconductor layer included in the first doped region at a corner caused by the height difference. Consequently, it is difficult for the doped semiconductor layer included in the first doped region to be completely in contact with each part of the surface of the semiconductor substrate (or, the semiconductor substrate and the conductive semiconductor structure) at the corner. Therefore, the difference between the height of the region surface, corresponding to the back surface, of the conductive semiconductor structure and the height of the region surface of the doped semiconductor layer that has a conduction type opposite to that of the conductive semiconductor structure falls within the foregoing range. The part, filled at the corner, of the doped semiconductor layer included in the first doped region may be staggered from the side wall of the conductive semiconductor structure that has a conduction type opposite to that of the first doped region, to ensure a large side effective electrical contact area between the conductive semiconductor structure and the first doped region having opposite conduction types. Corresponding beneficial effects when the doped semiconductor layer included in the second doped region has a conduction type opposite to that of the conductive semiconductor structure are the same as the foregoing effects. Details are not described herein again.

In a possible implementation, a side effective electrical contact height between the first doped region and the second doped region electrically connected to each other through the conductive semiconductor structure is Z, where $0.00005\ \text{mm} \le Z \le 0.002\ \text{mm}$.

In a case that the foregoing technical solution is adopted, in an actual application process, in consideration of aspects such as a carrier shunting capability and a consumption usage, the first doped region and the second doped region included in the back contact solar cell usually have a reasonable thickness (or depth) range. Moreover, the size of the side effective electrical contact height Z affects the effective electrical contact area corresponding to the conductive semiconductor structure, and further affects a magnitude of a leakage current that is locally turned on by the first doped region and the second doped region through a single conductive semiconductor structure. In this case, the side effective electrical contact height is within the foregoing range, so as to prevent a poor balancing effect between a risk of hot spots of the back contact solar cell and operating efficiency under normal operation due to an excessively large or excessively small effective electrical contact area corresponding to the conductive semiconductor structure. In addition, a large amount of materials used for manufacturing the conductive semiconductor structure caused by a large side effective electrical contact height can be further prevented, which is beneficial to controlling the manufacturing cost of the back contact solar cell.

In a possible implementation, the back contact solar cell includes a plurality of conductive semiconductor structures. The adjacent conductive semiconductor structures are spaced apart. In this case, a large local leakage current between the first doped region and the second doped region due to contact between different adjacent conductive semiconductor structures can be prevented.

In a possible implementation, in a case that the back contact solar cell is an entire back contact solar cell, a quantity of the conductive semiconductor structures included in the back contact solar cell is greater than or equal to 30 and is less than or equal to 8000. Alternatively, in a case that the back contact solar cell is a 1/N sliced back contact solar cell, a quantity of the conductive semiconductor structures included in the back contact solar cell is greater than or equal to 30/N and is less than or equal to 8000/N. N is a positive integer greater than or equal to 2.

In a case that the foregoing technical solution is adopted, it may be understood that, when the size of each conductive semiconductor structure is fixed, a larger quantity of the conductive semiconductor structures formed on the back surface indicates a larger sum of orthographic projection areas of the conductive semiconductor structures on the back surface. Also, within a particular range, a larger quantity of the conductive semiconductor structures indicates a larger reverse breakdown voltage corresponding to the back contact solar cell. However, beyond a corresponding range, even if more conductive semiconductor structures are disposed on the back surface, a variation amplitude of the reverse breakdown voltage corresponding to the back contact solar cell is small and even zero. However, after the quantity of the conductive semiconductor structures increases to a large range, the operating efficiency of the back contact solar cell may be reduced as the leakage current increases. Based on this, in a case that the back contact solar cell is an entire back contact solar cell, the quantity of the conductive semiconductor structures included in the back contact solar cell is set to be greater than or equal to 30 and less than or equal to 8000, so that a small reduction amplitude of the reverse breakdown voltage corresponding to the back contact solar cell caused by a small quantity of the conductive semiconductor structures can be prevented, thereby ensuring that a risk of hot spots of the back contact solar cell can be reduced to be within an operating requirement. In addition, a low operating efficiency of the photovoltaic module including the back contact solar cell provided in the present application caused by disposition of a large quantity of conductive semiconductor structures can be further prevented. For beneficial effects when the quantity of the conductive semiconductor structures included in the back contact solar cell is greater than or equal to 30/N and is less than or equal to 8000/N in a case that the back contact solar cell is a 1/N sliced back contact solar cell, refer to the analysis of the foregoing beneficial effects when the quantity of the conductive semiconductor structures included in the back contact solar cell is greater than or equal to 30 and is less than or equal to 8000 in a case that the back contact solar cell is an entire back contact solar cell. Details are not described herein again.

In a possible implementation, in a case that the disposition manner corresponding to the second conductive semiconductor portion is electrical disposition, when the back contact solar cell is an entire back contact solar cell, the quantity of the conductive semiconductor structures disposed on the back surface is greater than or equal to 30 and is less than or equal to 4000. When the back contact solar cell is a 1/N sliced back contact solar cell, a quantity of the conductive semiconductor structures disposed on the back surface is greater than or equal to 30/N and is less than or equal to 4000/N. N is a positive integer greater than or equal to 2.

In a case that the foregoing technical solution is adopted, under the same other factors, compared with the disposition manner corresponding to the second conductive semiconductor portion being insulation disposition, the disposition manner corresponding to the second conductive semiconductor portion being electrical disposition implements a large effective electrical contact area corresponding to the conductive semiconductor structure. Based on this, in a case that the disposition manner corresponding to the second conductive semiconductor portion is electrical disposition, the quantity of the conductive semiconductor structures disposed on the back surface is within the foregoing range, so that a small reduction amplitude of the reverse breakdown voltage corresponding to the back contact solar cell caused by a small quantity of the conductive semiconductor structures can be prevented, thereby ensuring that a risk of hot spots of the back contact solar cell can be reduced to be within an operating requirement. In addition, a low operating efficiency of the photovoltaic module including the back contact solar cell provided in the present application caused by disposition of a large quantity of conductive semiconductor structures can be further prevented.

In a possible implementation, in a case that the disposition manner corresponding to the second conductive semiconductor portion is insulation disposition, when the back contact solar cell is an entire back contact solar cell, the quantity of the conductive semiconductor structures disposed on the back surface is greater than or equal to 5000 and is less than or equal to 8000. When the back contact solar cell is a 1/N sliced back contact solar cell, a quantity of the conductive semiconductor structures disposed on the back surface is greater than or equal to 5000/N and is less than or equal to 8000/N. N is a positive integer greater than or equal to 2.

In a case that the foregoing technical solution is adopted, under the same other factors, compared with the disposition manner corresponding to the second conductive semiconductor portion being electrical disposition, the disposition manner corresponding to the second conductive semiconductor portion being insulation disposition implements a small effective electrical contact area corresponding to the conductive semiconductor structure. Based on this, in a case that the disposition manner corresponding to the second conductive semiconductor portion is insulation disposition, a large quantity of conductive semiconductor structures may be properly disposed on the back surface, so that the reverse breakdown voltage of the back contact solar cell can be reduced to a target range. Based on this, the quantity of the conductive semiconductor structures disposed on the back surface is within the foregoing range, so that a small reduction amplitude of the reverse breakdown voltage corresponding to the back contact solar cell caused by a small quantity of the conductive semiconductor structures can be prevented, thereby ensuring that a risk of hot spots of the back contact solar cell can be reduced to be within an operating requirement. In addition, a low operating efficiency of the photovoltaic module including the back contact solar cell provided in the present application caused by disposition of a large quantity of conductive semiconductor structures can be further prevented.

In a possible implementation, orthographic projection areas of the different conductive semiconductor structures on the back surface are equal.

In a case that the foregoing technical solution is adopted, when the orthographic projection areas of different conductive semiconductor structures on the back surface are equal, the magnitudes of leakage currents corresponding to the different conductive semiconductor structures after being electrically connected to each other in the first doped region and the second doped region may be the same. Therefore, reverse breakdown voltages of built-in diodes disposed in different regions between the first doped region and the second doped region may be equal, so as to prevent a problem that the solar cell may be burned out due to local heat concentration when the back contact solar cell is blocked, and to further reduce a risk of hot spots of the photovoltaic module including the back contact solar cell provided in the present application.

In a possible implementation, the different conductive semiconductor structures are evenly distributed on the back surface. In this case, reverse breakdown voltages of built-in diodes formed after the conductive semiconductor structures are disposed between different regions of the first doped region and corresponding regions of the second doped region may be equal, so as to prevent a problem that the solar cell may be burned out due to local heat concentration when the back contact solar cell is blocked, and to further reduce a risk of hot spots of the photovoltaic module including the back contact solar cell provided in the present application.

In a possible implementation, the different conductive semiconductor structures are distributed on the back surface in a matrix form. The adjacent rows of the conductive semiconductor structures distributed in a matrix form are aligned with or staggered from each other. In this case, different conductive semiconductor structures are distributed on the back surface regularly, and adjacent rows of the conductive semiconductor structures in a matrix distribution are also aligned or staggered, so as to reduce difficulty in manufacturing the conductive semiconductor structures, and further evenly distribute the conductive semiconductor structures on the back surface, thereby further preventing a problem that the solar cell may be burned out due to local heat concentration when the back contact solar cell is blocked.

In a possible implementation, in a case that the adjacent rows of the conductive semiconductor structures distributed in a matrix form are staggered from each other, a staggered distance between two adjacent rows of the conductive semiconductor structures is equal to half a geometrical center distance between two adjacent conductive semiconductor structures in a same row. In this case, the distribution density of the conductive semiconductor structure between different regions of the first doped region and corresponding regions of the second doped region may be approximately the same, so as to prevent a problem that the solar cell may be burned out due to local heat concentration when the back contact solar cell is blocked because there is a long region physically isolated by using an insulation channel or an insulation material between the first doped region and the second doped region.

In a possible implementation, in a case that the disposition manner corresponding to the second conductive semiconductor portion is insulation disposition, an effective electrical contact area corresponding to at least one conductive semiconductor structure is greater than or equal to 0.000025 mm2 and is less than or equal to 0.016 mm2.

In a case that the foregoing technical solution is adopted, the effective electrical contact area corresponding to at least one conductive semiconductor structure is within the foregoing range, thereby preventing a low amplitude of reducing the reverse breakdown voltage of the back contact solar cell by disposing the conductive semiconductor structure due to a small effective electrical contact area corresponding to the conductive semiconductor structure, preventing the back contact solar cell from being burned out due to local heat concentration, and effectively reducing a risk of hot spots of the photovoltaic module including the back contact solar cell provided in the present application. It can be prevented that the etching precision is strictly required to form the conductive semiconductor structure having a small size, thereby reducing the etching difficulty. In addition, a large leakage current of the back contact solar cell in a normal operating situation caused by a large effective electrical contact area corresponding to the conductive semiconductor structure can be prevented, thereby further ensuring that the photovoltaic module including the back contact solar cell provided in the present application has a high photoelectric conversion efficiency in a forward voltage region. In addition, it can be further prevented that a size range to which the back contact solar cell provided in the present application is applicable is limited due to a large value of W and/or Z for increasing the effective electrical contact area corresponding to the conductive semiconductor structure, thereby further expanding the application range of the back contact solar cell provided in the present application.

In a possible implementation, in a case that the disposition manner corresponding to the second conductive semiconductor portion is electrical disposition, an effective electrical contact area corresponding to at least one conductive semiconductor structure is greater than or equal to 0.000175 mm2 and is less than or equal to 1.616 mm2. Beneficial effects in this case are similar to the beneficial effects when an effective electrical contact area corresponding to at least one conductive semiconductor structure is greater than or equal to 0.000025 mm2 and is less than or equal to 0.016 mm2 in a case that the disposition manner corresponding to the second conductive semiconductor portion is insulation disposition. Details are not described herein again.

In a possible implementation, an orthographic projection area, on the back surface, of a part of at least one conductive semiconductor structure located between the first doped region and the second doped region is S1, an area of the back surface is S2, and a ratio of S1 to S2 is greater than or equal to 8.5×10-7% and is less than or equal to 6.67×10-1%.

In a case that the foregoing technical solution is adopted, the ratio of S1 to S2 is within the foregoing range, thereby preventing a low amplitude of reducing the reverse breakdown voltage of the back contact solar cell by disposing the conductive semiconductor structure due to a small S1, preventing the back contact solar cell from being burned out due to local heat concentration, and effectively reducing a risk of hot spots of the photovoltaic module including the back contact solar cell provided in the present application. It can be prevented that the etching precision is strictly required to form the conductive semiconductor structure having a small size, thereby reducing the etching difficulty. In addition, a large leakage current of the back contact solar cell in a normal operating situation caused by a large S1 can be prevented, thereby further ensuring that the photovoltaic module including the back contact solar cell provided in the present application has a high photoelectric conversion efficiency in a forward voltage region.

In a possible implementation, an orthographic projection area, on the back surface, of a part of at least one conductive semiconductor structure located between the first doped region and the second doped region is S1, an area of the back surface is S2, and a ratio of S1 to S2 is greater than or equal to 7.2×10-6% and is less than or equal to 4.6×10-3%. In this case, the ratio of S1 to S2 has a large alternative range. An appropriate solution may be selected according to requirements such as a model of the back contact solar cell in an actual application scenario, leakage prevention, and reduction of a risk of hot spots, thereby facilitating improving applicability of the back contact solar cell provided in the present application to different application scenarios. In addition, an effective electrical contact area corresponding to a single conductive semiconductor structure can be prevented from being excessively small or excessively large. For the effect, refer to the foregoing descriptions. Details are not described herein again.

In a possible implementation, an orthographic projection area, on the back surface, of the second conductive semiconductor portion is S4, an area of the back surface is S2, and a ratio of S4 to S2 is greater than 0 and is less than or equal to 4.6×10-3%. In this case, impact on formation of an electrode structure caused by a large disposition width of the second conductive semiconductor portion on the first doped region and/or the second doped region due to a large ratio of S4 to S2 can be prevented, thereby reducing difficulty in manufacturing the electrode structure, and ensuring that the electrode structure has good contact performance with the corresponding doped region and the electrode structure has good transmission performance.

In a possible implementation, a sum of orthographic projection areas, on the back surface, of parts of all the conductive semiconductor structures located between the first doped region and the second doped region is S3, an area of the back surface is S2, and a ratio of S3 to S2 is greater than or equal to 0.002% and is less than or equal to 20%.

In a case that the foregoing technical solution is adopted, the ratio of S3 to S2 is within the foregoing range, thereby preventing a small orthographic projection area of a single conductive semiconductor structure on the back surface and/or a small quantity of conductive semiconductor structures disposed on the back surface due to a small ratio of S3 to S2, and ensuring that the back contact solar cell reduces the reverse breakdown voltage of the back contact solar cell to a range meeting an operating requirement due to disposition of a suitable quantity of conductive semiconductor structures and a suitable orthographic projection area. In addition, a low operating efficiency of the photovoltaic module including the back contact solar cell in the forward voltage region caused by a large orthographic projection area of a single conductive semiconductor structure on the back surface and/or a large quantity of conductive semiconductor structures disposed on the back surface due to a large ratio of S3 to S2 can be further prevented.

In a possible implementation, a width of a spacer region located between the first doped region and the second doped region is D1. A width of the conductive semiconductor structure along an extension direction of the spacer region is W, and 0.5D1≤W≤6D1.

In a case that the foregoing technical solution is adopted, effective electrical contact areas between the conductive semiconductor structure and the first doped region and the second doped region separately and area ratios of parts of the conductive semiconductor structure in effective electrical contact with the first doped region and the second doped region separately on the back surface may be effectively adjusted by adjusting a value of W, thereby preventing a low amplitude of reducing the reverse breakdown voltage of the back contact solar cell by disposing the conductive semiconductor structure due to a small effective electrical contact area between a single conductive semiconductor structure and the first doped region and the second doped region and a small sum of area ratios of parts of all conductive semiconductor structures in effective electrical contact with the first doped region and the second doped region separately on the back surface, and preventing the back contact solar cell from being burned out due to local heat concentration. However, within a particular range, a small-sized conductive semiconductor structure has a higher requirement on the etching precision. Therefore, if W≥0.5D1, the manufacturing difficulty of forming the conductive semiconductor structure on the back surface can be further reduced. In addition, each conductive semiconductor structure may be considered as a local compound center disposed between the first doped region and the second doped region. Based on this, if W is within the foregoing range, a large local leakage current between the first doped region and the second doped region due to a large value of W can be further prevented, thereby ensuring that the photovoltaic module including the back contact solar cell provided in the present application has a high photoelectric conversion efficiency in the forward voltage region.

In a possible implementation, 0.5D1≤W≤3D1.

In a case that the foregoing technical solution is adopted, in an actual application process, not only the width of the conductive semiconductor structure along the extension direction of the spacer region affects the effective electrical contact areas between the conductive semiconductor structure and the first doped region and the second doped region, but also the thickness of the conductive semiconductor structure (and in a case that the conductive semiconductor structure is further electrically disposed above a part, facing away from the semiconductor substrate, of the first doped region and/or the second doped region, the width of a part, disposed on the first doped region and/or the second doped region, of the conductive semiconductor structure) may also affect the size of the effective electrical contact area. It may be understood that, in a case that the heights of disposing, on the semiconductor substrate, the doped semiconductor layers included in the first doped region and the second doped region are different, the height of disposing the doped semiconductor layer at a smaller height is smaller than the height of disposing the conductive semiconductor structure on the semiconductor substrate, and the conduction type of the doped semiconductor layer at a smaller height of disposition is opposite to that of the conductive semiconductor structure, a larger thickness of the conductive semiconductor structure indicates a larger effective electrical contact area. In the foregoing case, the width W of the conductive semiconductor structure along the extension direction of the spacer region is within the foregoing range, so that a predetermined disposition space may be reserved at least for athickness range of the conductive semiconductor structure and/or a disposition width range in the case of electrical disposition, thereby preventing a small reduction degree of a leakage loss of the back contact solar cell due to a large effective electrical contact area due to a large thickness and width W of the conductive semiconductor structure and a large disposition width in the case of electrical disposition, and ensuring a high operating efficiency of the back contact solar cell.

In a possible implementation solution, the conductive semiconductor structure and the first doped region have a same conduction type and are integrally continuous. Alternatively, the conductive semiconductor structure and the second doped region have a same conduction type and are integrally continuous.

In a case that the foregoing technical solution is adopted, in an actual manufacturing process, a same process may be adopted to manufacture the first doped region or the second doped region while manufacturing the conductive semiconductor structure. For example, during manufacture of the first doped region or the second doped region, the first doped region or the second doped region disposed only in a local region of the back surface may be separately obtained in a manner of selectively etching the entire doped semiconductor material layer formed on the back surface. Based on this, in a case that the conductive semiconductor structure is integrally continuous with the first doped region or the second doped region, the conductive semiconductor structure and the first doped region (or the second doped region) are formed based on a same doped semiconductor material layer. In this way, while manufacturing costs of the back contact solar cell are reduced, the conductive semiconductor structure does not need to be formed separately by using a depositing process and an etching process, thereby simplifying a manufacturing procedure of the back contact solar cell, and improving the manufacturing efficiency of the back contact solar cell.

In a possible implementation, the back contact solar cell further includes a surface passivation layer and an electrode structure. The surface passivation layer is formed on at least the first doped region, the second doped region, and the conductive semiconductor structure. The electrode structure extends through the surface passivation layer, and is separately in ohmic contact with the first doped region and the second doped region. A part, electrically connected to the first doped region, of the electrode structure and a part, electrically connected to the second doped region, of the electrode structure are isolated from each other. Along a direction parallel to the back surface, a minimum spacing between the electrode structure and a part, covering the conductive semiconductor structure, of the surface passivation layer is greater than or equal to 30 μm and is less than or equal to 250 μm.

In a case that the foregoing technical solution is adopted, in an actual application process, a device for manufacturing an electrode structure usually has processing errors, thus causing a target forming range of the electrode structure to deviate from an actual forming range. Based on this, the minimum spacing between the electrode structure and the part, covering the conductive semiconductor structure, of the surface passivation layer is within the foregoing range, thereby preventing that the electrode structure is at least partially formed above the conductive semiconductor structure due to the small minimum spacing and the collected carriers in the first doped region and/or the second doped region cannot be thus exported in time. In addition, a small width of the conductive semiconductor structure disposed on the first doped region and the second doped region due to the large minimum spacing can be further prevented, thereby ensuring that each conductive semiconductor structure has a large effective electrical contact area, which is beneficial to reducing the reverse breakdown voltage of the back contact solar cell.

In a possible implementation, at least one of the first doped region, the second doped region, and the conductive semiconductor structure includes a doped semiconductor layer located on the back surface of the semiconductor substrate. The back contact solar cell further includes a passivation layer located between the semiconductor substrate and the doped semiconductor layer. In this case, the passivation layer may passivate a corresponding region on the back surface of the semiconductor substrate, to reduce a carrier recombination rate.

In a possible implementation, the doped semiconductor layer includes: at least one of a doped polycrystalline silicon layer, a doped monocrystalline silicon layer, a doped amorphous silicon layer, a doped microcrystalline silicon layer, and a doped nanocrystalline silicon layer. Additionally or alternatively, in a case that a passivation layer is provided between the doped semiconductor layer included in the first doped region and the semiconductor substrate, the passivation layer located between the doped semiconductor layer included in the first doped region and the semiconductor substrate is a tunneling passivation layer or an intrinsic amorphous silicon layer. Additionally or alternatively, in a case that a passivation layer is provided between the doped semiconductor layer included in the second doped region and the semiconductor substrate, the passivation layer located between the second doped region and the semiconductor substrate is a tunneling passivation layer or an intrinsic amorphous silicon layer. Additionally or alternatively, in a case that a passivation layer is provided between the doped semiconductor layer included in the conductive semiconductor structure and the semiconductor substrate, the passivation layer located between the conductive semiconductor structure and the semiconductor substrate is a tunneling passivation layer or an intrinsic amorphous silicon layer. In the foregoing case, there are a plurality of alternatives for the type of the doped semiconductor layer and the type of different passivation layers, which helps to expand the application range of the back contact solar cell provided in the present application.

In a possible implementation, both the first doped region and the second doped region include a doped semiconductor layer located on the back surface of the semiconductor substrate.

In a possible implementation, when one of the first doped region and the second doped region includes a doped semiconductor layer located on the back surface of the semiconductor substrate and the other doped region is located in the semiconductor substrate, the second conductive semiconductor portion is disposed above a part, facing away from the semiconductor substrate, of one of the first doped region and the second doped region in the semiconductor substrate.

In a possible implementation, the conductive semiconductor structure further includes a third conductive semiconductor portion in electrical contact with the first conductive semiconductor portion. The third conductive semiconductor portion is disposed above a part, facing away from the semiconductor substrate, of the doped semiconductor layer.

In a possible implementation, when both the first doped region and the second doped region are formed in the semiconductor substrate, the conductive semiconductor structure further includes a third conductive semiconductor portion in electrical contact with the first conductive semiconductor portion. One of the second conductive semiconductor portion and the third conductive semiconductor portion is disposed above a part, facing away from the semiconductor substrate, of one of the first doped region and the second doped region. The other of the second conductive semiconductor portion and the third conductive semiconductor portion is disposed above a part, facing away from the semiconductor substrate, of the other of the first doped region and the second doped region.

In a case that the foregoing technical solution is adopted, there are at least the foregoing four solutions for disposing the first doped region and the second doped region on the back surface of the semiconductor substrate, and there are also different disposition manners corresponding to different conductive semiconductor structures according to each solution, thereby facilitating selecting an appropriate solution according to different application scenario requirements and requirements on the size of the effective electrical contact area, and facilitating expanding the application range of the back contact solar cell provided in the present application.

In a possible implementation, in a case that the disposition manner corresponding to the second conductive semiconductor portion is insulation disposition, the back contact solar cell further includes a physical spacer layer disposed between the second conductive semiconductor portion and the corresponding first doped region and/or the corresponding second doped region. The physical spacer layer includes a doped silicon glass layer or a surface passivation layer.

In a possible implementation, in a case that the disposition manner corresponding to the second conductive semiconductor portion is electrical contact, the back contact solar cell further includes a physical spacer layer disposed between the second conductive semiconductor portion and the corresponding first doped region and/or the corresponding second doped region. The physical spacer layer includes a tunneling passivation layer or an intrinsic amorphous silicon layer.

In a possible implementation, an effective electrical contact area corresponding to the conductive semiconductor structure is S, and $S=\alpha\times W\times X+\beta\times W\times Z$, where $0\leq\alpha\leq1$, and $0\leq\beta\leq1$. A width of the conductive semiconductor structure along an extension direction of the spacer region is W. A height of a side effective electrical contact surface between one of the first doped region and the second doped region that has a conduction type opposite to that of the conductive semiconductor structure, and the conductive semiconductor structure is a side effective electrical contact height Z. A disposition width of the second conductive semiconductor portion is X.

In a case that the foregoing technical solution is adopted, the effective electrical contact area S corresponding to the conductive semiconductor structure is related to $\alpha$, W, X, $\beta$, and Z. The effective electrical contact area may be adjusted by adjusting values of $\alpha$, W, X, $\beta$, and Z, to obtain a suitable area of an effective electrical contact surface, thereby implementing an optimized design of product configuration.

In a possible implementation, the effective electrical contact surface corresponding to the conductive semiconductor structure includes a side effective electrical contact surface and/or a top effective electrical contact surface. Moreover, the effective electrical contact area S is equal to $\alpha\times W\times X+\beta\times Z\times W$, where $0\leq\alpha\leq1$, and $0\leq\beta\leq1$. A width of the conductive semiconductor structure along an extension direction of the spacer region is W. A height of a side effective electrical contact surface between one of the first doped region and the second doped region that has a conduction type opposite to that of the conductive semiconductor structure, and the conductive semiconductor structure is a side effective electrical contact height Z. A disposition width of the second conductive semiconductor portion is X.

In a possible implementation, in a case that the disposition manner corresponding to the second conductive semiconductor portion is insulation disposition, $\alpha$ is equal to 0, and $\beta$ is greater than 0.

In a possible implementation, in a case that the disposition manner corresponding to the second conductive portion is electrical disposition and the conductive semiconductor structure is not in electrical contact with a side surface of one of the first doped region and the second doped region that has a conduction type opposite to that of the conductive semiconductor structure, $\beta$ is equal to 0, and $\alpha$ is greater than 0.

In a possible implementation, in a case that the disposition manner corresponding to the second conductive portion is electrical disposition and the conductive semiconductor structure is in electrical contact with a side surface of one of the first doped region and the second doped region that has a conduction type opposite to that of the conductive semiconductor structure, both $\alpha$ and $\beta$ are greater than 0.

According to a second aspect, the present application provides a photovoltaic module. The photovoltaic module includes a solar cell according to the foregoing first aspect and various implementations of the first aspect.

For beneficial effects of the second aspect and various implementations of the second aspect in the present application, refer to the analysis of the beneficial effects of the first aspect and various implementations of the first aspect. Details are not described herein.

According to a third aspect, the present application further provides a method for manufacturing a back contact solar cell. The method for manufacturing a back contact solar cell includes the following steps. First, a semiconductor substrate is provided. Next, a first doped region and a second doped region are formed on a back surface of the semiconductor substrate. The first doped region and the second doped region are alternately spaced apart on the back surface of the semiconductor substrate, and the first doped region and the second doped region have opposite conduction types. A region located between the first doped region and the second doped region is a spacer region along an arrangement direction of the first doped region and the second doped region. Next, a conductive semiconductor structure is formed on the back surface of the semiconductor substrate. The conductive semiconductor structure includes a first conductive semiconductor portion and a second conductive semiconductor portion in electrical contact with each other. The first conductive semiconductor portion is located in the spacer region, and a conduction type of the first conductive semiconductor portion is opposite to the conduction type of one of the first doped region and the second doped region. Only a part of the first doped region and only a part of the second doped region are at least electrically connected to the first conductive semiconductor portion, respectively. The second conductive semiconductor portion is disposed above a part, facing away from the semiconductor substrate, of the first doped region and/or the second doped region.

In a possible implementation, the back surface of the semiconductor substrate has a first region and a second region alternately spaced apart, and a spacer region located between the first region and the second region adjacent to the first region. In this case, the step of forming a first doped region, a second doped region, and a conductive semiconductor structure on a back surface of the semiconductor substrate includes the following operations. The first doped region is formed in the first region. Next, an entire doped semiconductor material layer is formed in the first doped region, the spacer region, and the second region. The doped semiconductor material layer is selectively etched to remove a part of the first doped region and a part of the spacer region corresponding to the doped semiconductor material layer. The second doped region and at least one conductive semiconductor structure are formed from the selectively etched doped semiconductor material layer. The second doped region is located in the second region.

In a possible implementation, the back surface of the semiconductor substrate has a first region and a second region alternately spaced apart, and a spacer region located between the first region and the second region adjacent to the first region. In this case, the step of forming a first doped region, a second doped region, and a conductive semiconductor structure on a back surface of the semiconductor substrate includes the following operations. The second doped region is formed in the first region. Next, an entire doped semiconductor material layer is formed in the second doped region, the spacer region, and the second region. Next, the doped semiconductor material layer is selectively etched to remove a part of the second doped region and a part of the spacer region corresponding to the doped semiconductor material layer. The first doped region and the conductive semiconductor structure are formed from the selectively etched doped semiconductor material layer. The first doped region is located in the second region.

For beneficial effects of the third aspect and various implementations of the third aspect in the present application, refer to the analysis of the beneficial effects of the first aspect and various implementations of the first aspect. Details are not described herein.

BRIEF DESCRIPTION OF THE DRAWINGS

The accompanying drawings described herein are used to provide a further understanding of the present application, and form part of the present application. Exemplary embodiments of the present application and descriptions thereof are used to explain the present application, and do not constitute any inappropriate limitation to the present application. In the accompanying drawings.

Figure 1:
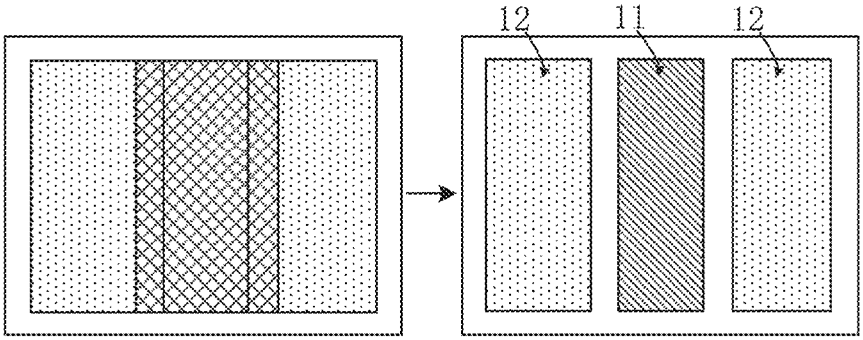
FIG. 1 is a schematic diagram of a range of a selectively etched region and a schematic distribution diagram of a first doped region and a second doped region on a back surface after selective etching in the related art.

Reference numerals: 11: first doped region; 12: second doped region; 13: conductive semiconductor structure; 14: strip-shaped doped region; 15: connection region; 16: physical spacer layer; 17: first conductive semiconductor portion; 18: second conductive semiconductor portion; 19: surface passivation layer; 20: electrode structure; 21: third conductive semiconductor portion.

DETAILED DESCRIPTION

Embodiments of the present disclosure are described below with reference to the accompanying drawings. However, it should be understood that, these descriptions are merely exemplary, and are not intended to limit the scope of the present disclosure. In addition, in the following descriptions, descriptions of well-known structures and technologies are omitted, to avoid unnecessarily confusing the concepts of the present disclosure.

The accompanying drawings show various schematic structural diagrams according to the embodiments of the present disclosure. The accompanying drawings are not drawn to scale, some details are enlarged for the purpose of clarity, and some details may be omitted. Shapes of various regions and layers shown in the drawings, and relative sizes and positional relationships between the various regions and layers are merely exemplary, and may deviate in practice due to manufacturing tolerances or technical limitations, and a person skilled in the art may additionally design regions/layers with different shapes, sizes, and relative positions according to actual requirements.

In the context of the present disclosure, when one layer/element is referred to as being located "on" another layer/element, the layer/element may be directly located on the another layer/element, or an intermediate layer/element may exist between the layer/element and the another layer/element. In addition, if one layer/element is located "above" another layer/element in an orientation, when the orientation is turned, the layer/element may be located "below" the another layer/element. To make the technical problems to be resolved in the present application, the technical solutions, and beneficial effects more comprehensible, the following further describes the present application in detail with reference to the accompanying drawings and embodiments. It should be understood that the specific embodiments described herein are merely used to explain the present application but are not intended to limit the present application.

In addition, terms "first" and "second" are used merely for the purpose of description, and shall not be construed as indicating or implying relative importance or implying a quantity of indicated technical features. Therefore, a feature limited by "first" or "second" may explicitly or implicitly include one or more of the features. In the descriptions of the present application, "a plurality of" means two or more, unless otherwise definitely and specifically limited. Unless otherwise explicitly and specifically limited, "several" means one or more than one.

In the descriptions of the present application, it should be noted that unless otherwise explicitly specified or limited, the terms such as "install", "connect", and "connection" should be understood in a broad sense. For example, the connection may be a fixed connection, a detachable connection, or an integral connection. The connection may be a mechanical connection or an electrical connection. The connection may be a direct connection, an indirect connection through an intermediate medium, internal communication between two components, or an interaction relationship between two components. A person of ordinary skill in the art may understand the specific meanings of the foregoing terms in the present application according to specific situations.

A hot spot effect refers to that due to quality problems such as breaking, hidden splitting, and soldering of a solar cell in a photovoltaic module or blocking such as shadows, bird manures, and dirt on the solar cell, the faulty solar cell is used as a load to consume energy generated by another solar cell in series with the solar cell, thereby generating a local temperature increase. Moreover, within a particular range, a higher reverse breakdown voltage of the solar cell indicates a higher temperature generated after a hot spot problem occurs.

As shown in FIG. 1, in a conventional back contact solar cell, two doped regions that are located together on a back surface and have opposite conduction types are completely isolated by using a spacer region, so as to reduce leakage from the solar cell end and improve the operating efficiency of a single back contact solar cell. However, for the module, if the two doped layers having opposite conduction types are completely separated from each other, the back contact solar cell has a high reverse breakdown voltage, which further causes a high risk of hot spots in an actual operation process of a photovoltaic module including the conventional back contact solar cell.

To resolve the foregoing technical problems, according to a first aspect, an embodiment of the present application provides a back contact solar cell. The back contact solar cell may be an entire back contact solar cell, or may be a 1/N sliced back contact solar cell. The entire back contact solar cell is divided according to a division multiple N, to obtain N 1/N sliced back contact solar cells. The division multiple N of the sliced back contact solar cell may be any positive integer greater than or equal to 2.

Specifically, as shown in FIG. 7 to FIG. 10, the back contact solar cell provided in this embodiment of the present application includes: a semiconductor substrate (not shown in the figures), a first doped region 11, a second doped region 12, and at least one conductive semiconductor structure 13. The first doped region 11 and the second doped region 12 are alternately spaced apart on a back surface of the semiconductor substrate. The first doped region 11 and the second doped region 12 have opposite conduction types. A region located between the first doped region 11 and the second doped region 12 is a spacer region along an arrangement direction of the first doped region 11 and the second doped region 12. The conductive semiconductor structure 13 includes a first conductive semiconductor portion 17 and a second conductive semiconductor portion 18 in electrical contact with each other. The first conductive semiconductor portion is located in the spacer region. Only a part of the first doped region 11 and only a part of the second doped region 12 are at least electrically connected to the conductive semiconductor structure 13, respectively. The second conductive semiconductor portion 18 is disposed above a part, facing away from the semiconductor substrate, of the first doped region and/or the second doped region.

In a case that the foregoing technical solution is adopted, as shown in FIG. 7 to FIG. 10, the first doped region 11 and the second doped region 12 having opposite conduction types are alternately spaced apart on the back surface of the semiconductor substrate, so as to effectively shunt carriers when the back contact solar cell is in an operating state, thereby facilitating formation of a photocurrent. Also, as shown in FIG. 7 to FIG. 10, the back contact solar cell provided in this embodiment of the present application further includes a first conductive semiconductor portion 17 located between the first doped region and the second doped region. Based on this, each conductive semiconductor structure 13 has a conduction property, and a conduction type of the first conductive semiconductor portion 17 is opposite to a conduction type of one of the first doped region 11 and the second doped region 12. Therefore, in a case that the first conductive semiconductor portion 17 is separately electrically connected to a part of the first doped region and a part of the second doped region, the first doped region and the second doped region may be electrically connected in a manner of manufacturing a local leakage point to form a built-in diode having a low reverse breakdown voltage, thereby facilitating enabling the back contact solar cell to have a low reverse breakdown voltage when the back contact solar cell is blocked. In addition, only a part of the first doped region and only a part of the second doped region are electrically connected to the foregoing first conductive semiconductor portion 17, respectively. In other words, a part of the first doped region and a corresponding part of the second doped region are electrically connected to the foregoing first conductive semiconductor portion 17, respectively, and the remaining part of the first doped region and the corresponding part of the second doped region are still physically isolated by using an insulation channel, an insulation material, or the like, so as to prevent low operating efficiency of the back contact solar cell caused by a large leakage current in a normal operating situation of the back contact solar cell due to that the conductive semiconductor structure 13 is disposed between the first doped region and the second doped region, thereby ensuring high photoelectric conversion efficiency of a photovoltaic module including the back contact solar cell provided in this embodiment of the present application in a forward voltage region.

Also, the conductive semiconductor structure includes the first conductive semiconductor portion and the second conductive semiconductor portion, thereby preventing that the etching precision is strictly required to obtain only the conductive semiconductor structure located only between the first doped region and the second doped region, and reducing the etching difficulty. Meanwhile, it can be further ensured that the first doped region may be locally electrically connected by using the conductive semiconductor structure. Also, regardless of whether a disposition manner corresponding to the second conductive semiconductor portion is insulation disposition or electrical disposition, the second conductive semiconductor portion may participate in actual carrier recombination by using the first conductive semiconductor portion. To be specific, the existence of the second conductive semiconductor portion can increase, to some extent, a magnitude of a leakage current of leakage of the first doped region and the second doped region by using a single conductive semiconductor structure, so as to facilitate achieving the same objective of reducing a risk of hot spots when the conductive semiconductor structure has a small size. Another adjustment factor can be provided for adjusting the conductive semiconductor structure while reducing the risk of hot spots and ensuring a high operating efficiency. This is beneficial to improving applicability of the back contact solar cell provided in the present application to different application scenarios.

In addition, in view of the foregoing technical problem (for a component end, two doped layers having opposite conduction types are completely isolated from each other, so that the back contact solar cell has a high reverse breakdown voltage, and consequently, a photovoltaic module including the conventional back contact solar cell has a high risk of hot spots in an actual operation process), a person skilled in the art changes continuous insulation channels located on the spacer region in the original back contact solar cell to non-continuous insulation channels, so that parts, disconnected by the insulation channels, of the two doped layers having opposite conduction types are electrically connected, thereby reducing the reverse breakdown voltage of the back contact solar cell, and reducing a risk of hot spots in an actual operation process of the photovoltaic module including the conventional back contact solar cell. However, in the conventional back contact solar cell, a width of a non-disconnected part in the spacer region is unreasonably set along an extension direction. Consequently, for the solar cell end, a leakage current of the back contact solar cell is large, and further, the operating efficiency of the back contact solar cell is low. In view of this, the present application also provides a solution.

Figure 2:
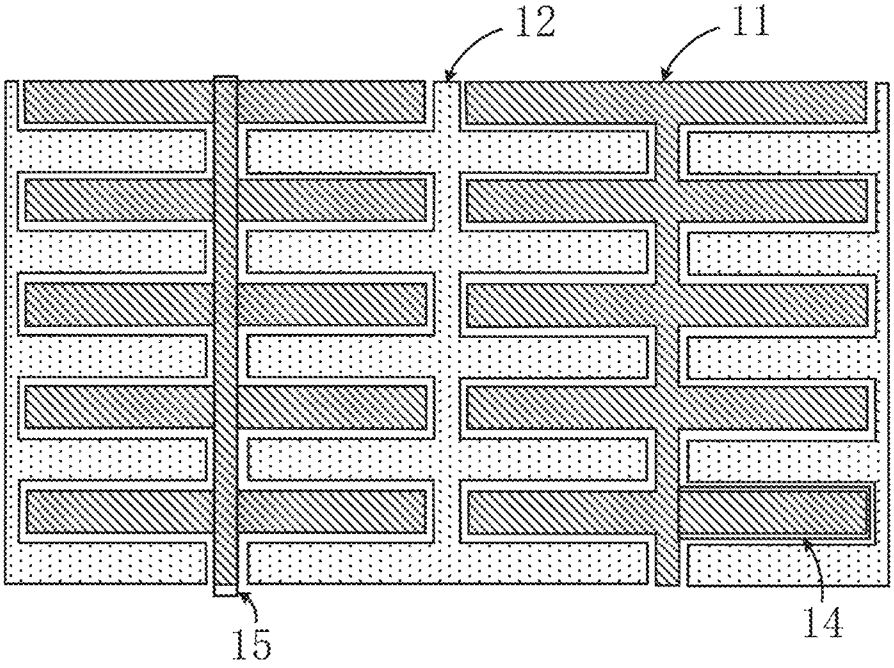
FIG. 2 is a schematic diagram of a distribution relationship between a first doped region and a second doped region on a back surface in a back contact solar cell according to an embodiment of the present application.
Figure 3:
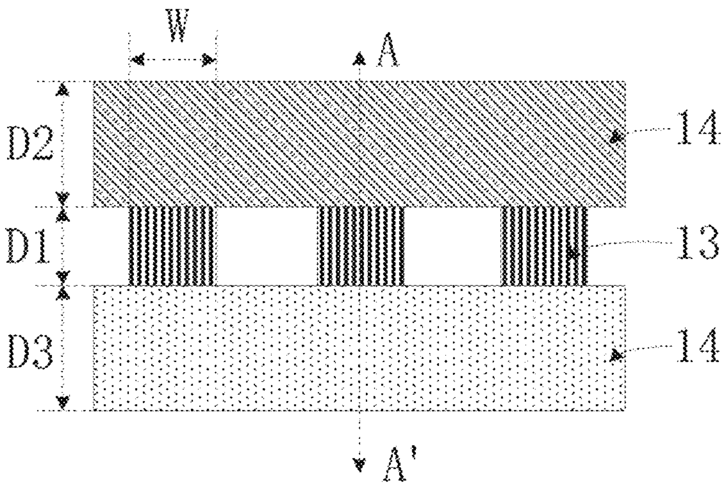
FIG. 3 is a first schematic distribution diagram of a conductive semiconductor structure between two adjacent strip-shaped doped regions having opposite conduction types in a back contact solar cell according to an embodiment of the present application.
Figure 4:
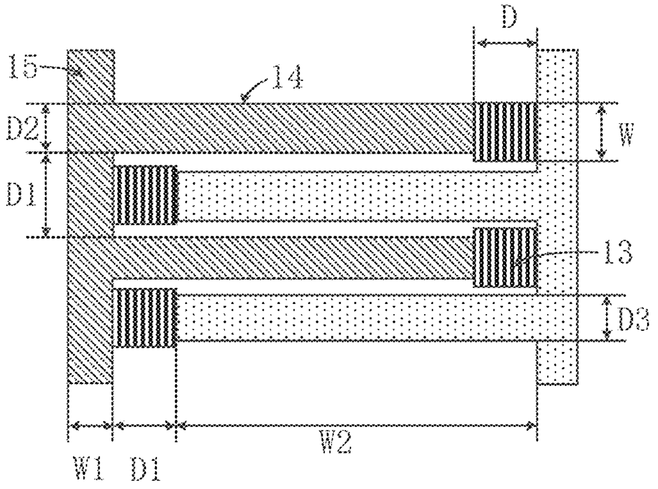
FIG. 4 is a first schematic distribution diagram of a conductive semiconductor structure between a strip-shaped doped region and an adjacent connection region having opposite conduction types in a back contact solar cell according to an embodiment of the present application.

Specifically, as shown in FIG. 2 to FIG. 4, the back contact solar cell provided in this embodiment of the present application includes: a semiconductor substrate (not shown in the figures), a first doped region 11, a second doped region 12, and at least one conductive semiconductor structure 13. Each conductive semiconductor structure 13 is at least partially located between the first doped region 11 and the second doped region 12, and only a part of the first doped region 11 and only a part of the second doped region 12 are in electrical contact with at least one conductive semiconductor structure 13 respectively. The first doped region 11 and the second doped region 12 have opposite conduction types, and a conduction type of the conductive semiconductor structure 13 is opposite to the conduction type of one of the first doped region 11 and the second doped region 12. As shown in FIG. 2, both the first doped region 11 and the second doped region 12 include a plurality of strip-shaped doped regions 14 and at least one connection region 15. The strip-shaped doped regions 14 included in the first doped region 11 and the strip-shaped doped regions 14 included in the second doped region 12 are alternately spaced apart in parallel on the back surface of the semiconductor substrate. Each connection region 15 is electrically connected to the corresponding strip-shaped doped region 14 having a same conduction type as the connection region 15. An extension direction of the connection region 15 is different from an extension direction of the strip-shaped doped regions 14. As shown in FIG. 2 and FIG. 4, at least one conductive semiconductor structure 13 is at least partially located between one strip-shaped doped region 14 included in one of the first doped region 11 and the second doped region 12 and an adjacent connection region 15 included in the other doped region.

It should be noted that the extension direction of the spacer region refers to a direction parallel to the back surface of the semiconductor substrate and perpendicular to the width of the spacer region. The width direction of the conductive semiconductor structure is parallel to a distribution direction of the strip-shaped doped regions having opposite conduction types.

In a case that the foregoing technical solution is adopted, as shown in FIG. 2, the first doped region 11 and the second doped region 12 having opposite conduction types are distributed on the back surface of the semiconductor substrate, so as to effectively shunt carriers when the back contact solar cell is in an operating state, thereby facilitating formation of a photocurrent. Also, as shown in FIG. 3 and FIG. 4, the back contact solar cell provided in this embodiment of the present application further includes at least one conductive semiconductor structure 13 at least partially located between the first doped region and the second doped region. Based on this, each conductive semiconductor structure 13 has a conduction property, and a conduction type of the conductive semiconductor structure 13 is opposite to a conduction type of one of the first doped region 11 and the second doped region 12. Therefore, in a case that the conductive semiconductor structure 13 is separately in electrical contact with a part of the first doped region and a part of the second doped region, the first doped region and the second doped region may be electrically connected in a manner of manufacturing a local leakage point to form a built-in diode having a low reverse breakdown voltage, thereby facilitating enabling the back contact solar cell to have a low reverse breakdown voltage when the back contact solar cell is blocked. In addition, only a part of the first doped region and only a part of the second doped region are respectively in electrical contact with at least one conductive semiconductor structure 13. In other words, a part of the first doped region and a corresponding part of the second doped region are respectively in electrical contact with at least one conductive semiconductor structure 13, and the remaining part of the first doped region and the corresponding part of the second doped region are still physically isolated by using an insulation channel, an insulation material, or the like, so as to prevent low operating efficiency of the back contact solar cell caused by a large leakage current in a normal operating situation of the back contact solar cell due to that the conductive semiconductor structure 13 is disposed between the first doped region and the second doped region, thereby ensuring high photoelectric conversion efficiency of a photovoltaic module including the back contact solar cell provided in this embodiment of the present application in a forward voltage region. As shown in FIG. 2 and FIG. 4, at least one conductive semiconductor structure 13 is at least partially located between one strip-shaped doped region 14 included in one of the first doped region 11 and the second doped region 12 and an adjacent connection region 15 included in the other doped region, so that the reverse breakdown voltage and a forward leakage loss of the back contact solar cell can be regulated in a manner of adjusting a size of the conductive semiconductor structure 13 according to an actual application scenario, thereby improving operating performance of the back contact solar cell provided in this embodiment of the present application.

In an actual application process, the semiconductor substrate may be a substrate made of any semiconductor material, such as a silicon substrate, a silicon germanium substrate, a germanium substrate, or a gallium arsenide substrate.

For the first doped region and the second doped region, in terms of the conduction types, the first doped region may be an N-type doped region. In this case, the second doped region is a P-type doped region. Alternatively, the first doped region may be a P-type doped region. In this case, the second doped region is an N-type doped region. Also, a thickness (or depth) H1 of the first doped region and a thickness (or depth) H2 of the second doped region are not specifically limited in this embodiment of the present application, provided that the first doped region and the second doped region can be applied to the back contact solar cell provided in this embodiment of the present application.

In addition, in terms of a forming position, the foregoing first doped region and second doped region may be both formed in the back surface of the semiconductor substrate. In this case, a surface, facing away from a light receiving surface of the semiconductor substrate, of the first doped region and a surface, facing away from the light receiving surface of the semiconductor substrate, of the second doped region may both be level with the back surface of the semiconductor substrate, or there may be a height difference between the two surfaces. The depths of the first doped region and the second doped region refer to doping depths corresponding to the first doped region and the second doped region. Also, materials of the first doped region and the second doped region are the same as a material of the semiconductor substrate.

Alternatively, the first doped region and/or the second doped region may both include a doped semiconductor layer formed on the back surface of the semiconductor substrate. In this case, a material of the doped semiconductor layer may include any semiconductor material such as silicon, silicon germanium, germanium, or gallium arsenide. In terms of arrangement of substances, a crystalline phase of the doped semiconductor layer may be an amorphous semiconductor layer, a microcrystalline semiconductor layer, a nanocrystalline semiconductor layer, a monocrystalline semiconductor layer, or a polycrystalline semiconductor layer. Specifically, the materials of the doped semiconductor layer included in the first doped region and the doped semiconductor layer included in the second doped region may be the same, or may be different.

When the first doped region includes a doped semiconductor layer located on the back surface of the semiconductor substrate, the doped semiconductor layer included in the first doped region may be directly formed on a partial region of the back surface of the semiconductor substrate. Alternatively, the back contact solar cell provided in this embodiment of the present application further includes a passivation layer located between the doped semiconductor layer included in the first doped region and the semiconductor substrate. A material of the passivation layer may be determined according to the material of the doped semiconductor layer included in the first doped region and an actual application scenario, which is not specifically limited herein. For example, when the doped semiconductor layer included in the first doped region is a doped polycrystalline silicon layer, the passivation layer is a tunneling passivation layer. For another example, when the doped semiconductor layer included in the first doped region includes a doped amorphous silicon layer and/or a doped microcrystalline silicon layer, the passivation layer is an intrinsic amorphous silicon layer.

Also, when the doped semiconductor layer included in the first doped region is located on the back surface of the semiconductor substrate, the first doped region may further include a sub-doped region formed in a corresponding region of the semiconductor substrate by means of diffusion. When a passivation layer is further provided between the doped semiconductor layer included in the first doped region and the semiconductor substrate, the first doped region may further include a sub-doped region formed in a corresponding region of the passivation layer by means of diffusion.

When the doped semiconductor layer included in the second doped region is located on the back surface of the semiconductor substrate, the doped semiconductor layer included in the second doped region may be directly formed on a partial region of the back surface of the semiconductor substrate. Alternatively, the back contact solar cell provided in this embodiment of the present application further includes a passivation layer located between the doped semiconductor layer included in the second doped region and the semiconductor substrate. A material of the passivation layer may be determined according to the material of the doped semiconductor layer included in the second doped region and an actual application scenario, which is not specifically limited herein. For example, when the doped semiconductor layer included in the second doped region is a doped amorphous silicon layer and/or a doped microcrystalline silicon layer, the passivation layer may be an intrinsic amorphous silicon layer. For another example, when the doped semiconductor layer included in the second doped region is a doped polycrystalline silicon layer, the passivation layer is a tunneling passivation layer.

Also, when the second doped region includes a doped semiconductor layer located on the back surface of the semiconductor substrate, the second doped region may further include a sub-doped region formed in a corresponding region of the semiconductor substrate by means of diffusion. When a passivation layer is further provided between the doped semiconductor layer included in the second doped region and the semiconductor substrate, the second doped region may further include a sub-doped region formed in a corresponding region of the passivation layer by means of diffusion.

Specifically, when there are passivation layers between the doped semiconductor layer included in the first doped region and the semiconductor substrate, and between the doped semiconductor layer included in the second doped region and the semiconductor substrate, materials and/or thicknesses of the two passivation layers may be the same or may be different.

Exemplarily, in the back contact solar cell provided in this embodiment of the present application, the semiconductor substrate is a P-type semiconductor substrate, and the first doped region and the second doped region both include a doped semiconductor layer formed on the back surface of the semiconductor substrate. Both the doped semiconductor layer included in the first doped region and the doped semiconductor layer included in the second doped region are doped polycrystalline silicon layers, and tunneling passivation layers are respectively formed between the doped semiconductor layer included in the first doped region and the doped semiconductor layer included in the second doped region and the semiconductor substrate.

In terms of a shape, the shapes of the first doped region and the second doped region are not specifically limited in this embodiment of the present application, provided that it can be ensured that the first doped region and the second doped region are alternately spaced apart on the back surface.

Exemplarily, the first doped region and the second doped region may be alternately spaced apart in a strip shape. In this case, the strip-shaped doped regions included in the first doped region and the strip-shaped doped regions included in the second doped region are spaced apart in parallel. The conductive semiconductor structure may be at least partially located between two adjacent strip-shaped doped regions having opposite conduction types.

Alternatively, as shown in FIG. 2, the first doped region 11 and the second doped region 12 may be interdigitated alternately. In this case, both the first doped region 11 and the second doped region 12 include a plurality of strip-shaped doped regions 14 and at least one connection region 15. The strip-shaped doped regions 14 included in the first doped region 11 and the strip-shaped doped regions 14 included in the second doped region 12 are alternately spaced apart in parallel. Each connection region 15 is electrically connected to the corresponding strip-shaped doped region 14 having a same conduction type as the connection region 15. An extension direction of the connection region 15 is different from an extension direction of the strip-shaped doped regions 14.

For the conductive semiconductor structure, the shape of the conductive semiconductor structure is not specifically limited in this embodiment of the present application. For example, an orthographic projection of each conductive semiconductor structure on the back surface may have a shape such as a rectangle, a trapezoid, a hexagon, or a string. Also, in this embodiment of the present application, the conduction type and impurity doping concentration of the conductive semiconductor structure are also not specifically limited, provided that the first doped region and the second doped region can be electrically connected to each other.

In terms of actual manufacturing, the conductive semiconductor structure may be separately formed on the back surface of the semiconductor substrate with respect to the first doped region and the second doped region. To be specific, the conductive semiconductor structure is separately non-integrally continuous with the first doped region and the second doped region. In this case, the material of the conductive semiconductor structure may be the same as or different from the material of the first doped region or the second doped region. The doping concentration of impurities in the conductive semiconductor structure may be greater than, equal to, or less than the doping concentration of impurities in either of the first doped region and the second doped region. In addition, in this case, when the conductive semiconductor structure is formed on the semiconductor substrate, at least a part of the conductive semiconductor structure may be directly located on the semiconductor substrate, or a passivation layer may be formed between the conductive semiconductor structure and the semiconductor substrate. A material of the passivation layer may be determined according to the material of the conductive semiconductor structure. For example, when the conductive semiconductor structure is a doped amorphous silicon layer and/or a doped microcrystalline silicon layer, the passivation layer may be an intrinsic amorphous silicon layer. For another example, when the conductive semiconductor structure is a doped polycrystalline silicon layer, the passivation layer is a tunneling passivation layer. Specifically, when there are passivation layers between the first doped region and/or the second doped region and the semiconductor substrate, and between the conductive semiconductor structure and the semiconductor substrate, materials and/or thicknesses of at least two passivation layers may be the same or may be different.

Figure 5:
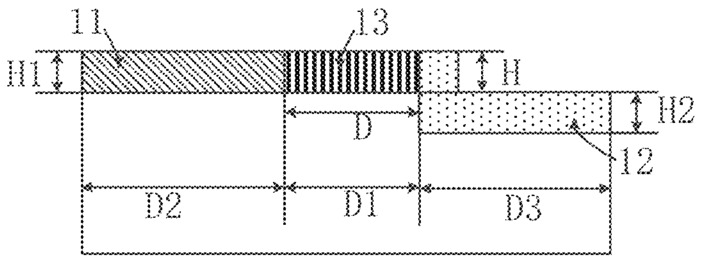
FIG. 5 is a first schematic longitudinal cross-sectional view of a partial structure of a back contact solar cell according to an embodiment of the present application.
Figure 6:
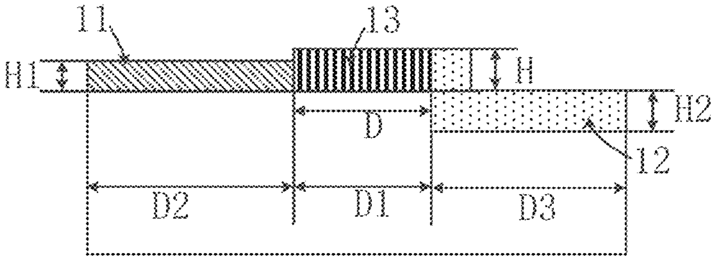
FIG. 6 is a second schematic longitudinal cross-sectional view of a partial structure of a back contact solar cell according to an embodiment of the present application.

Alternatively, as shown in FIG. 5, the conductive semiconductor structure 13 has a same conduction type as the first doped region 11, and is integrally continuous with the first doped region 11. In this case, the material and the impurity doping concentration of the conductive semiconductor structure 13 are respectively the same as the material and the impurity doping concentration of the first doped region 11 (FIG. 5 is a schematic longitudinal cross-sectional view along a direction A-A' in FIG. 3). Alternatively, as shown in FIG. 6, the conductive semiconductor structure 13 has a same conduction type as the second doped region 12, and is integrally continuous with the second doped region 12. In this case, the material and the impurity doping concentration of the conductive semiconductor structure 13 are respectively the same as the material and the impurity doping concentration of the second doped region 12.

When the conductive semiconductor structure includes a doped semiconductor layer located on the back surface of the semiconductor substrate, a region corresponding to the conductive semiconductor structure may include a region in which the doped semiconductor layer of the conductive semiconductor structure is located, and may further include a sub-doped region formed in a corresponding region of the semiconductor substrate by means of diffusion. When a passivation layer is further provided between the doped semiconductor layer included in the conductive semiconductor structure and the semiconductor substrate, the region corresponding to the conductive semiconductor structure may further include a sub-doped region formed in a corresponding region of the passivation layer by means of diffusion.

It should be noted that in an actual manufacturing process, a same process may be adopted to manufacture the first doped region or the second doped region while manufacturing the conductive semiconductor structure. For example, when the first doped region or the second doped region is integrally continuous with the conductive semiconductor structure, the first doped region or the second doped region located only in a local region of the back surface may be separately obtained in a manner of selectively etching the entire doped semiconductor material layer formed on the back surface. Based on this, in a case that the conductive semiconductor structure is integrally continuous with the first doped region (or the second doped region), the conductive semiconductor structure and the first doped region (or the second doped region) are formed based on a same doped semiconductor material layer. In this way, while manufacturing costs of the back contact solar cell are reduced, the conductive semiconductor structure does not need to be formed separately by using a depositing process and an etching process, thereby simplifying a manufacturing procedure of the back contact solar cell, and improving the manufacturing efficiency of the back contact solar cell. However, when the conductive semiconductor structure is non-integrally continuous with both the first doped region and the second doped region, a conductive semiconductor structure satisfying corresponding material and doping concentration requirements may be formed according to requirements of actual application scenarios. It is avoided that the material and doping concentration of the conductive semiconductor structure can only be the same as those of the first doped region or the second doped region that is integrally continuous with the conductive semiconductor structure as the conductive semiconductor structure is integrally continuous with the first doped region or the second doped region, thereby improving applicability of the back contact solar cell provided in this embodiment of the present application to different application scenarios.

In terms of setting a relative height, the back surface of the semiconductor substrate may be a plane. In this case, surfaces, respectively corresponding to the back surface, of the first doped region, the second doped region, and the conductive semiconductor structure are level.

Alternatively, a height difference greater than 0 exists between the surfaces, respectively corresponding to the back surface of the semiconductor substrate, of the first doped region and the second doped region. In this case, a smaller-height surface of the surface, corresponding to the back surface of the semiconductor substrate, of the first doped region and the surface, corresponding to the back surface of the semiconductor substrate, of the second doped region is at the same height as the surface, corresponding to the back surface of the semiconductor substrate, of the conductive semiconductor structure. Alternatively, a larger-height surface of the surface, corresponding to the back surface of the semiconductor substrate, of the first doped region and the surface, corresponding to the back surface of the semiconductor substrate, of the second doped region is at the same height as the surface, corresponding to the back surface of the semiconductor substrate, of the conductive semiconductor structure. Alternatively, the height of the surface, corresponding to the back surface of the semiconductor substrate, of the conductive semiconductor structure is between the height of the surface, corresponding to the back surface of the semiconductor substrate, of the first doped region and the height of the surface, corresponding to the back surface of the semiconductor substrate, of the second doped region.

In addition, a specific forming position of the part of each conductive semiconductor structure between the first doped region and the second doped region may be determined according to the shapes of the first doped region and the second doped region and an actual application scenario, provided that the first doped region and the second doped region can be electrically connected by using the conductive semiconductor structure.

Exemplarily, when the first doped region and the second doped region are alternately spaced apart in a strip shape, at least one conductive semiconductor structure is at least partially located between two adjacent strip-shaped doped regions having opposite conduction types.

Exemplarily, in a case that the first doped region and the second doped region are interdigitated alternately, as shown in FIG. 2 and FIG. 3, at least one conductive semiconductor structure 13 may be at least partially located between two adjacent strip-shaped doped regions 14 respectively belonging to the first doped region 11 and the second doped region 12. In this case, a width direction of the conductive semiconductor structure 13 is parallel to an extension direction of the strip-shaped doped regions 14. Additionally or alternatively, as shown in FIG. 2 and FIG. 4, at least one conductive semiconductor structure 13 may alternatively be at least partially located between one strip-shaped doped region 14 included in one of the first doped region 11 and the second doped region 12 and an adjacent connection region 15 included in the other doped region. In this case, the width direction of the conductive semiconductor structure 13 is parallel to a distribution direction of the strip-shaped doped regions 14 having the opposite conduction types. In this case, there are at least three alternatives for a disposition position of each conductive semiconductor structure 13 on the back surface, thereby facilitating selecting an appropriate solution according to requirements in different application scenarios, and improving applicability of the back contact solar cell provided in this embodiment of the present application to different application scenarios.

Figure 7:
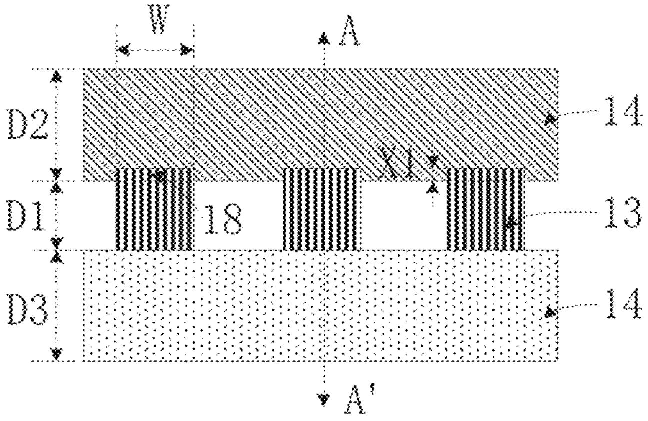
FIG. 7 is a second schematic distribution diagram of a conductive semiconductor structure between two adjacent strip-shaped doped regions having opposite conduction types in a back contact solar cell according to an embodiment of the present application.
Figure 8:
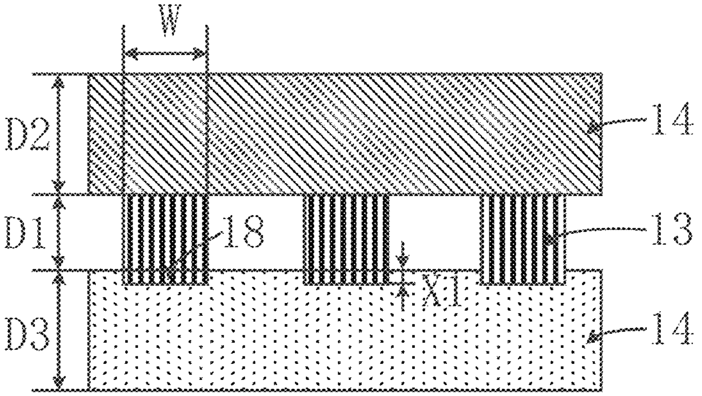
FIG. 8 is a third schematic distribution diagram of a conductive semiconductor structure between two adjacent strip-shaped doped regions having opposite conduction types in a back contact solar cell according to an embodiment of the present application.
Figure 9:
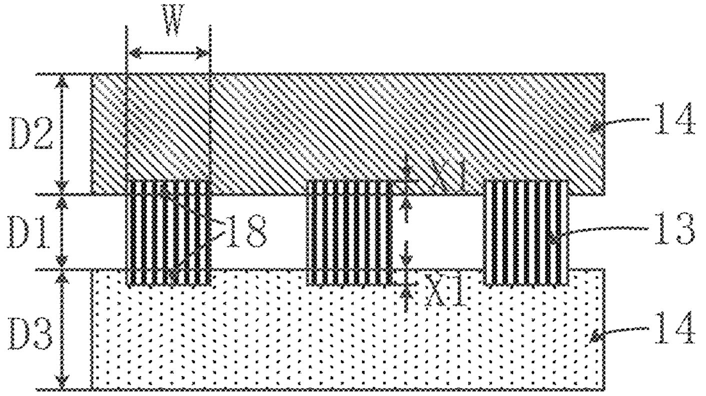
FIG. 9 is a fourth schematic distribution diagram of a conductive semiconductor structure between two adjacent strip-shaped doped regions having opposite conduction types in a back contact solar cell according to an embodiment of the present application.

Specifically, as shown in FIG. 7 to FIG. 9, the conductive semiconductor structure 13 may include a first conductive semiconductor portion 17 and a second conductive semiconductor portion 18 in electrical contact with each other.

Alternatively, as shown in FIG. 3 to FIG. 6, the conductive semiconductor structure 13 may be located only between the first doped region 11 and the second doped region 12.

When the conductive semiconductor structure includes a first conductive semiconductor portion and a second conductive semiconductor portion, in terms of disposition objects, as shown in FIG. 7, the second conductive semiconductor portion 18 may be disposed only on the first doped region. As shown in FIG. 8, alternatively, the second conductive semiconductor portion 18 may be disposed only on the second doped region. As shown in FIG. 9, alternatively, the second conductive semiconductor portion 18 may be disposed on both the first doped region and the second doped region. In this case, there are a plurality of alternatives for a forming range of the conductive semiconductor structure 13. It can be prevented that the etching precision is strictly required to obtain only the conductive semiconductor structure 13 located only between the first doped region and the second doped region, thereby reducing the etching difficulty. Meanwhile, it can be further ensured that the first doped region may be locally electrically connected by using the conductive semiconductor structure 13.

In terms of a disposition direction, in a case that the first doped region and the second doped region are alternately spaced apart in a strip shape, the second conductive semiconductor portion may be disposed above a part, facing away from the semiconductor substrate, of the corresponding strip-shaped doped region along the width direction of the strip-shaped doped region. In this case, it is defined that in the second conductive semiconductor portion, a disposition width of a part disposed on the strip-shaped doped region along the width direction of the strip-shaped doped region is X1.

Figure 10:
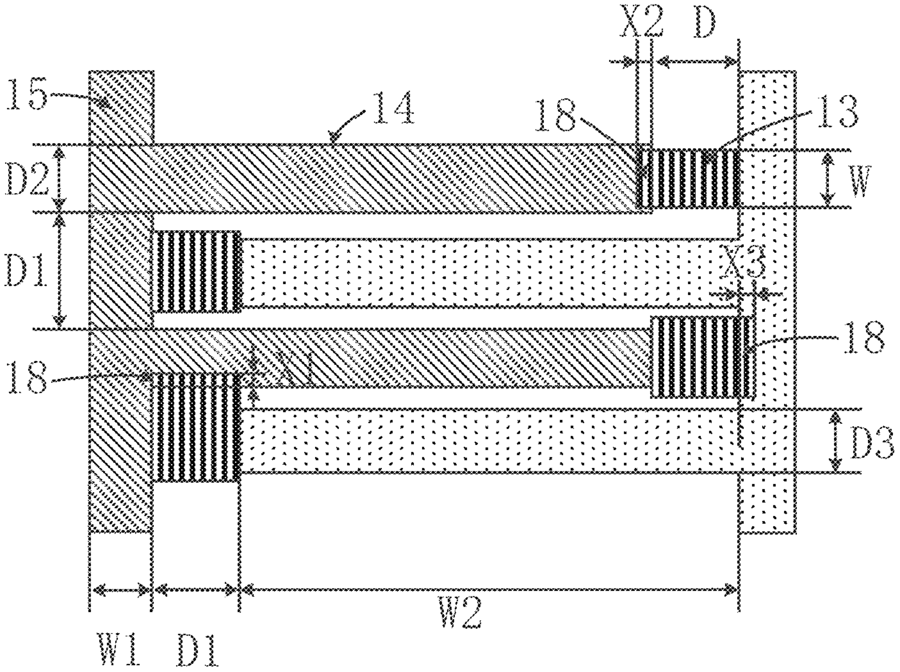
FIG. 10 is a second schematic distribution diagram of a conductive semiconductor structure between a strip-shaped doped region and an adjacent connection region having opposite conduction types in a back contact solar cell according to an embodiment of the present application.

Alternatively, as shown in FIG. 2, in a case that the first doped region 11 and the second doped region 12 are interdigitated alternately, as shown in FIG. 7 to FIG. 9, the second conductive semiconductor portion 18 may be disposed on the strip-shaped doped region 14 included in the first doped region and/or the strip-shaped doped region 14 included in the second doped region along the width direction of the strip-shaped doped region 14. In this case, it is defined that in the second conductive semiconductor portion 18, a disposition width of a part disposed on the strip-shaped doped region 14 along the width direction of the strip-shaped doped region 14 is X1. Alternatively, as shown in FIG. 10, the second conductive semiconductor portion 18 may be disposed on the strip-shaped doped region 14 included in the first doped region and/or the strip-shaped doped region 14 included in the second doped region along the extension direction of the strip-shaped doped region 14. In this case, it is defined that in the second conductive semiconductor portion 18, a disposition width of a part disposed on the strip-shaped doped region 14 along the extension direction of the strip-shaped doped region 14 is X2. Alternatively, as shown in FIG. 10, the second conductive semiconductor portion 18 may be disposed on the connection region 15 included in the first doped region and/or the connection region 15 included in the second doped region along the extension direction of the strip-shaped doped region 14. In this case, it is defined that in the second conductive semiconductor portion, a disposition width of a part disposed on the corresponding connection region 15 along the extension direction of the strip-shaped doped region 14 is X3.

Figure 11:
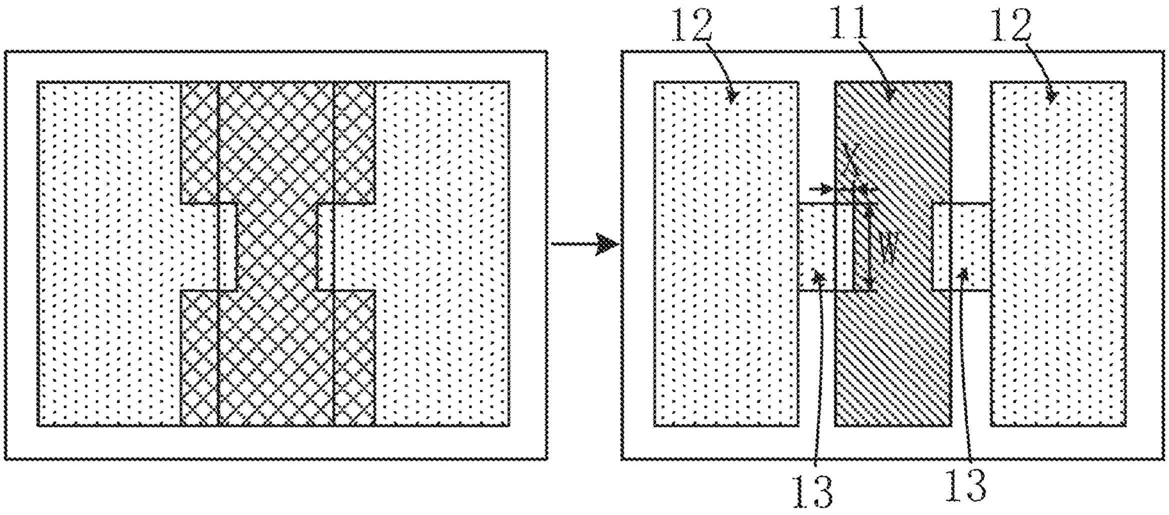
FIG. 11 is a schematic diagram of a range of a selectively etched region and a schematic distribution diagram of a first doped region, a second doped region, and a conductive semiconductor structure on a back surface after selective etching according to an embodiment of the present application.

In terms of disposition distribution, when the conductive semiconductor structure includes a first conductive semiconductor portion and a second conductive semiconductor portion, as shown in FIG. 7 to FIG. 9, the second conductive semiconductor portion 18 may be disposed above one side of the first doped region and/or the second doped region along the width direction. Alternatively, as shown in FIG. 11, the second conductive semiconductor portion 18 may be disposed above both sides of the first doped region 11 and/or the second doped region 12 along the width direction.

Figure 12:
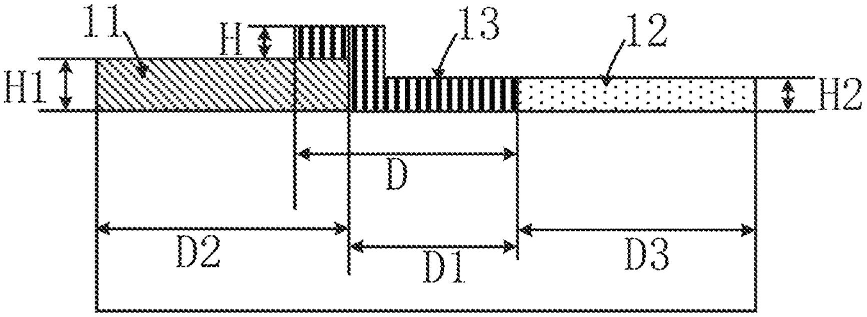
FIG. 12 is a third schematic longitudinal cross-sectional view of a partial structure of a back contact solar cell according to an embodiment of the present application.
Figure 13:
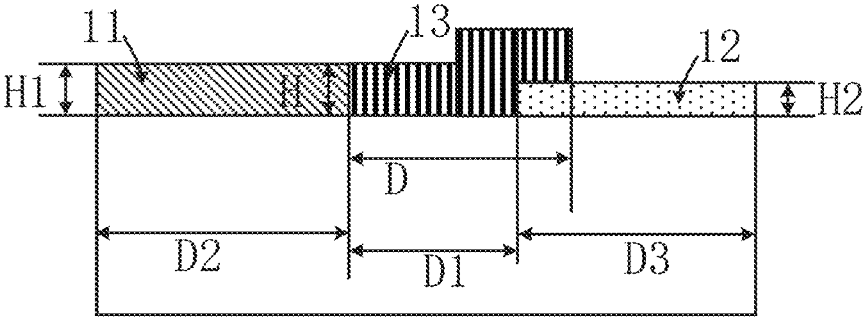
FIG. 13 is a fourth schematic longitudinal cross-sectional view of a partial structure of a back contact solar cell according to an embodiment of the present application.

In terms of a disposition manner, as shown in FIG. 12 to FIG. 13, the second conductive semiconductor portion 18 may be in direct contact with the first doped region 11 and/or the second doped region 12. In this case, not only a side wall of the conductive semiconductor structure 13 is separately in electrical contact with the first doped region 11 and the second doped region 12, but also the part of the conductive semiconductor structure 13 disposed on the first doped region 11 and/or the second doped region 12 is in electrical contact with the first doped region 11 and/or the second doped region 12.

Figure 14:
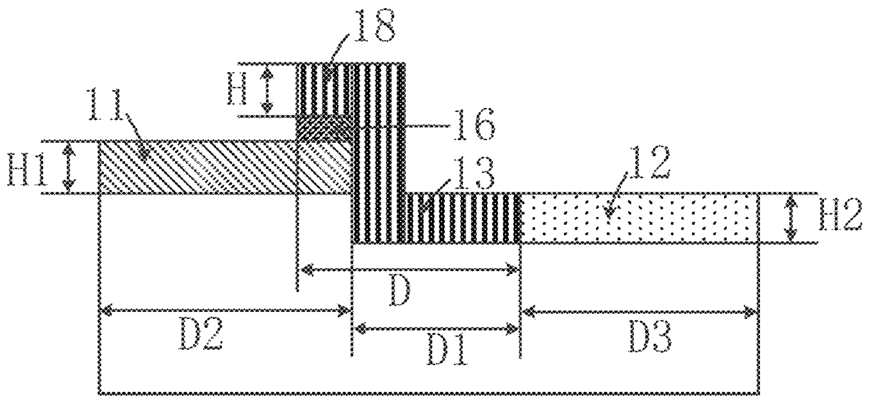
FIG. 14 is a fifth schematic longitudinal cross-sectional view of a partial structure of a back contact solar cell according to an embodiment of the present application.

Alternatively, in an actual manufacturing process, as shown in FIG. 14, corresponding physical spacer layers 16 are respectively formed on the first doped region 11 and the second doped region 12. The physical spacer layer 16 may be formed when the first doped region 11 and the second doped region 12 are manufactured by using a diffusion process, or may be formed so that the formed first doped region 11 and second doped region 12 are not affected by a subsequent process (for example, to prevent the formed first doped region 11 from being inversed when the second doped region 12 is manufactured on the back surface after the first doped region 11 is formed, and the physical spacer layer 16 is formed on a surface of the first doped region 11). Based on this, the physical spacer layer 16 may be a conductive layer. In this case, a corresponding part of the conductive semiconductor structure 13 is electrically disposed with the first doped region 11 and/or the second doped region 12. For a case of corresponding electrical contact with the conductive semiconductor structure 13, refer to a case of corresponding electrical contact when the foregoing direct contact is made. Alternatively, the physical spacer layer 16 may be a non-conductive insulation layer. In this case, regardless of whether the conductive semiconductor structure 13 is disposed on at least one of the first doped region 11 and the second doped region 12, the conductive semiconductor structure 13 is separately in electrical contact with only the side surfaces of the first doped region 11 and the second doped region 12. To be specific, refer to the foregoing case of electrical contact when the conductive semiconductor structure 13 is located only between the first doped region 11 and the second doped region 12.

In terms of a disposition structure, a contact surface between one of the first doped region and the second doped region that has a conduction type opposite to that of the conductive semiconductor structure, and the conductive semiconductor structure includes a side effective electrical contact surface. The side effective electrical contact surface may be parallel to a thickness direction of the semiconductor substrate, or may have an angle with the thickness direction of the semiconductor substrate. A size of the angle is not specifically limited in this embodiment of the present application.

Figure 67:
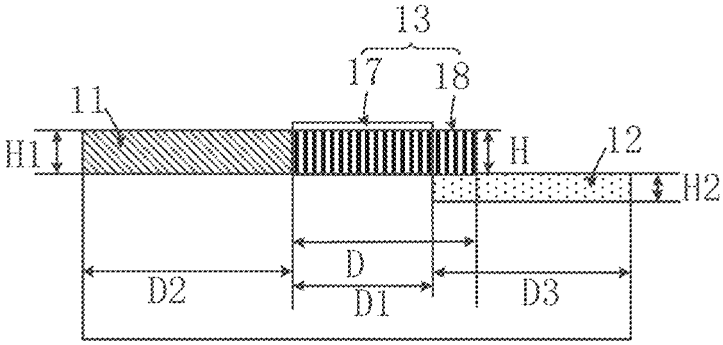
FIG. 67 is a forty-fifth schematic longitudinal cross-sectional view of a partial structure of a back contact solar cell according to an embodiment of the present application.

A specific structure of the conductive semiconductor structure may be determined according to forming positions of the first doped region and the second doped region on the back surface of the semiconductor substrate. Specifically, the following four cases are included:

In the first case, as shown in FIG. 67, when one of the first doped region 11 and the second doped region 12 includes a doped semiconductor layer located on the back surface of the semiconductor substrate and the other doped region is located in the semiconductor substrate, the conductive semiconductor structure 13 may include a first conductive semiconductor portion 17 and a second conductive semiconductor portion 18. The second conductive semiconductor portion 18 is disposed above a part, facing away from the semiconductor substrate, of one of the first doped region 11 and the second doped region 12 in the semiconductor substrate.

Figure 68:
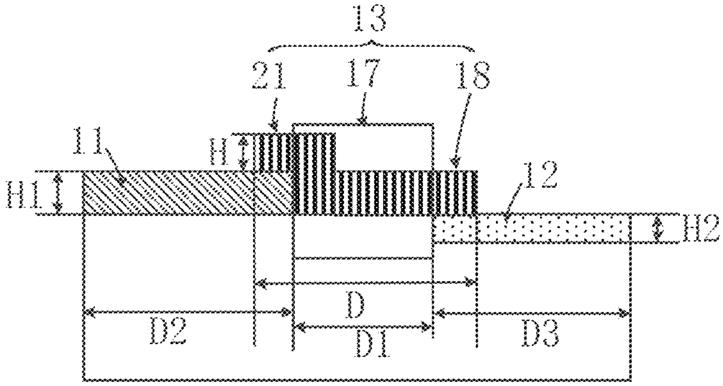
FIG. 68 is a forty-sixth schematic longitudinal cross-sectional view of a partial structure of a back contact solar cell according to an embodiment of the present application.

In the second case, as shown in FIG. 68, when one of the first doped region 11 and the second doped region 12 includes a doped semiconductor layer located on the back surface of the semiconductor substrate and the other doped region is located in the semiconductor substrate, the conductive semiconductor structure 13 further includes a third conductive semiconductor portion 21 in electrical contact with the first conductive semiconductor portion 17. The third conductive semiconductor portion 21 is disposed above a part, facing away from the semiconductor substrate, of the doped semiconductor layer.

Figure 63:
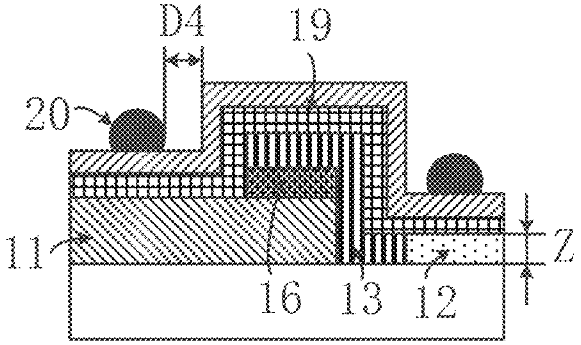
FIG. 63 is a forty-first schematic longitudinal cross-sectional view of a partial structure of a back contact solar cell according to an embodiment of the present application.

In the third case, as shown in FIG. 63, when both the first doped region 11 and the second doped region 12 include a doped semiconductor layer located on the back surface of the semiconductor substrate, the conductive semiconductor structure includes the foregoing first conductive semiconductor portion and second conductive semiconductor portion.

Figure 65:
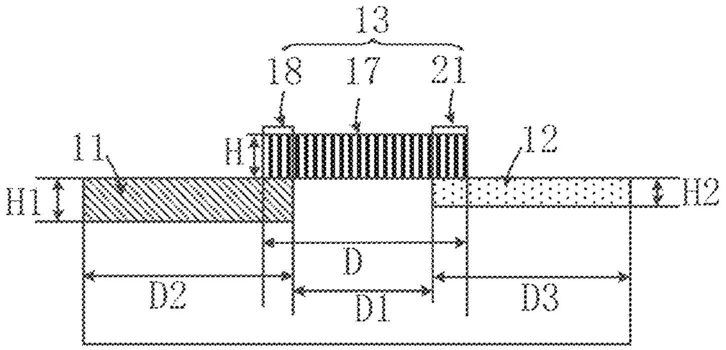
FIG. 65 is a forty-third schematic longitudinal cross-sectional view of a partial structure of a back contact solar cell according to an embodiment of the present application.

In the fourth case, as shown in FIG. 65, when both the first doped region 11 and the second doped region 12 are formed in the semiconductor substrate, the conductive semiconductor structure 13 further includes a third conductive semiconductor portion 13 in electrical contact with the first conductive semiconductor portion 17. The second conductive semiconductor portion 18 is disposed above a part, facing away from the semiconductor substrate, of one of the first doped region 11 and the second doped region 12. The third conductive semiconductor portion 21 is disposed above a part, facing away from the semiconductor substrate, of the other of the first doped region 11 and the second doped region 12.

In terms of a surface height difference, along the thickness direction of the semiconductor substrate, a ratio of the height from an upper surface of the second conductive semiconductor portion to an upper surface of the first doped region or the second doped region disposed right below the second conductive semiconductor portion to the thickness of the first doped region or the second doped region disposed right below the second conductive semiconductor portion may be greater than or equal to 0.5 and less than or equal to 1.5. In this case, a low field passivation capability corresponding to the first doped region or the second doped region caused by a small thickness of the first doped region or the second doped region due to a large ratio can be prevented. In addition, a high parasitic absorption corresponding to the first doped region or the second doped region caused by a large thickness of the first doped region or the second doped region due to a small ratio can be prevented, thereby ensuring a high operating efficiency of the back contact solar cell.

Exemplarily, along the thickness direction of the semiconductor substrate, the height from the upper surface of the second conductive semiconductor portion to the upper surface of the first doped region or the second doped region disposed right below the second conductive semiconductor portion may be greater than or equal to 50 μm and less than or equal to 2 μm. For example, along the thickness direction of the semiconductor substrate, the height from the upper surface of the second conductive semiconductor portion to the upper surface of the first doped region or the second doped region disposed right below the second conductive semiconductor portion may be 50 nm, 100 nm, 300 nm, 600 nm, 900 nm, 1.2 μm, 1.5 μm, or 2 μm.

Figure 36:
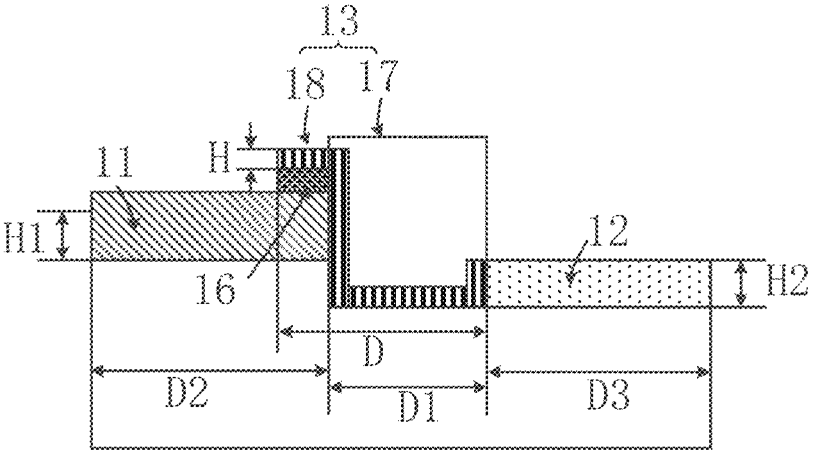
FIG. 36 is a twenty-seventh schematic longitudinal cross-sectional view of a partial structure of a back contact solar cell according to an embodiment of the present application.
Figure 37:
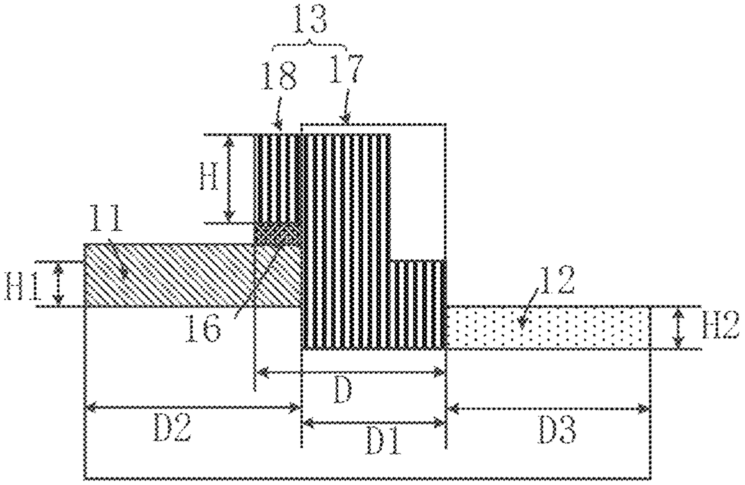
FIG. 37 is a twenty-eighth schematic longitudinal cross-sectional view of a partial structure of a back contact solar cell according to an embodiment of the present application.
Figure 38:
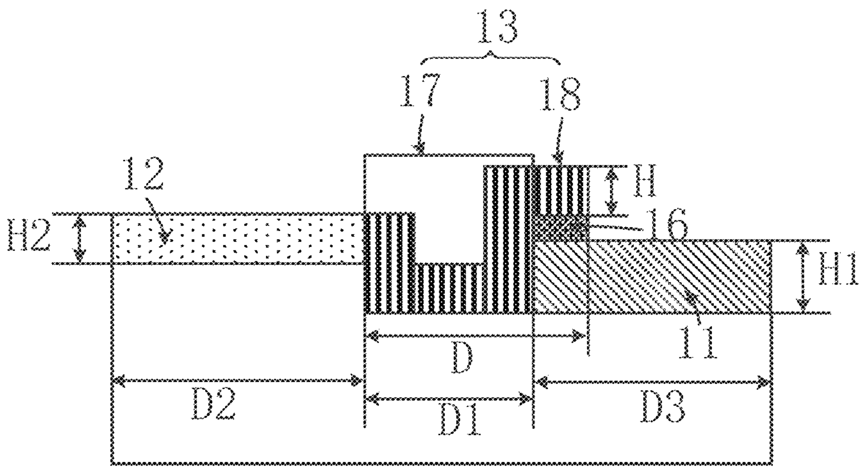
FIG. 38 is a twenty-ninth schematic longitudinal cross-sectional view of a partial structure of a back contact solar cell according to an embodiment of the present application.
Figure 39:
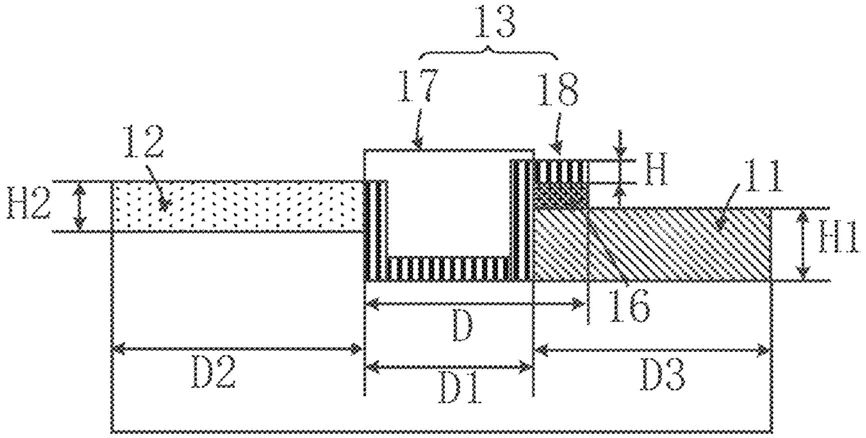
FIG. 39 is a thirtieth schematic longitudinal cross-sectional view of a partial structure of a back contact solar cell according to an embodiment of the present application.
Figure 40:
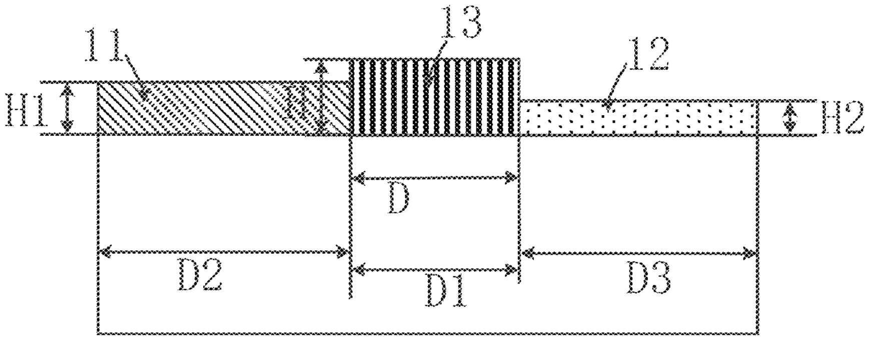
FIG. 40 is a thirty-first schematic longitudinal cross-sectional view of a partial structure of a back contact solar cell according to an embodiment of the present application.
Figure 41:
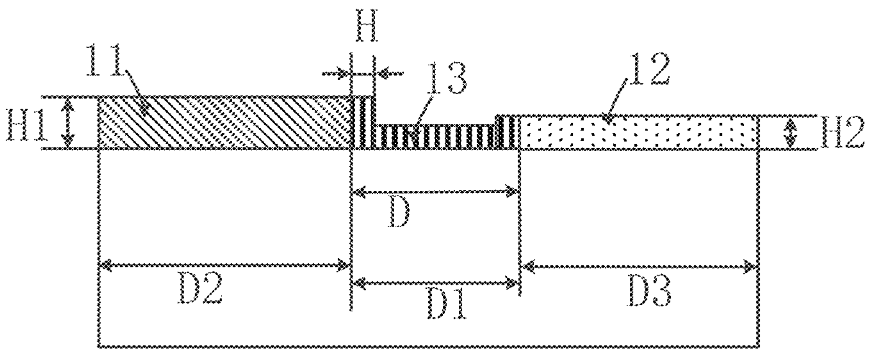
FIG. 41 is a thirty-second schematic longitudinal cross-sectional view of a partial structure of a back contact solar cell according to an embodiment of the present application.
Figure 42:
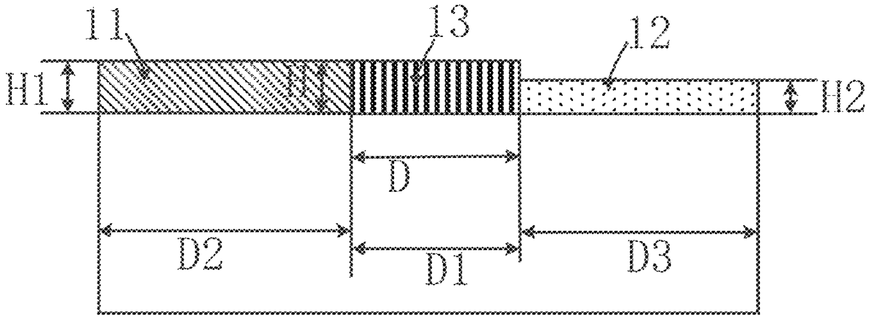
FIG. 42 is a thirty-third schematic longitudinal cross-sectional view of a partial structure of a back contact solar cell according to an embodiment of the present application.

In addition, when the first doped region, the second doped region, and the conductive semiconductor structure all include a doped semiconductor layer, as shown in FIG. 18, FIG. 19, FIG. 24, and FIG. 34, a disposition height of a region surface, corresponding to the back surface, of the conductive semiconductor structure 13 may be greater than or equal to a disposition height of a region surface, corresponding to the back surface, of the first doped region 11 (or the second doped region 12) that has a conduction type opposite to that of the conductive semiconductor structure 13. Alternatively, as shown in FIG. 20, FIG. 25, and FIG. 36, the disposition height of the region surface, corresponding to the back surface, of the conductive semiconductor structure 13 may be less than the disposition height of the region surface, corresponding to the back surface, of the first doped region 11 (or the second doped region 12) that has a conduction type opposite to that of the conductive semiconductor structure 13. In this case, in an actual manufacturing process, when the conductive semiconductor structure 13 is formed, due to difficulty in filling a material for manufacturing the doped semiconductor layer included in the conductive semiconductor structure 13 at a corner caused by a height difference, the doped semiconductor layer included in the conductive semiconductor structure 13 cannot be in complete contact with each part of a corresponding structure surface at the corner. Therefore, compared with that the disposition height of the region surface, corresponding to the back surface, of the conductive semiconductor structure 13 may be less than the disposition height of the region surface, corresponding to the back surface, of the first doped region 11 (or the second doped region 12) that has a conduction type opposite to that of the conductive semiconductor structure 13, when the disposition height of the region surface, corresponding to the back surface, of the conductive semiconductor structure 13 may be greater than or equal to the disposition height of the region surface, corresponding to the back surface, of the first doped region 11 (or the second doped region 12) that has a conduction type opposite to that of the conductive semiconductor structure 13, the part, filled at the corner, of the doped semiconductor layer included in the conductive semiconductor structure 13 may be staggered from the side wall of the doped semiconductor layer included in the first doped region 11 (or the doped semiconductor layer included in the second doped region 12) that has a conduction type opposite to that of the conductive semiconductor structure, to ensure a large side effective electrical contact area between the semiconductor structure 13 and the first doped region 11 (or the second doped region 12) that has a conduction type opposite to that of the conductive semiconductor structure.

Specifically, when a height of disposing the doped semiconductor layer included in the conductive semiconductor structure on the back surface is less than a height of disposing, on the back surface, the doped semiconductor layer included in the first doped region (or the doped semiconductor layer included in the second doped region) that has a conduction type opposite to that of the conductive semiconductor structure, a size of the height difference may be determined according to a manufacturing process and the like of the conductive semiconductor structure in an actual application scenario. Exemplarily, a difference between the height of the region surface, corresponding to the back surface, of the doped semiconductor layer included in the conductive semiconductor structure and the height of the region surface, corresponding to the back surface, of the doped semiconductor layer included in one of the first doped region and the second doped region that has a conduction type opposite to that of the conductive semiconductor structure may be greater than or equal to −2 μm and less than or equal to −0.4 μm. For example, the height difference may be −2 μm, −1.8 μm, −1.5 μm, −1.2 μm, −1 μm, −0.8 μm, or −0.4 μm.

The types of the physical spacer layers formed on the first doped region and the second doped region may be determined according to the conductivity of the physical spacer layers and an actual application scenario. Exemplarily, the physical spacer layer may include a transparent conductive layer, to enhance carrier transmission efficiency. Alternatively, the physical spacer layer may include a surface passivation layer made of a material such as silicon nitride, aluminum oxide, or titanium oxide, to passivate surface defects of sides, facing away from the semiconductor substrate, of the first doped region and the second doped region. Alternatively, the physical spacer layer may include a doped silicon glass layer formed when the first doped region and/or the second doped region made of a silicon material is doped by using a diffusion process (the doped silicon glass layer may be a phosphosilicate glass layer or a borosilicate glass layer). The doped silicon glass layer may be a conductive layer, or may be an insulation layer. Specifically, when a thickness of the doped silicon glass layer is large, the doped silicon glass layer may be an insulation layer. When the thickness of the doped silicon glass layer is small, the doped silicon glass layer may be a conductive layer having particular conductivity. In the present application, the doped silicon glass layer having particular conductivity is referred to as a conductive doped silicon glass layer. In the following, "doped silicon glass layer" is an insulating doped silicon glass layer by default.

Figure 64:
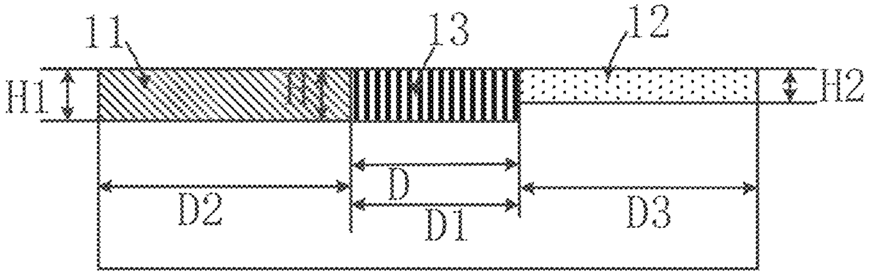
FIG. 64 is a forty-second schematic longitudinal cross-sectional view of a partial structure of a back contact solar cell according to an embodiment of the present application.
Figure 66:
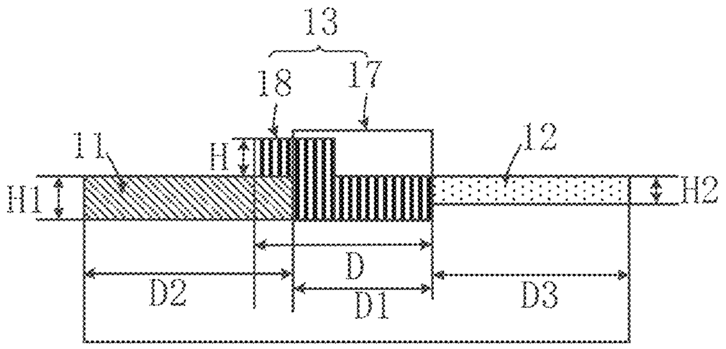
FIG. 66 is a forty-fourth schematic longitudinal cross-sectional view of a partial structure of a back contact solar cell according to an embodiment of the present application.

In an actual application process, a height of the side effective electrical contact surface is defined as a side effective electrical contact height Z. According to different forming positions of the first doped region and the second doped region on the back surface, at least two cases are included below:

In the first case, as shown in FIG. 64 and FIG. 66, the first doped region 11, the second doped region 12, and at least a part of the conductive semiconductor structure 13 are all formed in the semiconductor substrate, and a surface of each of the first doped region 11, the second doped region 12, and the conductive semiconductor structure 13 that faces away from a light receiving surface of the semiconductor substrate is level with a surface of a corresponding region of the back surface of the semiconductor substrate. In the foregoing case, a contact surface between one of the first doped region 11 and the second doped region 12 that has a conduction type opposite to that of the conductive semiconductor structure, and the conductive semiconductor structure 13 includes a side effective electrical contact surface. A height of the side effective electrical contact surface is a side effective electrical contact height Z. The side effective electrical contact height Z is equal to a minimum value of a first depth and a second depth. The first depth is a depth of one of the first doped region 11 and the second doped region 12 that has a conduction type opposite to that of the conductive semiconductor structure 13. The second depth is a depth of a part of the conductive semiconductor structure 13 in the semiconductor substrate. For example, when the depth of one of the first doped region 11 and the second doped region 12 that has a conduction type opposite to that of the conductive semiconductor structure 13 is a depth H1 of the first doped region 11, and a depth H of the conductive semiconductor structure 13 is greater than H1, the side effective electrical contact height Z is equal to H1.

In the second case, both one of the first doped region and the second doped region that has a conduction type opposite to that of the conductive semiconductor structure, and the conductive semiconductor structure include a doped semiconductor layer formed on the back surface of the semiconductor substrate. A contact surface between one of the first doped region and the second doped region that has a conduction type opposite to that of the conductive semiconductor structure, and the conductive semiconductor structure includes a side effective electrical contact surface. A height of the side effective electrical contact surface is a side effective electrical contact height Z. The side effective electrical contact height Z is equal to a minimum value of a first thickness and a second thickness. Along the extension direction of the side effective electrical contact surface, the first thickness is a thickness of a side effective electrical contact surface corresponding to one of the first doped region and the second doped region that has a conduction type opposite to that of the conductive semiconductor structure, and the second thickness is a thickness of a side effective electrical contact surface corresponding to the conductive semiconductor structure. For example, along the extension direction of the side effective electrical contact surface, when the thickness of the side effective electrical contact surface corresponding to one of the first doped region and the second doped region that has a conduction type opposite to that of the conductive semiconductor structure is a thickness H2 of the second doped region, and the thickness H of the conductive semiconductor structure is greater than H2, the side effective electrical contact height Z is equal to H2.

Specifically, in the foregoing second case, when the first doped region, the second doped region, and the conductive semiconductor structure all include a doped semiconductor layer formed on the back surface, the side effective electrical contact height Z and the effective electrical contact area corresponding to the conductive semiconductor structure may be described with reference to a relationship between the conduction types of the conductive semiconductor structure and the first doped region and the second doped region, the disposition heights of the doped semiconductor layers included in the first doped region and the second doped region on the semiconductor substrate, and the formation status of the conductive semiconductor structure.

Figure 15:
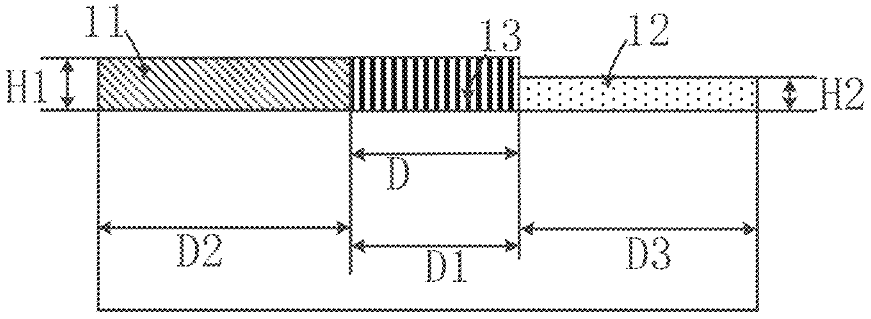
FIG. 15 is a sixth schematic longitudinal cross-sectional view of a partial structure of a back contact solar cell according to an embodiment of the present application.
Figure 16:
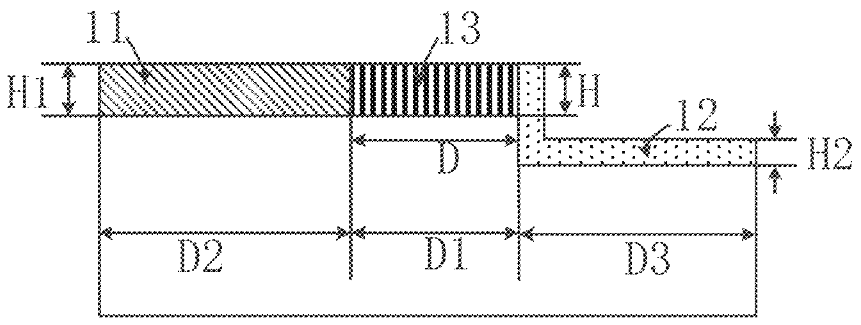
FIG. 16 is a seventh schematic longitudinal cross-sectional view of a partial structure of a back contact solar cell according to an embodiment of the present application.
Figure 17:
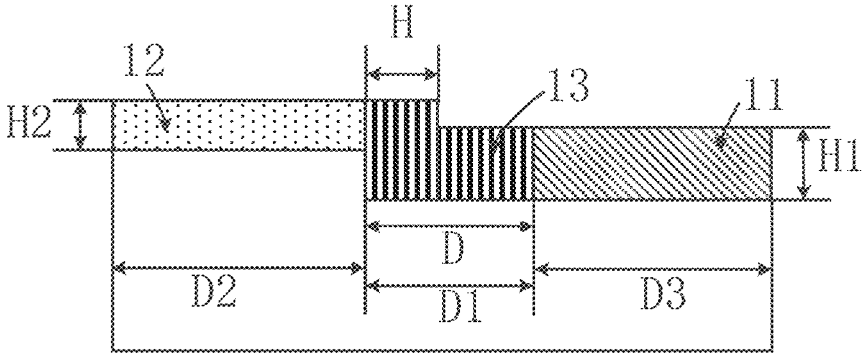
FIG. 17 is an eighth schematic longitudinal cross-sectional view of a partial structure of a back contact solar cell according to an embodiment of the present application.

In the first case, the conductive semiconductor structure is integrally continuous with the first doped region. In this case, the conductive semiconductor structure and the second doped region have opposite conduction types. In this case, when the conductive semiconductor structure is located only between the first doped region and the second doped region, as shown in FIG. 15, if the semiconductor substrate is a plane, the effective electrical contact area corresponding to the conductive semiconductor structure is H2×W, and the side effective electrical contact height Z is H2, where H2 is the thickness of the second doped region. As shown in FIG. 16, if the disposition heights of the doped semiconductor layers included in the first doped region and the conductive semiconductor structure on the semiconductor substrate are greater than the disposition height of the second doped region, the effective electrical contact area corresponding to the conductive semiconductor structure is H×W, and the side effective electrical contact height Z is H, where H is the thickness of the conductive semiconductor structure. As shown in FIG. 17, if the disposition heights of the doped semiconductor layers included in the first doped region and the conductive semiconductor structure on the semiconductor substrate are less than the disposition height of the doped semiconductor layer included in the second doped region, the effective electrical contact area corresponding to the conductive semiconductor structure is H2×W, and the side effective electrical contact height Z is H2.

Figure 18:
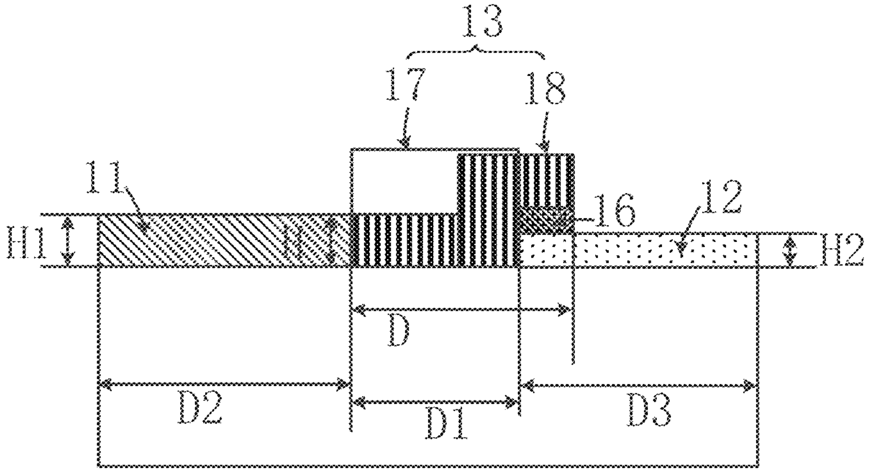
FIG. 18 is a ninth schematic longitudinal cross-sectional view of a partial structure of a back contact solar cell according to an embodiment of the present application.
Figure 19:
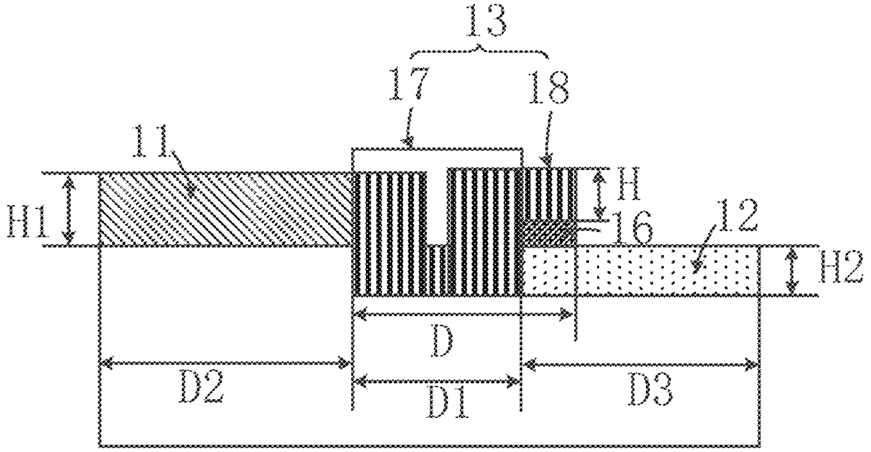
FIG. 19 is a tenth schematic longitudinal cross-sectional view of a partial structure of a back contact solar cell according to an embodiment of the present application.
Figure 20:
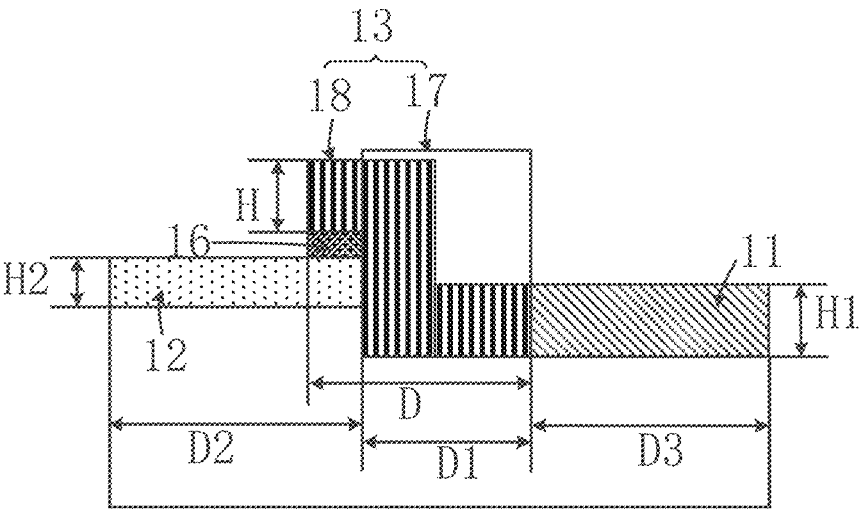
FIG. 20 is an eleventh schematic longitudinal cross-sectional view of a partial structure of a back contact solar cell according to an embodiment of the present application.

In the first case, when the conductive semiconductor structure includes a first conductive semiconductor portion and a second conductive semiconductor portion, as shown in FIG. 18 to FIG. 20, regardless of whether the disposition heights of the doped semiconductor layers included in the first doped region and the second doped region on the semiconductor substrate are the same, if the disposition manner corresponding to the second conductive semiconductor portion 18 is electrical disposition, the effective electrical contact area corresponding to the conductive semiconductor structure is H2×W+W×X, and the side effective electrical contact height Z is H2. If the disposition manner corresponding to the second conductive semiconductor portion 18 is insulation disposition, the effective electrical contact area corresponding to the conductive semiconductor structure is H2×W, and the side effective electrical contact height Z is H2. X is one of the foregoing X1, X2, or X3.

Figure 21:
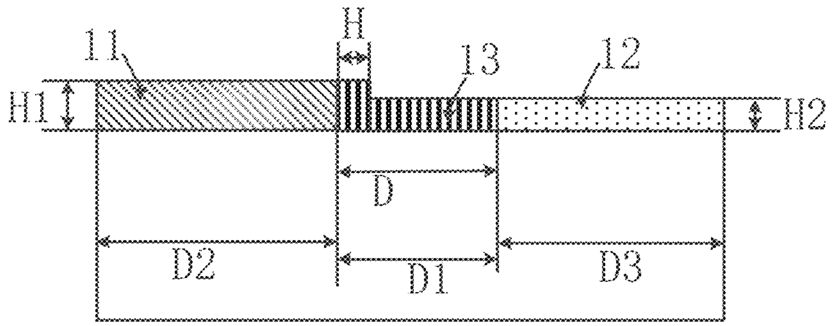
FIG. 21 is a twelfth schematic longitudinal cross-sectional view of a partial structure of a back contact solar cell according to an embodiment of the present application.
Figure 22:
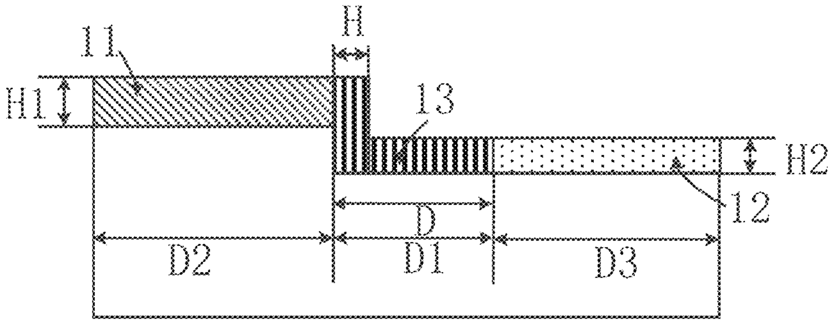
FIG. 22 is a thirteenth schematic longitudinal cross-sectional view of a partial structure of a back contact solar cell according to an embodiment of the present application.
Figure 23:
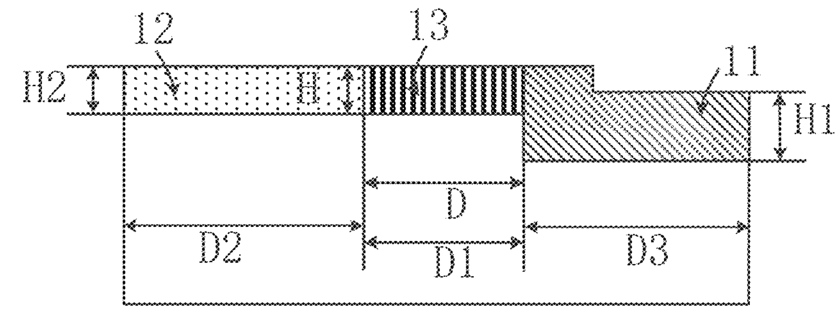
FIG. 23 is a fourteenth schematic longitudinal cross-sectional view of a partial structure of a back contact solar cell according to an embodiment of the present application.

In the second case, the conductive semiconductor structure is integrally continuous with the second doped region. In this case, the conductive semiconductor structure and the first doped region have opposite conduction types. In this case, when the conductive semiconductor structure is located only between the first doped region and the second doped region, as shown in FIG. 21, if the semiconductor substrate is a plane, the effective electrical contact area corresponding to the conductive semiconductor structure is H1×W, and the side effective electrical contact height Z is H1, where H1 is the thickness of the first doped region. As shown in FIG. 22, if the disposition heights of the doped semiconductor layers included in the second doped region and the conductive semiconductor structure on the semiconductor substrate are less than the disposition height of the doped semiconductor layer included in the first doped region, the effective electrical contact area corresponding to the conductive semiconductor structure is H1×W, and the side effective electrical contact height Z is H1. As shown in FIG. 23, if the disposition heights of the doped semiconductor layers included in the second doped region and the conductive semiconductor structure on the semiconductor substrate are greater than the disposition height of the doped semiconductor layer included in the first doped region, the effective electrical contact area corresponding to the conductive semiconductor structure is H×W, and the side effective electrical contact height Z is H.

Figure 24:
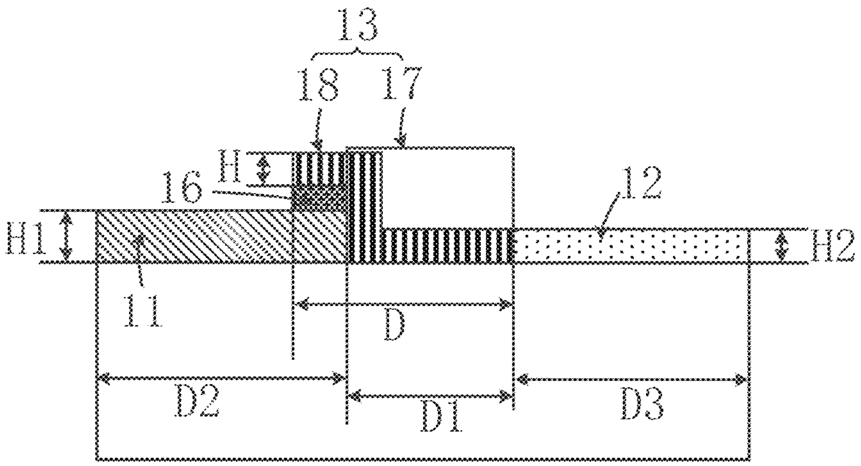
FIG. 24 is a fifteenth schematic longitudinal cross-sectional view of a partial structure of a back contact solar cell according to an embodiment of the present application.
Figure 25:
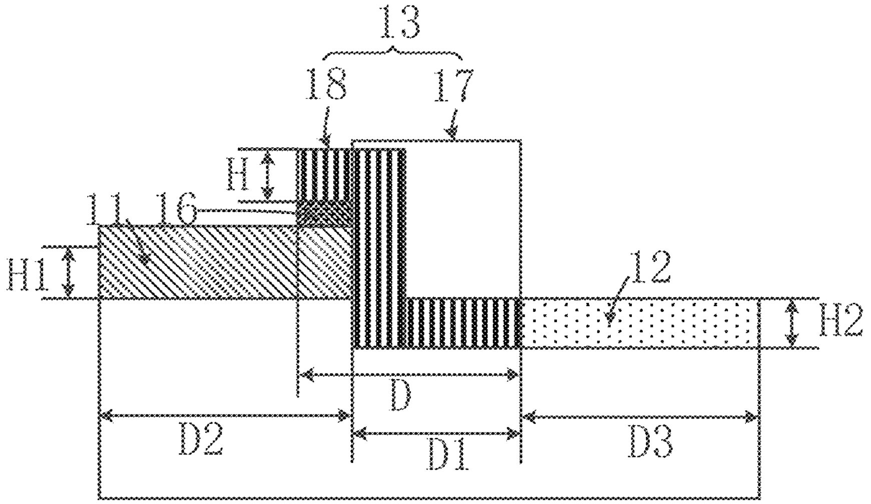
FIG. 25 is a sixteenth schematic longitudinal cross-sectional view of a partial structure of a back contact solar cell according to an embodiment of the present application.
Figure 26:
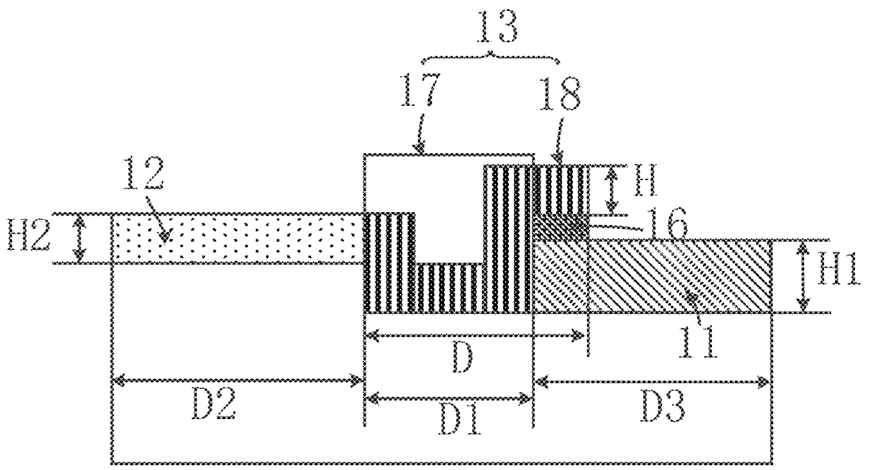
FIG. 26 is a seventeenth schematic longitudinal cross-sectional view of a partial structure of a back contact solar cell according to an embodiment of the present application.
Figure 27:
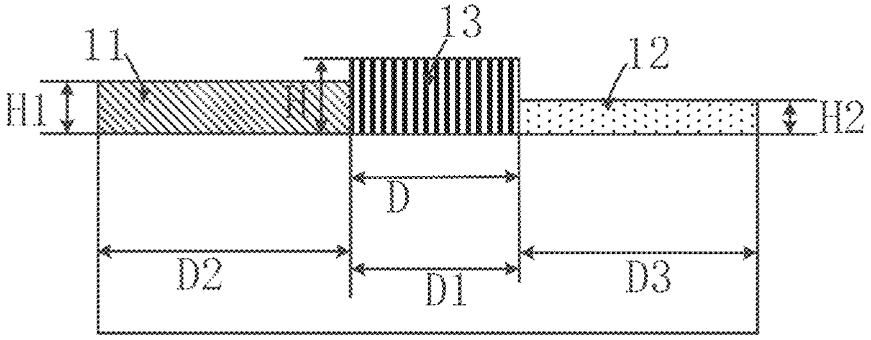
FIG. 27 is an eighteenth schematic longitudinal cross-sectional view of a partial structure of a back contact solar cell according to an embodiment of the present application.
Figure 28:
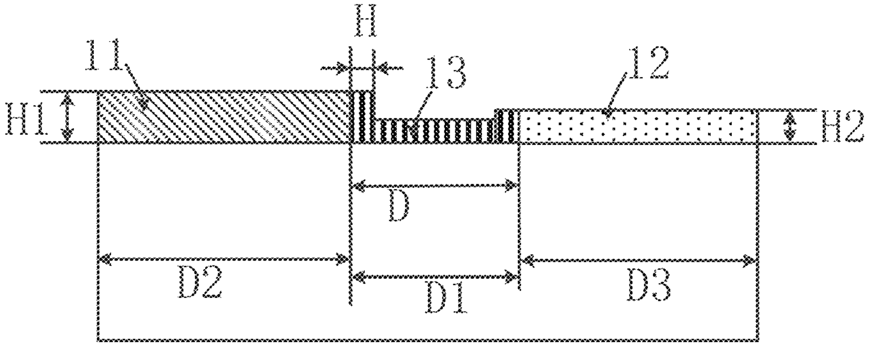
FIG. 28 is a nineteenth schematic longitudinal cross-sectional view of a partial structure of a back contact solar cell according to an embodiment of the present application.
Figure 29:
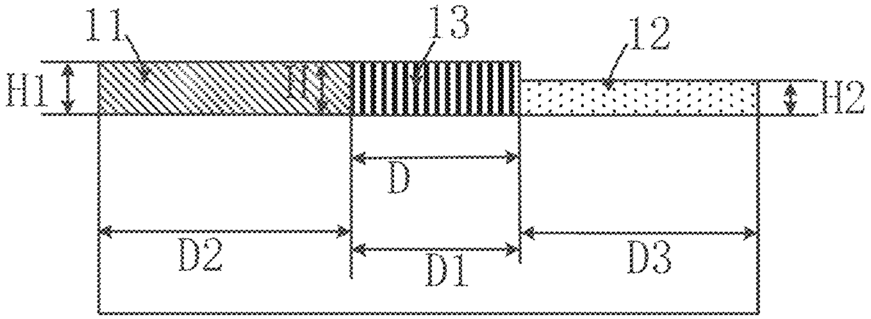
FIG. 29 is a twentieth schematic longitudinal cross-sectional view of a partial structure of a back contact solar cell according to an embodiment of the present application.
Figure 30:
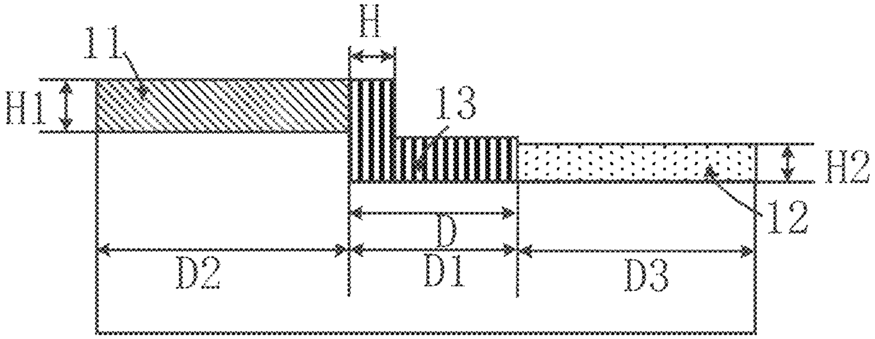
FIG. 30 is a twenty-first schematic longitudinal cross-sectional view of a partial structure of a back contact solar cell according to an embodiment of the present application.
Figure 31:
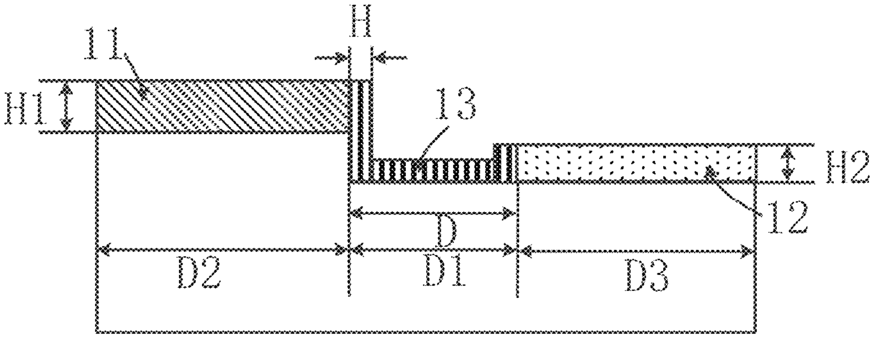
FIG. 31 is a twenty-second schematic longitudinal cross-sectional view of a partial structure of a back contact solar cell according to an embodiment of the present application.
Figure 32:
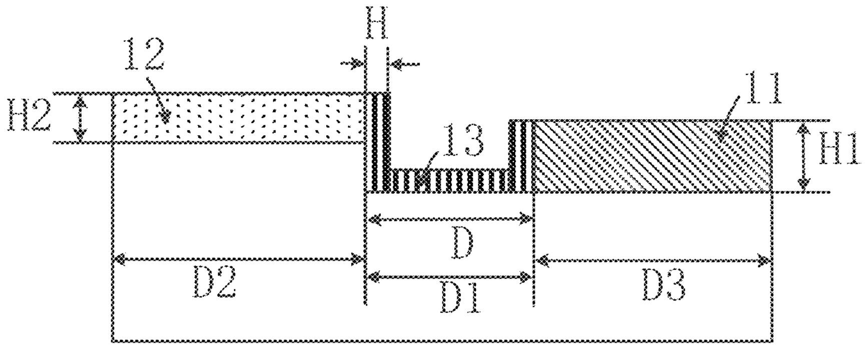
FIG. 32 is a twenty-third schematic longitudinal cross-sectional view of a partial structure of a back contact solar cell according to an embodiment of the present application.

In the second case, when the conductive semiconductor structure includes a first conductive semiconductor portion and a second conductive semiconductor portion, as shown in FIG. 24 to FIG. 26, regardless of whether the disposition heights of the doped semiconductor layers included in the first doped region and the second doped region on the semiconductor substrate are the same, if the disposition manner corresponding to the second conductive semiconductor portion 18 is electrical disposition, the effective electrical contact area corresponding to the conductive semiconductor structure is H1×W+W×X, and the side effective electrical contact height Z is H1. If the disposition manner corresponding to the second conductive semiconductor portion 18 is insulation disposition, the effective electrical contact area corresponding to the conductive semiconductor structure is H1×W, and the side effective electrical contact height Z is H1.

Figure 33:
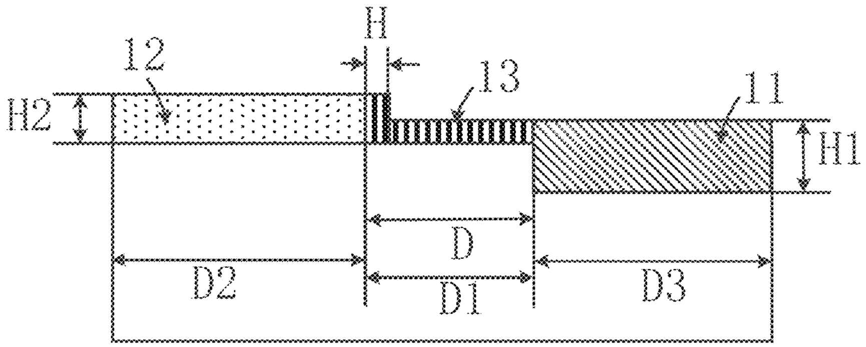
FIG. 33 is a twenty-fourth schematic longitudinal cross-sectional view of a partial structure of a back contact solar cell according to an embodiment of the present application.
Figure 34:
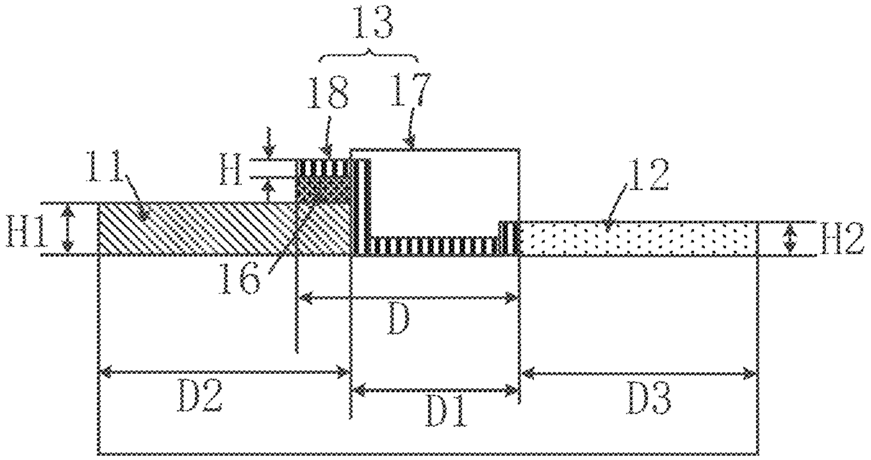
FIG. 34 is a twenty-fifth schematic longitudinal cross-sectional view of a partial structure of a back contact solar cell according to an embodiment of the present application.
Figure 35:
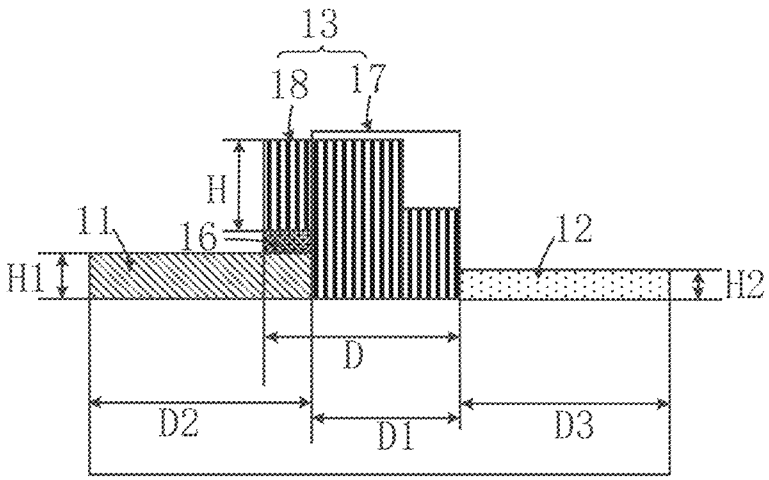
FIG. 35 is a twenty-sixth schematic longitudinal cross-sectional view of a partial structure of a back contact solar cell according to an embodiment of the present application.

In the third case, the conductive semiconductor structure is separately non-integrally continuous with the first doped region and the second doped region, and the conductive semiconductor structure and the first doped region have opposite conduction types. In this case, as shown in FIG. 33, if the disposition heights of the doped semiconductor layers included in the second doped region and the conductive semiconductor structure on the semiconductor substrate are both greater than the disposition height of the doped semiconductor layer included in the first doped region, the effective electrical contact area corresponding to the conductive semiconductor structure is H×W, and the side effective electrical contact height Z is H. As shown in FIG. 27 to FIG. 32, and FIG. 34 to FIG. 38, the effective electrical contact area corresponding to the remaining distributed conductive semiconductor structures is H1×W, and the side effective electrical contact height Z is H1.

Figure 43:
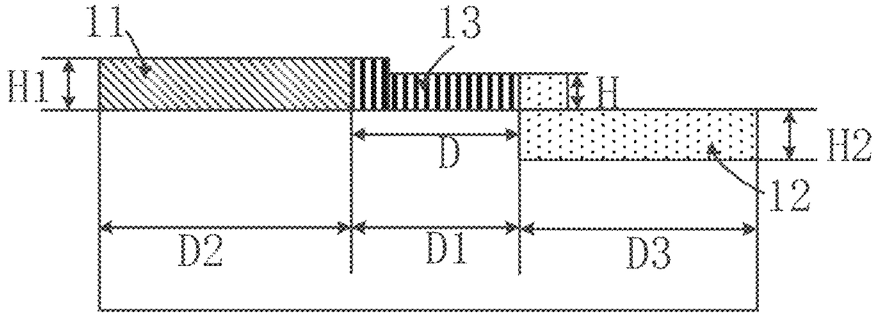
FIG. 43 is a thirty-fourth schematic longitudinal cross-sectional view of a partial structure of a back contact solar cell according to an embodiment of the present application.
Figure 44:
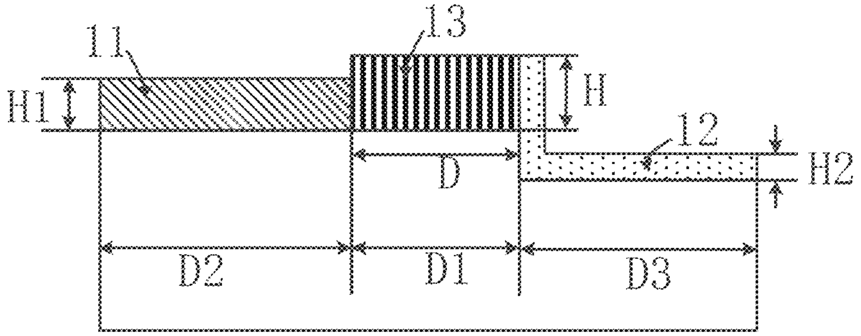
FIG. 44 is a thirty-fifth schematic longitudinal cross-sectional view of a partial structure of a back contact solar cell according to an embodiment of the present application.
Figure 45:
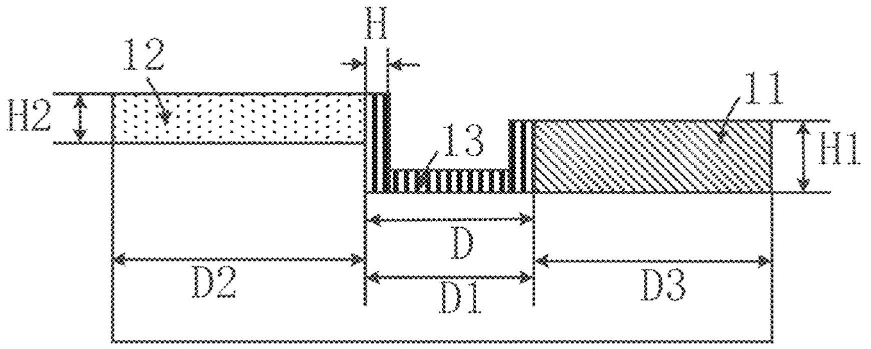
FIG. 45 is a thirty-sixth schematic longitudinal cross-sectional view of a partial structure of a back contact solar cell according to an embodiment of the present application.
Figure 46:
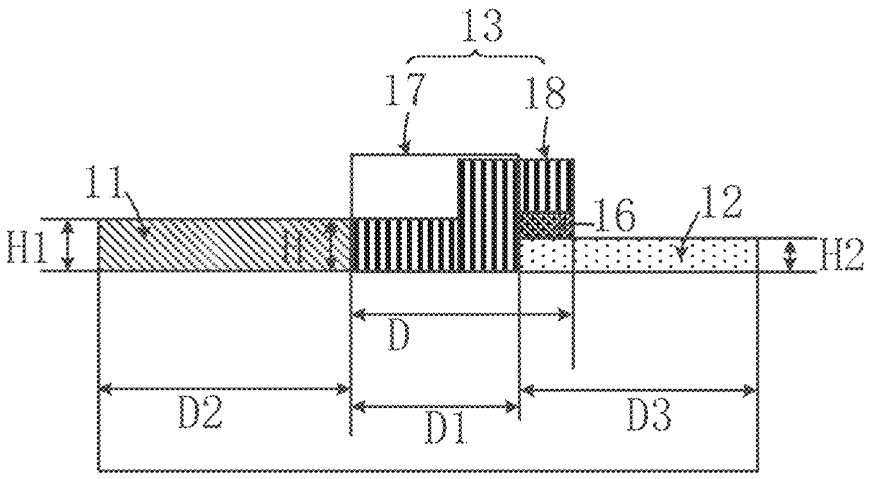
FIG. 46 is a thirty-seventh schematic longitudinal cross-sectional view of a partial structure of a back contact solar cell according to an embodiment of the present application.
Figure 47:
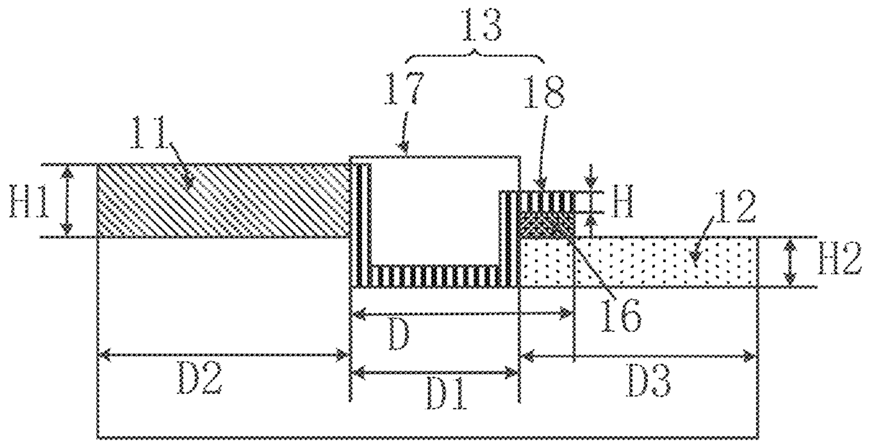
FIG. 47 is a thirty-eighth schematic longitudinal cross-sectional view of a partial structure of a back contact solar cell according to an embodiment of the present application.
Figure 48:
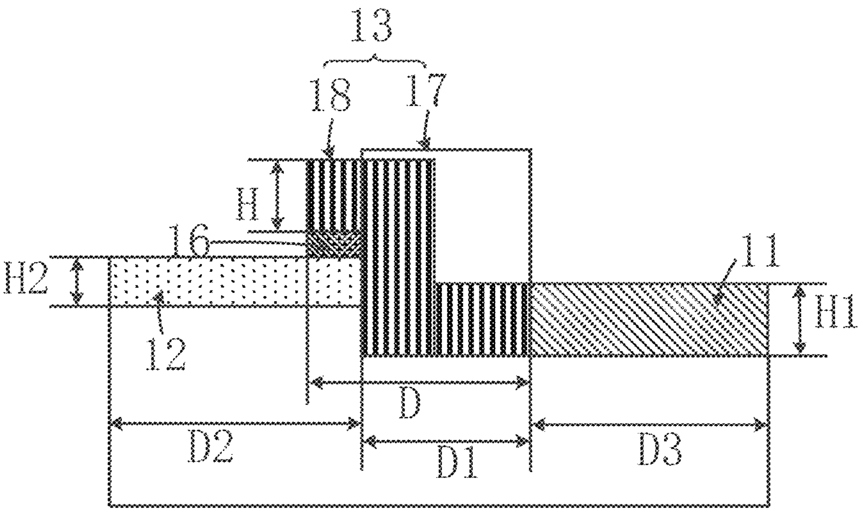
FIG. 48 is a thirty-ninth schematic longitudinal cross-sectional view of a partial structure of a back contact solar cell according to an embodiment of the present application.
Figure 49:
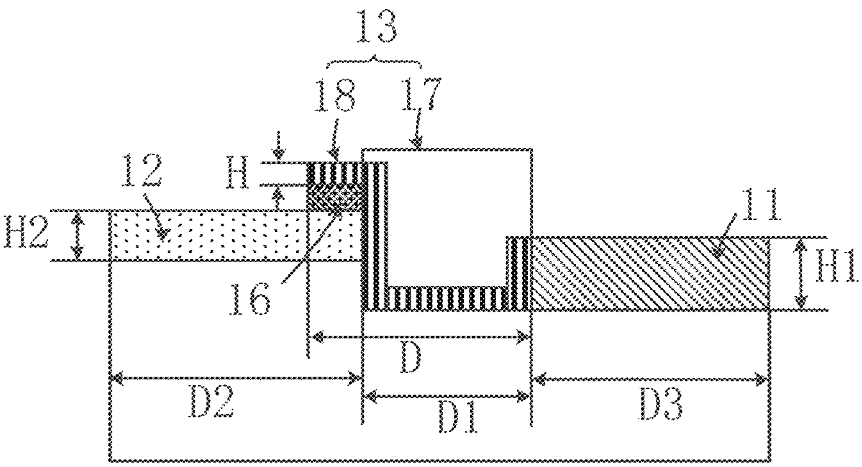
FIG. 49 is a fortieth schematic longitudinal cross-sectional view of a partial structure of a back contact solar cell according to an embodiment of the present application.

In the fourth case, the conductive semiconductor structure is separately non-integrally continuous with the first doped region and the second doped region, and the conductive semiconductor structure and the second doped region have opposite conduction types. In this case, as shown in FIG. 43 and FIG. 44, if the disposition heights of the doped semiconductor layers included in the first doped region and the conductive semiconductor structure on the semiconductor substrate are both greater than the disposition height of the doped semiconductor layer included in the second doped region, the effective electrical contact area corresponding to the conductive semiconductor structure is H×W, and the side effective electrical contact height Z is H. As shown in FIG. 40 to FIG. 42, and FIG. 45 to FIG. 49, the effective electrical contact area corresponding to the remaining distributed conductive semiconductor structures is H2×W, and the side effective electrical contact height Z is H2.

It should be noted that, as can be seen from the foregoing first case to fourth case, the side effective electrical contact height at which the first doped region and the second doped region are electrically coupled by using the conductive semiconductor structure is Z. As shown in FIG. 15, FIG. 18, FIG. 21, FIG. 27 to FIG. 29, FIG. 34, FIG. 35, FIG. 40, and FIG. 42, in a case that the back surface of the semiconductor substrate is a plane, the side effective electrical contact height Z is equal to the thickness (i.e., H1 or H2) of one of the first doped region 11 and the second doped region 12 that has a conduction type opposite to that of the conductive semiconductor structure 13.

Alternatively, as shown in FIG. 16, FIG. 23, FIG. 33, FIG. 43, and FIG. 44, in a case that a height of disposing, on the back surface of the semiconductor substrate, the doped semiconductor layer included in one of the first doped region 11 and the second doped region 12 that has a conduction type opposite to that of the conductive semiconductor structure 13 is less than a height of disposing, on the back surface of the semiconductor substrate, the doped semiconductor layer included in the conductive semiconductor structure 13, a part of a side surface of the doped semiconductor layer included in one of the first doped region 11 and the second doped region 12 that has a conduction type opposite to that of the conductive semiconductor structure 13 is in electrical contact with the semiconductor substrate, and another part of the side surface of the doped semiconductor layer included in one of the first doped region 11 and the second doped region 12 that has a conduction type opposite to that of the conductive semiconductor structure 13 is in electrical contact with the conductive semiconductor structure 13, the side effective electrical contact height Z is equal to the thickness (i.e., H) of the conductive semiconductor structure 13.

Alternatively, as shown in FIG. 17, FIG. 19, FIG. 20, FIG. 22, FIG. 24 to FIG. 26, FIG. 30 to FIG. 32, and FIG. 37 to FIG. 39, in a case that heights of disposing, on the back surface of the semiconductor substrate, the doped semiconductor layers included in the first doped region 11 and the second doped region 12 are different, and regions corresponding to the conductive semiconductor structure in a side surface of the doped semiconductor layer included in one of the first doped region 11 and the second doped region 12 that has a conduction type opposite to that of the conductive semiconductor structure 13 are in electrical contact with the conductive semiconductor structure, the side effective electrical contact height Z is equal to the thickness of one of the first doped region 11 and the second doped region 12 that has a conduction type opposite to that of the conductive semiconductor structure 13.

In addition, as can be seen from the foregoing, in a case that a height of disposing, close to the back surface of the semiconductor substrate, the doped semiconductor layer included in one of the first doped region and the second doped region that has a conduction type opposite to that of the conductive semiconductor structure is less than a height of disposing, close to the back surface of the semiconductor substrate, the doped semiconductor layer included in the conductive semiconductor structure, a part of a side surface of the doped semiconductor layer included in one of the first doped region and the second doped region that has a conduction type opposite to that of the conductive semiconductor structure is in electrical contact with the semiconductor substrate, and another part of the side surface of the doped semiconductor layer included in one of the first doped region and the second doped region that has a conduction type opposite to that of the conductive semiconductor structure is in electrical contact with the conductive semiconductor structure, a part of the side surface of the doped semiconductor layer included in one of the first doped region and the second doped region that has a conduction type opposite to that of the conductive semiconductor structure is in electrical contact with the semiconductor substrate, so that only a part of the side surface, close to the conductive semiconductor structure, of the doped semiconductor layer included in the first doped region and the second doped region is in electrical contact with the conductive semiconductor structure. In this case, a difference range between the height of the region surface, corresponding to the back surface, of the conductive semiconductor structure and the height of the region surface, corresponding to the back surface, of one of the first doped region and the second doped region that has a conduction type opposite to that of the conductive semiconductor structure may be determined according to a process of manufacturing the first doped region and the second doped region in an actual application scenario. Exemplarily, in this case, a difference between a height of a region surface corresponding to the conductive semiconductor structure and a height of a region surface corresponding to the doped semiconductor layer included in one of the first doped region and the second doped region that has a conduction type opposite to that of the conductive semiconductor structure in the back surface along a thickness direction of the semiconductor substrate may be greater than or equal to 0.4 μm and less than or equal to 2 μm. For example, in this case, the difference between the height of the region surface, corresponding to the back surface, of the conductive semiconductor structure and the height of the region surface, corresponding to the back surface, of one of the first doped region and the second doped region that has a conduction type opposite to that of the conductive semiconductor structure may be 0.4 μm, 0.6 μm, 0.8 μm, 1 μm, 1.5 μm, 1.8 μm, or 2 μm. In this case, descriptions are provided by using an example in which the first doped region and the conductive semiconductor structure have opposite conduction types: When the doped semiconductor layer included in the first doped region is formed, it is difficult to fill a material for manufacturing the doped semiconductor layer included in the first doped region at a corner caused by the height difference. Consequently, it is difficult for the doped semiconductor layer included in the first doped region to be completely in contact with each part of the surface of the semiconductor substrate (or, the semiconductor substrate and the conductive semiconductor structure) at the corner. Therefore, the difference between the height of the region surface, corresponding to the back surface, of the conductive semiconductor structure and the height of the region surface, corresponding to the back surface, of one of the first doped region and the second doped region that has a conduction type opposite to that of the conductive semiconductor structure falls within the foregoing range. The part, filled at the corner, of the doped semiconductor layer included in the first doped region may be staggered from the side wall of the conductive semiconductor structure that has a conduction type opposite to that of the first doped region, to ensure a large side effective electrical contact area between the conductive semiconductor structure and the first doped region having opposite conduction types. Corresponding beneficial effects when the second doped region has a conduction type opposite to that of the conductive semiconductor structure are the same as the foregoing effects. Details are not described herein again.

The effective electrical contact surface corresponding to each conductive semiconductor structure includes a side effective electrical contact surface and/or a top effective electrical contact surface. Specifically, the foregoing effective electrical contact area S is equal to $\alpha \times W \times X + \beta \times Z \times W$, where $\alpha$ and $\beta$ are both constants greater than or equal to 0 and less than or equal to 1. Specific sizes of $\alpha$ and $\beta$ may be determined according to the forming position of the conductive semiconductor structure, the conductivity of the physical spacer layer, and a specific structure of the back contact solar cell.

For example, if the conductive semiconductor structure does not include the second conductive semiconductor portion disposed above the part, facing away from the semiconductor substrate, of the first doped region and/or the second doped region, or the disposition manner corresponding to the second conductive semiconductor portion included in the conductive semiconductor structure is insulation disposition, $\alpha$ is equal to 0. In this case, $\beta$ is greater than 0 and is less than or equal to 1, and the effective electrical contact area is equal to $\beta \times Z \times W$.

For example, if both the first and the second doped regions are formed in the semiconductor substrate and the conductive semiconductor structure is formed only on the semiconductor substrate, or one of the first doped region and the second doped region that has a conduction type opposite to that of the conductive semiconductor structure is located in the semiconductor substrate and the conductive semiconductor structure is disposed only above a part, facing away from the semiconductor substrate, of one of the first doped region and the second doped region that has a conduction type opposite to that of the conductive semiconductor structure, β is equal to 0. The effective electrical contact area is a top effective electrical contact area. Also, in this case, α is greater than 0 and is less than or equal to 1. The effective electrical contact area is equal to α×W×X.

For example, if the disposition manner corresponding to the second conductive semiconductor portion included in the conductive semiconductor structure is electrical disposition, and the effective electrical contact surface between one of the first doped region and the second doped region that has a conduction type opposite to that of the conductive semiconductor structure, and the conductive semiconductor structure also includes a side effective electrical contact surface, α is greater than 0 and is less than or equal to 1, and β is greater than or equal to 0 and is less than or equal to 1. It may be understood that the foregoing effective electrical contact area S is equal to α×W×X+β×Z×W, When α is greater than 0, a specific size of α may be determined according to electrical conduction on the top effective electrical contact surface between the second conductive semiconductor portion and one of the first doped region and the second doped region that has a conduction type opposite to that of the conductive semiconductor structure. For example, when the second conductive semiconductor portion is formed directly above the part, facing away from the semiconductor substrate, of one of the first doped region and the second doped region that has a conduction type opposite to that of the conductive semiconductor structure, a may be equal to 1. Alternatively, when a physical spacer layer having good conductivity such as a transparent conductive layer is formed between the second conductive semiconductor portion and one of the first doped region and the second doped region that has a conduction type opposite to that of the conductive semiconductor structure, α may also be equal to 1. Alternatively, when a physical spacer layer such as a conductive doped silicon glass layer having low conductivity is formed between the second conductive semiconductor portion and one of the first doped region and the second doped region that has a conduction type opposite to that of the conductive semiconductor structure, α may also be less than 1.

When β is greater than 0, a specific size of β may be determined according to side electrical conduction between the conductive semiconductor structure and one of the first doped region and the second doped region that has a conduction type opposite to that of the conductive semiconductor structure. For example, the conductive semiconductor structure, the first doped region, and the second doped region all include a doped semiconductor layer, and when the doped semiconductor layer included in the conductive semiconductor structure is in direct contact with a side surface of the doped semiconductor layer included in one of the first doped region and the second doped region that has a conduction type opposite to that of the conductive semiconductor structure, β may be equal to 1. In addition, β may be greater than or equal to a.

In the foregoing case, the effective electrical contact area may be adjusted by adjusting the sizes of α and β, to obtain a suitable area of the effective electrical contact surface, thereby implementing an optimized design of product configuration.

Also, in an actual application process, the effective electrical contact area corresponding to the conductive semiconductor structure may be affected due to the orthographic projection area of the conductive semiconductor structure on the back surface, magnitude of a leakage current formed by the first doped region and the second doped region through the conductive semiconductor structure is affected, and the reverse breakdown voltage of the back contact solar cell and operating efficiency of the back contact solar cell in a normal operating state are further affected. Based on this, a ratio of the orthographic projection area of each conductive semiconductor structure on the back surface to the area of the back surface, and a range in which the conductive semiconductor structure is disposed on the first doped region and/or the second doped region may be determined according to requirements on the reverse breakdown voltage and operating efficiency of the back contact solar cell in an actual application scenario and precision of a manufacturing device for actually manufacturing the back contact solar cell.

Exemplarily, an orthographic projection area, on the back surface, of a part of at least one conductive semiconductor structure located between the first doped region and the second doped region is S1, an area of the back surface is S2, and a ratio of S1 to S2 may be greater than or equal to 8.5×10-7% and less than or equal to 6.67×10-1%. For example, a ratio of the orthographic projection area of at least one conductive semiconductor structure on the back surface to the area of the back surface may be 8.5×10-7%, 1×10-6%, 1×10-5%, 1×10-4%, 1×10-3%, 1×10-2%, 1×10-1%, or 6.67×10-1%. In this case, a low amplitude of reducing the reverse breakdown voltage of the back contact solar cell by disposing the conductive semiconductor structure due to a small S1 can be prevented, thereby preventing the back contact solar cell from being burned out due to local heat concentration, and effectively reducing a risk of hot spots of the photovoltaic module including the back contact solar cell provided in this embodiment of the present application. It can be prevented that the etching precision is strictly required to form the conductive semiconductor structure having a small size, thereby reducing the etching difficulty. In addition, a large leakage current of the back contact solar cell in a normal operating situation caused by a large S1 can be prevented, thereby further ensuring that the photovoltaic module including the back contact solar cell provided in this embodiment of the present application has a high photoelectric conversion efficiency in a forward voltage region.

A specific value of the orthographic projection area, on the back surface, of a part of each conductive semiconductor structure located between the first doped region and the second doped region may be determined according to the foregoing ratio and a specific size of the semiconductor substrate used in an actual application scenario. For example, in a case that the area of the back surface of the semiconductor substrate is 359.0364 square centimeters, the orthographic projection area, on the back surface, of a part of at least one conductive semiconductor structure located between the first doped region and the second doped region may be any value greater than or equal to 300 square micrometers and less than or equal to 2.4 square centimeters.

Preferably, the ratio of S1 to S2 may be greater than or equal to 7.2×10-6% and less than or equal to 4.6×10-3%. For example, the ratio of S1 to S2 may be 7.2×10-6%, 1×10-5%, 1×10-4%, 1×10-3%, or 4.6×10-3%. A preferred range of the orthographic projection area, on the back surface, of a part of each conductive semiconductor structure located between the first doped region and the second doped region may be determined according to the foregoing ratio and a specific size of the semiconductor substrate used in an actual application scenario. For example, in a case that the area of the back surface of the semiconductor substrate is 34944 square millimeters, the orthographic projection area, on the back surface, of a part of at least one conductive semiconductor structure located between the first doped region and the second doped region may be any value greater than or equal to 0.0025 square millimeters and less than or equal to 1.6 square millimeters. In this case, the ratio of S1 to S2 has a large alternative range. An appropriate solution may be selected according to requirements such as a model of the back contact solar cell in an actual application scenario, leakage prevention, and reduction of a risk of hot spots, thereby facilitating improving applicability of the back contact solar cell provided in the present application to different application scenarios. In addition, an effective electrical contact area corresponding to a single conductive semiconductor structure can be prevented from being excessively small or excessively large. For the effect, refer to the foregoing descriptions. Details are not described herein again.

In a case that the conductive semiconductor structure includes a first conductive semiconductor portion and a second conductive semiconductor portion, an area ratio, on the back surface, of the orthographic projection area S4 of the second conductive semiconductor portion on the back surface may be determined according to requirements on the reverse breakdown voltage and operating efficiency of the back contact solar cell in an actual application scenario, and precision of the manufacturing device for actually manufacturing the back contact solar cell. This is not specifically limited herein.

Exemplarily, the ratio of S4 to S2 may be greater than 0 and less than or equal to 4.6×10-3%. For example, the ratio of S4 to S2 may be 0.1×10-3%, 0.5×10-3%, 1.0×10-3%, 1.5×10-3%, 2×10-3%, 2.5×10-3%, 3×10-3%, 4×10-3%, or 4.6×10-3%. A preferred range of the orthographic projection area, on the back surface, of the second conductive semiconductor portion may be determined according to the foregoing ratio and a specific size of the semiconductor substrate used in an actual application scenario. For example, in a case that the area of the back surface of the semiconductor substrate is 34944 square millimeters, the orthographic projection area, on the back surface, of the second conductive semiconductor portion may be any value greater than 0 and less than or equal to 1.6 square millimeters. In this case, impact on formation of an electrode structure caused by a large disposition width of the second conductive semiconductor portion on the first doped region and/or the second doped region due to a large ratio of S4 to S2 can be prevented, thereby reducing difficulty in manufacturing the electrode structure, and ensuring that the electrode structure has good contact performance with the corresponding doped region and the electrode structure has good transmission performance.

A specific size of the effective electrical contact area corresponding to each conductive semiconductor structure may be determined according to a forming range of the conductive semiconductor structure, requirements on the reverse breakdown voltage and operating efficiency of the back contact solar cell in an actual application scenario, requirements on a model and size of the back contact solar cell in an actual application scenario, and precision of the manufacturing device for actually manufacturing the back contact solar cell.

In a case that the conductive semiconductor structure includes the second conductive semiconductor portion, according to different disposition manners of the conductive semiconductor structure, the specific size of the effective electrical contact area is described in two cases:

Exemplarily, in a case that the conductive semiconductor structure is disposed by insulation on a part, in electrical contact with the conductive semiconductor structure, of the first doped region and/or the second doped region, the effective electrical contact area corresponding to at least one conductive semiconductor structure may be greater than or equal to 0.000025 mm2 and less than or equal to 0.016 mm2. For example, in this case, the effective electrical contact area corresponding to at least one conductive semiconductor structure may be 0.000025 mm2, 0.0001 mm2, 0.0012 mm2, 0.0015 mm2, 0.0018 mm2, 0.002 mm2, 0.0022 mm2, 0.0025 mm2, 0.005 mm2, 0.01 mm2, or 0.016 mm2. In this case, the effective electrical contact area corresponding to at least one conductive semiconductor structure is within the foregoing range, thereby preventing a low amplitude of reducing the reverse breakdown voltage of the back contact solar cell by disposing the conductive semiconductor structure due to a small effective electrical contact area corresponding to the conductive semiconductor structure, preventing the back contact solar cell from being burned out due to local heat concentration, and effectively reducing a risk of hot spots of the photovoltaic module including the back contact solar cell provided in this embodiment of the present application. It can be prevented that the etching precision is strictly required to form the conductive semiconductor structure having a small size, thereby reducing the etching difficulty. In addition, a large leakage current of the back contact solar cell in a normal operating situation caused by a large effective electrical contact area corresponding to the conductive semiconductor structure can be prevented, thereby further ensuring that the photovoltaic module including the back contact solar cell provided in this embodiment of the present application has a high photoelectric conversion efficiency in a forward voltage region. In addition, it can be further prevented that a size range to which the back contact solar cell provided in this embodiment of the present application is applicable is limited due to a large value of W and/or Z for increasing the effective electrical contact area corresponding to the conductive semiconductor structure, thereby further expanding the application range of the back contact solar cell provided in this embodiment of the present application.

Exemplarily, in a case that the disposition manner corresponding to the conductive semiconductor structure is electrical disposition, an effective electrical contact area corresponding to at least one conductive semiconductor structure may be greater than or equal to 0.000175 mm2 and less than or equal to 1.616 mm2. For example, in this case, the effective electrical contact area corresponding to at least one conductive semiconductor structure may be 0.000175 mm2, 0.001 mm2, 0.005 mm2, 0.01 mm2, 0.02 mm2, 0.04 mm2, 0.06 mm2, 0.08 mm2, 0.1 mm2, 0.2 mm2, 0.6 mm2, 1 mm2, 1.2 mm2, or 1.616 mm2. Beneficial effects in this case are similar to beneficial effects when the effective electrical contact area corresponding to at least one conductive semiconductor structure is greater than or equal to 0.000025 mm2 and is less than or equal to 0.016 mm2 in a case that the conductive semiconductor structure is disposed by insulation on a part, in electrical contact with the conductive semiconductor structure, of the first doped region and/or the second doped region. Details are not described herein again.

However, when the conductive semiconductor structure is located only between the first doped region and the second doped region, only a side wall of the conductive semiconductor structure is separately in contact with the first doped region and the second doped region. In this case, for the effective electrical contact area corresponding to the conductive semiconductor structure, refer to the foregoing effective electrical contact area in a case that the conductive semiconductor structure is disposed by insulation on a part, in electrical contact with the conductive semiconductor structure, of the first doped region and/or the second doped region. Details are not described herein again.

A specific size of each conductive semiconductor structure may be determined according to a specific forming position of the part of each conductive semiconductor structure between the first doped region and the second doped region, a range in which the conductive semiconductor structure is disposed on the first doped region and/or the second doped region, and an actual application scenario.

In some cases, as shown in FIG. 2 to FIG. 4, the width of the spacer region located between the first doped region 11 and the second doped region 12 is D1. The width of the conductive semiconductor structure 13 along an extension direction of the spacer region is W, and 0.5D1≤W≤6D1.

It should be noted that the extension direction of the spacer region refers to a direction parallel to the back surface of the semiconductor substrate and perpendicular to the width of the spacer region.

In a case that the foregoing technical solution is adopted, along the extension direction of the spacer region, the width of the conductive semiconductor structure 13 satisfies 0.5D1≤W≤6D1. In this case, effective electrical contact areas between the conductive semiconductor structure 13 and the first doped region and the second doped region separately and area ratios of parts of the conductive semiconductor structure 13 in effective contact with the first doped region and the second doped region separately on the back surface may be effectively adjusted by adjusting a value of W, thereby preventing a low amplitude of reducing the reverse breakdown voltage of the back contact solar cell by disposing the conductive semiconductor structure 13 due to a small effective electrical contact area between a single conductive semiconductor structure 13 and the first doped region and the second doped region and a small sum of area ratios of parts of all conductive semiconductor structures 13 in effective contact with the first doped region and the second doped region separately on the back surface, and preventing the back contact solar cell from being burned out due to local heat concentration. However, within a particular range, a small-sized conductive semiconductor structure 13 has a higher requirement on the etching precision. Therefore, if W≥0.5D1, the manufacturing difficulty of forming the conductive semiconductor structure 13 on the back surface can be further reduced. In addition, each conductive semiconductor structure 13 may be considered as a local compound center disposed between the first doped region and the second doped region. Based on this, if W is within the foregoing range, a large local leakage current between the first doped region and the second doped region due to a large value of W can be further prevented, thereby ensuring that the photovoltaic module including the back contact solar cell provided in this embodiment of the present application has a high photoelectric conversion efficiency in the forward voltage region.

Specifically, W may be any value greater than or equal to 0.5D1 and less than or equal to 6D1. For example, the value of W may be equal to 0.5D1, D1, 2D1, 3D1, 4D1, 5D1, or 6D1.

Preferably, W may be any value greater than or equal to 0.5D1 and less than or equal to 3D1. For example, the value of W may be equal to 0.5D1, 0.8D1, D1, 1.5D1, 2D1, 2.5D1, or 3D1. In this case, in an actual application process, not only the width of the conductive semiconductor structure along the extension direction of the spacer region affects the effective electrical contact areas between the conductive semiconductor structure and the first doped region and the second doped region, but also the thickness of the conductive semiconductor structure (and in a case that the disposition manner corresponding to the conductive semiconductor structure is electrical disposition on a part, in electrical contact with the conductive semiconductor structure, of the first doped region and/or the second doped region, the width of a part, disposed on the first doped region and/or the second doped region, of the conductive semiconductor structure, or the doping concentration of impurities in the conductive semiconductor structure) may also affect the size of the effective electrical contact area. For example, in a case that the heights of disposing, on the semiconductor substrate, the doped semiconductor layers included in the first doped region and the second doped region are different, the height of disposing the doped semiconductor layer at a smaller height is smaller than the height of disposing the doped semiconductor layer included in the conductive semiconductor structure on the semiconductor substrate, and the conduction type of the doped semiconductor layer at a smaller height of disposition is opposite to that of the conductive semiconductor structure, a larger thickness of the doped semiconductor layer included in the conductive semiconductor structure indicates a larger effective electrical contact area. In the foregoing case, the width W of the conductive semiconductor structure along the extension direction of the spacer region is within the foregoing range, so that a predetermined disposition space may be reserved at least for a thickness range of the conductive semiconductor structure and/or a disposition width range in the case of electrical disposition, thereby preventing a small reduction degree of a leakage loss of the back contact solar cell due to a large effective electrical contact area due to a large thickness and width W of the conductive semiconductor structure and a large disposition width in the case of electrical disposition, and ensuring a high operating efficiency of the back contact solar cell.

The width of the conductive semiconductor structure may be determined according to the orthographic projection area of the conductive semiconductor structure on the back surface and a range in which the conductive semiconductor structure is disposed on the first doped region and/or the second doped region.

Exemplarily, as shown in FIG. 3, in a case that the conductive semiconductor structure 13 is at least partially located between two adjacent strip-shaped doped regions 14 respectively belonging to the first doped region and the second doped region, it is defined that a width of the strip-shaped doped region 14 in contact with the conductive semiconductor structure 13 in the first doped region is D2. A width of the strip-shaped doped region 14 in contact with the conductive semiconductor structure 13 in the second doped region is D3. Along a distribution direction of the strip-shaped doped regions 14 having opposite conduction types, a length of the conductive semiconductor structure 13 is D, and D1≤D≤D1+D2+D3. In this case, as shown in FIG. 3, after a model of the back contact solar cell is determined, D1, D2, and D3 are determined fixed values. Based on this, if D is equal to D1 in a case that the conductive semiconductor structure 13 is at least partially located between two adjacent strip-shaped doped regions 14 respectively belonging to the first doped region and the second doped region, the conductive semiconductor structure 13 located between the two adjacent strip-shaped doped regions 14 having opposite conduction types can be separately in electrical contact with the two adjacent strip-shaped doped regions 14 having opposite conduction types along an arrangement direction of the strip-shaped doped regions 14 having opposite conduction types, to ensure that the first doped region 11 and the second doped region can be electrically connected through the conductive semiconductor structure 13. Meanwhile, an orthographic projection area of the conductive semiconductor structure 13 on the back surface may be accurately regulated, to ensure that a risk of hot spots corresponding to the back contact solar cell and operating efficiency under normal operation can both accurately satisfy an operating requirement. Also, as shown in FIG. 7 to FIG. 9, the value of D may be further greater than D1 and less than or equal to D1+D2+D3. In this case, the conductive semiconductor structure 13 not only may be located between the two adjacent strip-shaped doped regions 14 having opposite conduction types, but also may be disposed on at least one of the two adjacent strip-shaped doped regions 14 having opposite conduction types, so as to prevent a strict requirement on the etching precision to obtain only the conductive semiconductor structure 13 located only between the two adjacent strip-shaped doped regions 14 having opposite conduction types, thereby reducing the etching difficulty. In addition, in a case that the conductive semiconductor structure 13 is electrically disposed on a part, in electrical contact with the conductive semiconductor structure, of the first doped region and/or the second doped region, the size of the effective electrical contact area may be adjusted by adjusting the value of D, so as to balance the reverse breakdown voltage and the leakage loss of the back contact solar cell, thereby facilitating good operating performance of the back contact solar cell.

Preferably, the value of D may satisfy $D \leq D1+\frac{1}{2}D2+\frac{1}{2}D3$. In this case, carriers collected by the first doped region and the second doped region need to be exported through electrode structures in ohmic contact with the first doped region and the second doped region. Based on this, along the width direction of the strip-shaped doped regions, a part of the strip-shaped doped regions included in the first doped region and the second doped region and along an extension direction of the strip-shaped doped regions need to be directly in ohmic contact with the electrode structure, and the ohmic contact region occupies a particular width. In this case, when $$D \leq D1 + \frac{1}{2}D2 + \frac{1}{2}D3,$$

it can be prevented that the etching precision is strictly required to form the conductive semiconductor structure having a small disposition width due to a small disposition width corresponding to the conductive semiconductor structure, thereby reducing the etching difficulty. Meanwhile, it can be further prevented that an effective electrical contact area corresponding to the conductive semiconductor structure is also small due to a small disposition width of the conductive semiconductor structure, resulting in a poor effect of reducing a risk of hot spots in the back contact solar cell by disposing the conductive semiconductor structure in a case that a disposition manner corresponding to the conductive semiconductor structure is electrical disposition. In addition, it can be further prevented that the electrode structure cannot be in ohmic contact with the strip-shaped doped regions included in the first doped region and the second doped region due to a large disposition width of the conductive semiconductor structure, to ensure that current collected by the first doped region and the second doped region can be exported through the electrode structure, thereby facilitating formation of a photocurrent.

Exemplarily, as shown in FIG. 4, in a case that the conductive semiconductor structure 13 is at least partially located between one strip-shaped doped region 14 included in one of the first doped region and the second doped region and an adjacent connection region 15 included in the other doped region, it is defined that a width of the connection region 15, in contact with the conductive semiconductor structure 13, belonging to one of the first doped region and the second doped region is W1. A length of the strip-shaped doped region 14 that belongs to the other of the first doped region and the second doped region and is in contact with the conductive semiconductor structure 13 is W2. Moreover, a length of the conductive semiconductor structure 13 along a width direction of the spacer region is D, and $D1 \leq D \leq D1+W1+W2$. In this case, after a model of the back contact solar cell is determined, D1, W1, and W2 are determined fixed values. Based on this, when D is equal to D1 in a case that the conductive semiconductor structure 13 is at least partially located between one strip-shaped doped region 14 included in one of the first doped region and the second doped region and an adjacent connection region 15 included in the other doped region, the conductive semiconductor structure 13 located between the strip-shaped doped region 14 and the connection region 15 that have opposite conduction types and are adjacent to each other can be separately in electrical contact with the strip-shaped doped region 14 and the connection region 15 that have opposite conduction types and are adjacent to each other along an arrangement direction of the first doped region and the second doped region, to ensure that the first doped region and the second doped region can be electrically connected through the conductive semiconductor structure 13. Meanwhile, an orthographic projection area of the conductive semiconductor structure 13 on the back surface may be accurately regulated, to ensure that a risk of hot spots corresponding to the back contact solar cell and operating efficiency under normal operation can both accurately satisfy an operating requirement. Also, as shown in FIG. 10, the value of D may be further greater than D1 and less than or equal to W1+W2+D1. In this case, the conductive semiconductor structure 13 not only may be located between the strip-shaped doped region 14 and the adjacent connection region 15 having opposite conduction types, but also may be disposed on at least one of the strip-shaped doped region 14 and the adjacent connection region 15 having opposite conduction types, so as to prevent a strict requirement on the etching precision to obtain only the conductive semiconductor structure 13 located only between the strip-shaped doped region 14 and the adjacent connection region 15 having opposite conduction types, thereby reducing the etching difficulty. In addition, in a case that the conductive semiconductor structure 13 is electrically disposed on a part, in electrical contact with the conductive semiconductor structure, of the first doped region and/or the second doped region, the size of the effective electrical contact area may be adjusted by adjusting the value of D, so as to balance the reverse breakdown voltage and the leakage loss of the back contact solar cell, thereby facilitating good operating performance of the back contact solar cell.

Preferably, $$D \leq D1 + \frac{1}{2}W1 + \frac{1}{10}W2.$$

In this case, carriers collected by the first doped region and the second doped region need to be exported through electrode structures in ohmic contact with the first doped region and the second doped region. Based on this, along the extension direction of the strip-shaped doped regions, a part of the strip-shaped doped regions included in the first doped region and the second doped region and along an extension direction of the strip-shaped doped regions need to be directly in ohmic contact with the electrode structure, and the ohmic contact region occupies a particular length. In this case, when $$D \leq D1 + \frac{1}{2}W1 + \frac{1}{10}W2,$$

it can be prevented that the etching precision is strictly required to form the conductive semiconductor structure having a small disposition width due to a small corresponding disposition width of the conductive semiconductor structure above a part, facing away from the semiconductor substrate, of the first doped region and/or the second doped region, thereby reducing the etching difficulty. Meanwhile, it can be further prevented that an effective electrical contact area corresponding to the conductive semiconductor structure is also small due to a small disposition width of the conductive semiconductor structure, resulting in a poor effect of reducing a risk of hot spots in the back contact solar cell by disposing the conductive semiconductor structure in a case that a disposition manner corresponding to the conductive semiconductor structure is electrical disposition. In addition, it can be further prevented that the electrode structure cannot be in ohmic contact with the strip-shaped doped regions included in the first doped region and the second doped region due to a large disposition width of the conductive semiconductor structure, to ensure that current collected by the first doped region and the second doped region can be exported through the electrode structure, thereby facilitating formation of a photocurrent.

The values of D and W corresponding to the conductive semiconductor structure may be determined according to the version of the back contact solar cell in an actual application scenario and the foregoing size relationship. This is not specifically limited herein.

Specifically, exemplarily, in a case that the second conductive semiconductor portion is disposed above a part, facing away from the semiconductor substrate, of the corresponding strip-shaped doped region along the width direction of the strip-shaped doped region, the disposition width of the second conductive semiconductor portion along the width direction of the strip-shaped doped region may be greater than or equal to one tenth of the width of the corresponding strip-shaped doped region, and less than a half of the width of the corresponding strip-shaped doped region. In this case, carriers collected by the first doped region need to be exported from the first doped region through an electrode structure in ohmic contact with the first doped region. Based on this, along the width direction of the strip-shaped doped regions, a part of the strip-shaped doped regions included in the first doped region and along an extension direction of the strip-shaped doped regions need to be directly in ohmic contact with the electrode structure, and the ohmic contact region occupies a particular width. In this case, when the disposition width of the second conductive semiconductor portion is greater than or equal to one tenth of the width of the corresponding strip-shaped doped region, and less than a half of the width of the corresponding strip-shaped doped region, it can be prevented that the etching precision is strictly required to form the second conductive semiconductor portion having a small disposition width due to a small disposition width X1 corresponding to the second conductive semiconductor portion, thereby reducing the etching difficulty. Meanwhile, it can be further prevented that an effective electrical contact area corresponding to the conductive semiconductor structure is also small due to a small disposition width X1, resulting in a poor effect of reducing a risk of hot spots in the back contact solar cell by disposing the conductive semiconductor structure in a case that the disposition manner corresponding to the second conductive semiconductor portion is electrical disposition. In addition, it can be prevented that the electrode structure cannot be in ohmic contact with the strip-shaped doped regions included in the first doped region due to a large disposition width X1 of the second conductive semiconductor portion, to ensure that current collected by the first doped region can be exported through the electrode structure, thereby facilitating formation of a photocurrent.

Also, in a case that the first doped region and the second doped region are interdigitated alternately, as shown in FIG. 7 to FIG. 9, when the value of D of the conductive semiconductor structure 13 is greater than D1, alternatively, as shown in FIG. 10, when the value of W is greater than D2+2D1 or the value of W is greater than D3+2D1, the conductive semiconductor structure 13 is further disposed above a part, facing away from the semiconductor substrate, of the first doped region and/or the second doped region. In this case, the size of the effective electrical contact area corresponding to the conductive semiconductor structure 13 may be affected. Therefore, a disposition size, a ratio and a specific size between the width W and the side effective electrical contact height Z of the conductive semiconductor structure 13 may be determined according to a position at which the conductive semiconductor structure 13 is disposed and a requirement on the size of the effective electrical contact area in an actual application scenario. This is not specifically limited herein.

Exemplarily, in a case that the second conductive semiconductor portion is disposed on the corresponding strip-shaped doped region along the width direction of the strip-shaped doped region, as shown in FIG. 7 to FIG. 9, when the second conductive semiconductor portion 18 is disposed on the strip-shaped doped region 14 included in the first doped region, $0.1D2 \leq X1 < 0.5D2$. Additionally or alternatively, when the second conductive semiconductor portion 18 is disposed above the strip-shaped doped regions 14 included in the second doped region, $0.1D3 \leq X1 < 0.5D3$. For example, when the second conductive semiconductor portion 18 is disposed on the strip-shaped doped region 14 included in the first doped region, X1 may be equal to 0.1D2, 0.2D2, 0.25D2, 0.3D2, 0.35D2, or 0.4D2. For example, when the second conductive semiconductor portion 18 is disposed on the strip-shaped doped region 14 included in the second doped region, X1 may be equal to 0.1D3, 0.2D3, 0.25D3, 0.3D3, 0.35D3, or 0.4D3. In this case, descriptions are provided by using an example in which the conductive semiconductor structure 13 is disposed on the strip-shaped doped regions 14 included in the first doped region along the width direction of the strip-shaped doped regions 14: Carriers collected by the first doped region need to be exported from the first doped region through an electrode structure in ohmic contact with the first doped region. Based on this, along the width direction of the strip-shaped doped regions 14, a part of the strip-shaped doped regions 14 included in the first doped region and along an extension direction of the strip-shaped doped regions need to be directly in ohmic contact with the electrode structure, and the ohmic contact region occupies a particular width. In this case, when 0.1D2≤X1<0.5D2, it can be prevented that the etching precision is strictly required to form the second conductive semiconductor portion 18 having a small disposition width due to a small disposition width X1 of the second conductive semiconductor portion 18, thereby reducing the etching difficulty. Meanwhile, it can be further prevented that an effective electrical contact area corresponding to the conductive semiconductor structure is also small due to a small disposition width X1, resulting in a poor effect of reducing a risk of hot spots in the back contact solar cell by disposing the conductive semiconductor structure in a case that the disposition manner corresponding to the second conductive semiconductor portion 18 is electrical disposition. In addition, it can be prevented that the electrode structure cannot be in ohmic contact with the strip-shaped doped regions 14 included in the first doped region due to a large disposition width X1 of the second conductive semiconductor portion 18, to ensure that current collected by the first doped region can be exported through the electrode structure, thereby facilitating formation of a photocurrent. In addition, beneficial effects when 0.1D3≤X1<0.5D3 are similar to beneficial effects when 0.1D2≤X1<0.5D2. Details are not described herein again.

Exemplarily, in a case that the disposition manner corresponding to the second conductive semiconductor portion is electrical disposition, X1≤W≤40X1. Additionally or alternatively, a side effective electrical contact height between the first doped region and the second doped region electrically coupled to each other through the conductive semiconductor structure is Z, and X1/1500≤Z≤X1/400. For example, in a case that a disposition manner corresponding to the second conductive semiconductor portion is electrical disposition, W may be equal to X1, 5X1, 10X1, 15X1, 20X1, 30X1, or 40X1. For example, when the disposition manner corresponding to the second conductive semiconductor portion is electrical disposition, Z may be equal to X1/1500, X1/1000, X1/800, X1/600, or X1/400. In this case, when the disposition manner corresponding to the second conductive semiconductor portion is electrical disposition, effective electrical contact areas between the conductive semiconductor structure and the first doped region and the second doped region not only include a contact area between a side wall of the conductive semiconductor structure and the first doped region or the second doped region, but also include a contact area between the second conductive semiconductor portion and the corresponding strip-shaped doped regions. Based on this, a value of at least one of X1, W, and Z may be adjusted to adjust a size of the effective electrical contact area, thereby affecting sizes of the reverse breakdown voltage corresponding to the back contact solar cell and the leakage current in a normal operating state. In this case, when X1≤W≤40X1, the width W of the conductive semiconductor structure has a large alternative range. The reverse breakdown voltage corresponding to the back contact solar cell and the leakage current in the normal operating state can be adjusted by adjusting the width W of the conductive semiconductor structure, thereby facilitating improving applicability of the back contact solar cell provided in this embodiment of the present application to different application scenarios. In addition, W is within the foregoing range, which can prevent a high requirement on manufacturing precision for manufacturing the conductive semiconductor structure due to a small W, thereby facilitating reducing the manufacturing difficulty of the back contact solar cell. It can be further prevented that large values of X1 and/or Z are set to reduce the reverse breakdown voltage corresponding to the back contact solar cell to within an operating requirement due to a small W, thereby affecting forming quality of the electrode structure and the like, and improving the yield of the back contact solar cell. Meanwhile, a large leakage current corresponding to a single conductive semiconductor structure due to a large W can be further prevented, thereby ensuring that the back contact solar cell has high operating performance in normal operation. In addition, beneficial effects when X1/1500≤Z≤X1/400 are similar to beneficial effects when X1≤W≤40X1. Details are not described herein again.

Exemplarily, in a case that the disposition manner corresponding to the second conductive semiconductor portion is electrical disposition, 0.03 mm≤X1≤0.2 mm. Additionally or alternatively, 0.03 mm≤W≤8 mm. For example, in a case that the disposition manner corresponding to the second conductive semiconductor portion is electrical disposition, X1 may be equal to 0.03 mm, 0.08 mm, 0.1 mm, 0.15 mm, 0.18 mm, or 0.2 mm. For example, in a case that the disposition manner corresponding to the second conductive semiconductor portion is electrical disposition, W may be equal to 0.03 mm, 0.5 mm, 1 mm, 2 mm, 3 mm, 4 mm, 5 mm, 6 mm, 7 mm, or 8 mm. In this case, X1 is within the foregoing range, which can prevent a high requirement on manufacturing precision due to a small X1, thereby reducing the difficulty of manufacturing the back contact solar cell. It can be further prevented that the effective electrical contact area corresponding to the conductive semiconductor structure is also small due to a small X1, resulting in a poor effect of reducing a risk of hot spots on the back contact solar cell by disposing the conductive semiconductor structure. In addition, it can be prevented that a width of a part that is reserved for the strip-shaped doped region along the width direction thereof and is in ohmic contact with the electrode structure is small due to a large X1, resulting in high manufacturing difficulty of the electrode structure and/or high contact resistance between the electrode structure and the strip-shaped doped region, thereby facilitating improvement of the yield of the back contact solar cell and the contact performance between the electrode structure and the strip-shaped doped region. In addition, for beneficial effects of W within the foregoing range, refer to the foregoing descriptions. Details are not described herein again.

Exemplarily, in a case that a disposition manner corresponding to the second conductive semiconductor portion is insulation disposition, W/160000≤Z≤W/25. For example, in this case, the side effective electrical contact height Z may be equal to W/160000, W/15000, W/12000, W/10000, or W/25. In this case, regardless of whether the conductive semiconductor structure is disposed on at least one of the first doped region and the second doped region, effective electrical contact areas between the conductive semiconductor structure and the first doped region and the second doped region respectively are only effective electrical contact areas between the side surfaces of the first doped region and the second doped region and the conductive semiconductor structure respectively, i.e., a product of W and Z. In the foregoing case, values of W and Z may be adjusted, to adjust the reverse breakdown voltage of the back contact solar cell and the leakage current under normal operation, which is beneficial to improving applicability of the back contact solar cell provided in this embodiment of the present application to different application scenarios. In other words, W and Z satisfy the foregoing size relationship range, so as to prevent a large leakage current in the normal operating state of the back contact solar cell caused by a large effective electrical contact area due to an improper disposition of a ratio relationship between W and Z, thereby ensuring high operating performance of the back contact solar cell. It can be further prevented that the reverse breakdown voltage of the back contact solar cell is less reduced due to a small effective electrical contact area caused by improper disposition of a proportional relationship between W and Z, thereby ensuring that the back contact solar cell has a low risk of hot spots.

Exemplarily, the side effective electrical contact height Z may satisfy: 0.00005 mm≤Z≤0.002 mm. For example, the side effective electrical contact height Z may be 0.00005 mm, 0.0001 mm, 0.0002 mm, 0.0003 mm, 0.0004 mm, 0.0005 mm, 0.001 mm, or 0.002 mm. In this case, in an actual application process, in consideration of aspects such as a carrier shunting capability and a consumption usage, the first doped region and the second doped region included in the back contact solar cell usually have a reasonable thickness (or depth) range. Moreover, the size of the side effective electrical contact height Z affects the effective electrical contact areas between the conductive semiconductor structure and the first doped region and the second doped region, and further affects a magnitude of a leakage current that is locally turned on by the first doped region and the second doped region through a single conductive semiconductor structure. In this case, the side effective electrical contact height Z is within the foregoing range, so as to prevent a poor balancing effect between a risk of hot spots of the back contact solar cell and operating efficiency under normal operation due to an excessively large or excessively small effective electrical contact area corresponding to the conductive semiconductor structure. In addition, a large amount of materials used for manufacturing the conductive semiconductor structure caused by a large side effective electrical contact height Z can be further prevented, which is beneficial to controlling the manufacturing cost of the back contact solar cell.

Exemplarily, in a case that the second conductive semiconductor portion is disposed on the corresponding strip-shaped doped region along the extension direction of the strip-shaped doped region, as shown in FIG. 10, when the second conductive semiconductor portion 18 is disposed on the strip-shaped doped region 14 included in the first doped region, 0.1D2≤X2≤1.2D2. Additionally or alternatively, when the second conductive semiconductor portion 18 is disposed above the strip-shaped doped regions 14 included in the second doped region, 0.1D3≤X2≤1.2D3. For example, when the second conductive semiconductor portion 18 is disposed on the strip-shaped doped region 14 included in the first doped region, X2 may be equal to 0.1D2, 0.3D2, 0.6D2, 0.9D2, D2, or 1.2D2. For example, when the second conductive semiconductor portion 18 is disposed on the strip-shaped doped region 14 included in the second doped region, X2 may be equal to 0.1D3, 0.3D3, 0.6D3, 0.9D3, D3, or 1.2D3. In this case, descriptions are provided by using an example in which the conductive semiconductor structure 13 is disposed on the strip-shaped doped regions 14 included in the first doped region along the extension direction of the strip-shaped doped regions 14: As described above, carriers collected by the first doped region need to be exported from the first doped region through an electrode structure in ohmic contact with the first doped region. Moreover, an extension length of the electrode structure on the strip-shaped doped region 14 included in the first doped region affects the contact resistance with the first doped region, and carriers collected by each part of the strip-shaped doped region 14 included in the first doped region can be exported from the electrode structure in time. Based on this, when 0.1D2≤X2≤1.2D2, it can be prevented that the etching precision is strictly required to form the conductive semiconductor structure 13 having a small disposition width due to a small disposition width X2 of the second conductive semiconductor portion 18, thereby facilitating reducing the manufacturing difficulty of the back contact solar cell. Meanwhile, it can be further prevented that an effective electrical contact area corresponding to the conductive semiconductor structure is also small due to a small disposition width X2, resulting in a poor effect of reducing a risk of hot spots in the back contact solar cell by disposing the conductive semiconductor structure in a case that the disposition manner corresponding to the second conductive semiconductor portion 18 is electrical disposition. In addition, it can be further prevented that carriers collected by an edge part of the strip-shaped doped region 14 along the length direction cannot be exported in time due to a large spacing between an end of the electrode structure along the extension direction of the strip-shaped doped region 14 and the strip-shaped doped region 14 caused by a large disposition width X2 of the second conductive semiconductor portion 18, thereby ensuring good operating performance of the back contact solar cell. For beneficial effects when 0.1D3≤X2≤1.2D3, refer to the analysis of the beneficial effects when 0.1D2≤X2≤1.2D2. Details are not described herein again.

Exemplarily, as shown in FIG. 10, along the extension direction of the strip-shaped doped region 14, the disposition width X3 of the second conductive semiconductor portion 18 may satisfy: 0.1W1≤X3≤0.3W1. For example, X3 may be equal to 0.1W1, 0.12W1, 0.14W1, 0.16 W1, 0.18W1, 0.2W1, 0.24W1, 0.28W1, or 0.3W1. In this case, in an actual application process, the electrode structure may alternatively be formed above the connection region 15, and may even be in ohmic contact with the connection region 15. Based on this, the part of the electrode structure located above the connection region 15 needs to occupy a particular width of the connection region 15. In this case, when 0.1W1≤X3≤0.3W1, it can be prevented that the etching precision is strictly required to form the conductive semiconductor structure 13 having a small disposition width due to a small disposition width X3 of the second conductive semiconductor portion 18, thereby reducing the etching difficulty. Meanwhile, it can be further prevented that an effective electrical contact area corresponding to the conductive semiconductor structure is also small due to a small disposition width X3, resulting in a poor effect of reducing a risk of hot spots in the back contact solar cell by disposing the conductive semiconductor structure in a case that the disposition manner corresponding to the second conductive semiconductor portion 18 is electrical disposition. In addition, it can be further prevented that the electrode structure cannot be formed in a small-width region of the connection region 15 exposed outside the second conductive semiconductor portion 18 due to a large X3, thereby facilitating reducing the manufacturing difficulty of the electrode structure. It can be further prevented that the transmission resistance corresponding to the electrode structure is large due to a small width of the electrode structure formed in the connection region 15, thereby ensuring good transmission performance of the electrode structure.

With regard to the thickness H of the conductive semiconductor structure, as described above, the value of H may affect the size of the side effective electrical contact height Z. Therefore, effective electrical contact areas between the conductive semiconductor structure and the first doped region and the second doped region respectively may be determined according to a specific forming process of the conductive semiconductor structure and an actual application scenario. This is not specifically limited herein. It may be understood that as shown in FIG. 6, when the conductive semiconductor structure 13 is integrally continuous with the second doped region 12, the thickness of the conductive semiconductor structure 13 is equal to the thickness of the second doped region 12. As shown in FIG. 5, when the conductive semiconductor structure 13 is integrally continuous with the first doped region 11, the thickness of the conductive semiconductor structure 13 is equal to the thickness of the first doped region 11.

Figure 50:
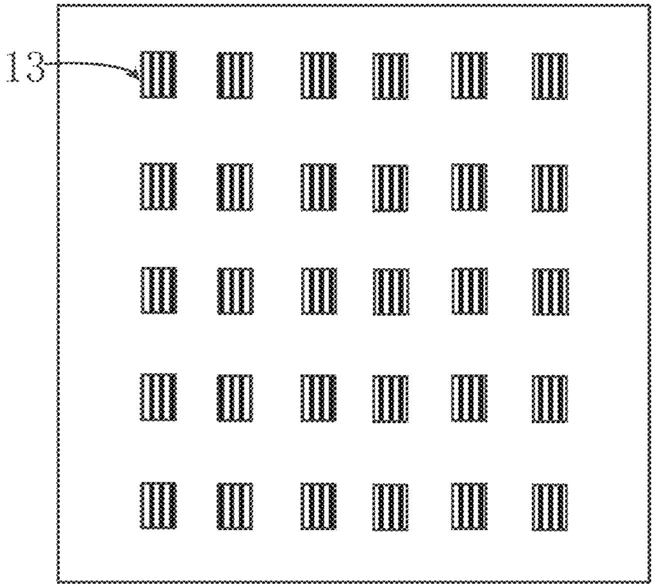
FIG. 50 is a first schematic distribution diagram of a conductive semiconductor structure on a back surface in a back contact solar cell according to an embodiment of the present application.
Figure 51:
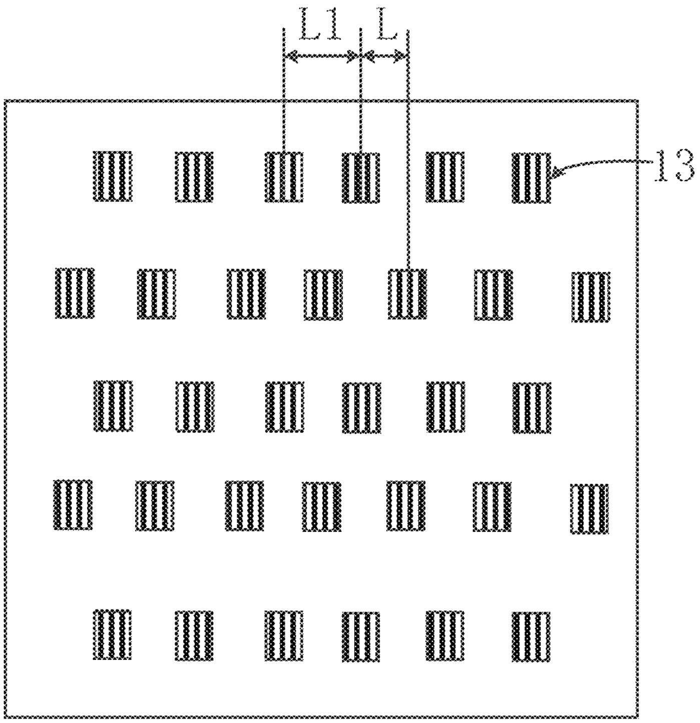
FIG. 51 is a second schematic distribution diagram of a conductive semiconductor structure on a back surface in a back contact solar cell according to an embodiment of the present application.
Figure 52:
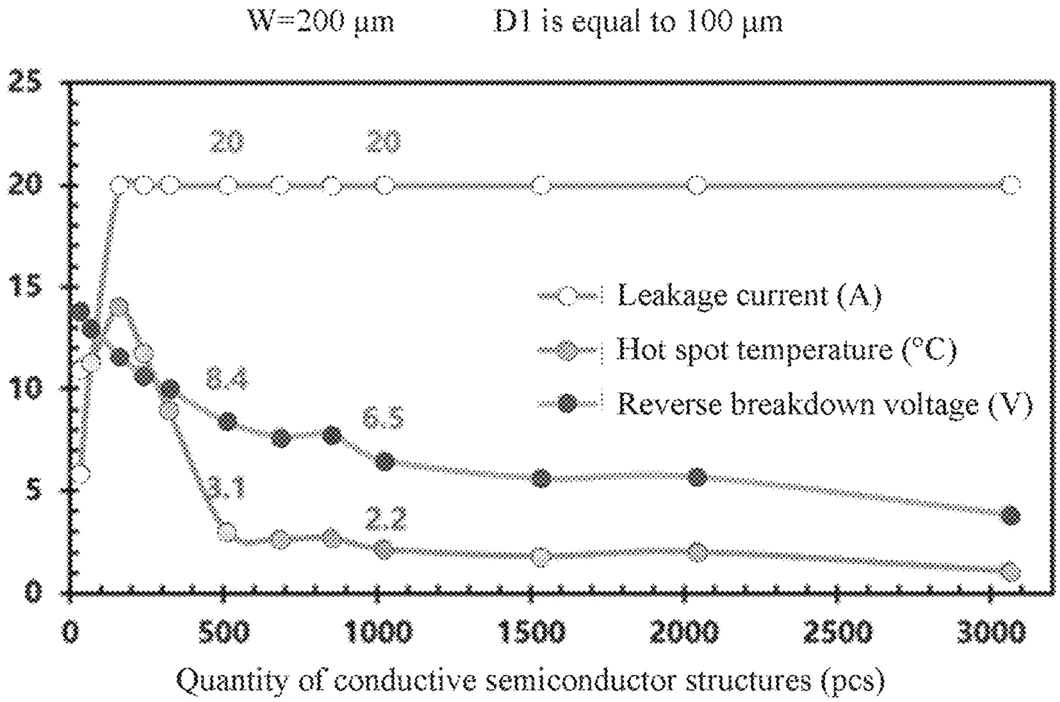
FIG. 52 is a diagram of a relationship between a quantity of conductive semiconductor structures and a leakage current, a hot spot temperature, and a reverse breakdown voltage, respectively, when W is equal to 200 μm and D1 is equal to 100 μm in a back contact solar cell according to an embodiment of the present application.
Figure 53:
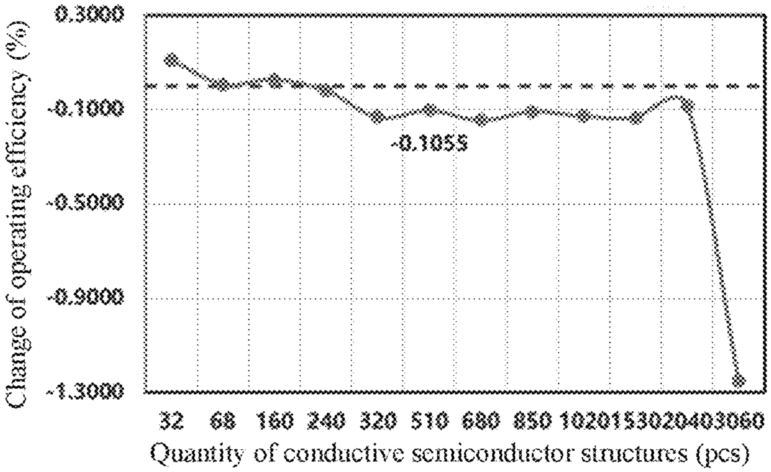
FIG. 53 is a diagram of a relationship between a quantity of conductive semiconductor structures and a change in operating efficiency in a back contact solar cell, when W is equal to 200 μm and D1 is equal to 100 μm according to an embodiment of the present application.
Figure 54:
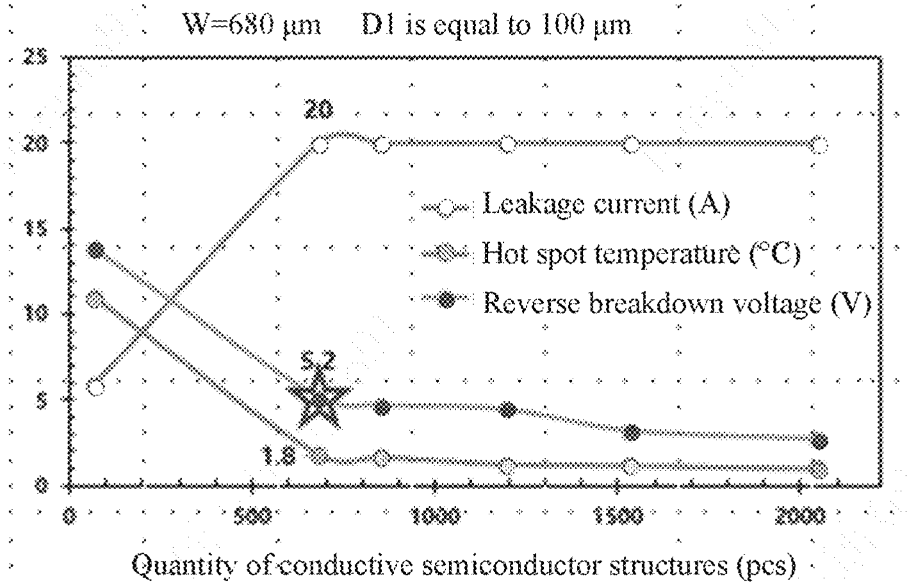
FIG. 54 is a diagram of a relationship between a quantity of conductive semiconductor structures and a leakage current, a hot spot temperature, and a reverse breakdown voltage, respectively, when W is equal to 680 μm and D1 is equal to 100 μm.
Figure 55:
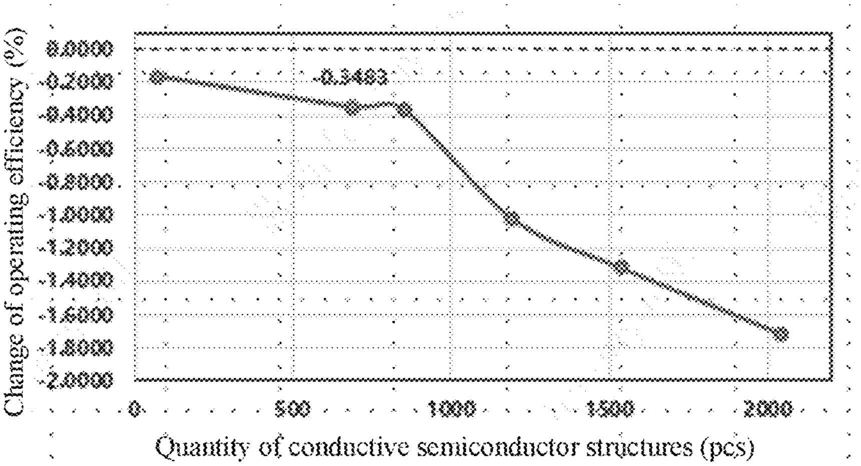
FIG. 55 is a diagram of a relationship between a quantity of conductive semiconductor structures and a change in operating efficiency, when W is equal to 680 μm and D1 is equal to 100 μm.

In terms of quantity, the back contact solar cell provided in this embodiment of the present application may include only one conductive semiconductor structure. Alternatively, as shown in FIG. 50 and FIG. 51, the back contact solar cell may include a plurality of conductive semiconductor structures 13. Moreover, the adjacent conductive semiconductor structures 13 are spaced apart. In this case, a large local leakage current between the first doped region and the second doped region due to contact between different adjacent conductive semiconductor structures 13 can be prevented.

In a case that the back contact solar cell includes a plurality of conductive semiconductor structures, orthographic projection areas of different conductive semiconductor structures on the back surface may be equal, or may be unequal. As shown in FIG. 50 and FIG. 51, when the orthographic projection areas of different conductive semiconductor structures 13 on the back surface are equal, the magnitudes of leakage currents corresponding to the different conductive semiconductor structures 13 after being electrically connected to each other in the first doped region and the second doped region may be the same. Therefore, reverse breakdown voltages of built-in diodes disposed in different regions between the first doped region and the second doped region may be equal, so as to prevent a problem that the solar cell may be burned out due to local heat concentration when the back contact solar cell is blocked, and to further reduce a risk of hot spots of the photovoltaic module including the back contact solar cell provided in this embodiment of the present application.

In addition, it may be understood that, in a case that the width W of the conductive semiconductor structure satisfies $0.5D1 \leq W \leq 6D1$, the quantity of the conductive semiconductor structures included in the back contact solar cell affects the sum of the orthographic projection areas of all the conductive semiconductor structures on the back surface, and further affects the operating efficiency of the photovoltaic module including the back contact solar cell in a normal voltage region and affects the magnitude of the reverse breakdown voltage of the back contact solar cell. Therefore, the quantity of the conductive semiconductor structures included in the back contact solar cell and the area ratio, on the back surface, of the sum of the orthographic projection areas of all the conductive semiconductor structures on the back surface may be determined according to requirements on the foregoing two cases in an actual application scenario.

Exemplarily, a sum of orthographic projection areas, on the back surface, of parts of all the conductive semiconductor structures located between the first doped region and the second doped region is S3, an area of the back surface is S2, and a ratio of S3 to S2 may be greater than or equal to 0.002% and less than or equal to 20%. For example, the ratio of S3 to S2 may be 0.002%, 0.01%, 0.1%, 1%, 5%, 10%, 15%, or 20%. In this case, the ratio of S3 to S2 is within the foregoing range, thereby preventing a small orthographic projection area of a single conductive semiconductor structure on the back surface and/or a small quantity of conductive semiconductor structures disposed on the back surface due to a small ratio of S3 to S2, and ensuring that the back contact solar cell reduces the reverse breakdown voltage of the back contact solar cell to a range meeting an operating requirement due to disposition of a suitable quantity of conductive semiconductor structures and a suitable orthographic projection area. In addition, a low operating efficiency of the photovoltaic module including the back contact solar cell in the forward voltage region caused by a large orthographic projection area of a single conductive semiconductor structure on the back surface and/or a large quantity of conductive semiconductor structures disposed on the back surface due to a large ratio of S3 to S2 can be further prevented.

With regard to the quantity of the conductive semiconductor structures disposed on the back surface, it may be understood that, as shown in FIG. 52 to FIG. 55, in a case that the size of each conductive semiconductor structure 13 is fixed, a larger quantity of the conductive semiconductor structures 13 formed on the back surface indicates a larger sum of orthographic projection areas of the conductive semiconductor structures 13 on the back surface. Also, within a particular range, a larger quantity of the conductive semiconductor structures 13 indicates a larger reverse breakdown voltage corresponding to the back contact solar cell. However, beyond a corresponding range, even if more conductive semiconductor structures 13 are disposed on the back surface, a variation amplitude of the reverse breakdown voltage corresponding to the back contact solar cell is small and even zero. However, after the quantity of the conductive semiconductor structures 13 increases to a large range, the operating efficiency of the back contact solar cell may be reduced as the leakage current increases. Based on this, the quantity of the conductive semiconductor structures may be determined according to division of the back contact solar cell, the size of the conductive semiconductor structure 13, and requirements on the reverse breakdown voltage and operating efficiency of the back contact solar cell in an actual application scenario.

Exemplarily, in a case that the back contact solar cell is an entire back contact solar cell, a quantity of the conductive semiconductor structures included in the back contact solar cell may be greater than or equal to 30 and less than or equal to 8000. For example, in a case that the back contact solar cell is an entire back contact solar cell, the quantity of the conductive semiconductor structures included in the back contact solar cell may be 30, 300, 400, 450, 500, 800, 1000, 1500, 2000, 2500, 3000, or 8000. In a case that the foregoing technical solution is adopted, when the back contact solar cell is an entire back contact solar cell, the quantity of the conductive semiconductor structures included in the back contact solar cell is set to be greater than or equal to 30 and less than or equal to 8000, so that a small reduction amplitude of the reverse breakdown voltage corresponding to the back contact solar cell caused by a small quantity of the conductive semiconductor structures can be prevented, thereby ensuring that a risk of hot spots of the back contact solar cell can be reduced to be within an operating requirement. In addition, a low operating efficiency of the photovoltaic module including the back contact solar cell provided in this embodiment of the present application caused by disposition of a large quantity of conductive semiconductor structures can be further prevented.

Exemplarily, in a case that the back contact solar cell is a 1/N back contact solar cell, a quantity of the conductive semiconductor structures included in the back contact solar cell may be greater than or equal to 30/N and less than or equal to 8000/N. N is a positive integer greater than or equal to 2. For example, in a case that the back contact solar cell is a ½ sliced back contact solar cell, the quantity of the conductive semiconductor structures included in the back contact solar cell may be 15, 120, 150, 175, 200, 300, 500, 800, 1000, 1200, 1500, or 1650. For beneficial effects in this case, refer to the analysis of the foregoing beneficial effects when the quantity of the conductive semiconductor structures included in the back contact solar cell is greater than or equal to 30 and is less than or equal to 8000 in a case that the back contact solar cell is an entire back contact solar cell. Details are not described herein again.

Specifically, in an actual application process, the quantity of the conductive semiconductor structures included in the back contact solar cell may be further determined according to a ratio between the widths W and D1 of the conductive semiconductor structures.

Exemplarily, in a case that a ratio of W to D1 is greater than or equal to 0.5 and is less than or equal to 2, if the back contact solar cell is an entire back contact solar cell, a quantity of the conductive semiconductor structures included in the back contact solar cell may be greater than or equal to 30 and less than or equal to 2000. If the back contact solar cell is a 1/N back contact solar cell, a quantity of the conductive semiconductor structures included in the back contact solar cell may be greater than or equal to 30/N and less than or equal to 2000/N.

Exemplarily, in a case that a ratio of W to D1 is greater than 2 and is less than or equal to 3, if the back contact solar cell is an entire back contact solar cell, a quantity of the conductive semiconductor structures included in the back contact solar cell may be greater than or equal to 350 and less than or equal to 1530. If the back contact solar cell is a 1/N back contact solar cell, a quantity of the conductive semiconductor structures included in the back contact solar cell may be greater than or equal to 350/N and less than or equal to 1530/N.

In addition, as described above, when the conductive semiconductor structure is further disposed on a part, in electrical contact with the conductive semiconductor structure, of the first doped region and the second doped region, different disposition manners of the conductive semiconductor structure may change the size of the effective electrical contact area corresponding to the conductive semiconductor structure, thereby affecting the reverse breakdown voltage of the back contact solar cell and the magnitude of the leakage current under normal operation. Based on this, the quantity of the conductive semiconductor structures disposed on the back surface in different disposition manners may be determined according to requirements on the reverse breakdown voltage of the back contact solar cell and the magnitude of the leakage current under normal operation in an actual application scenario. This is not specifically limited herein.

Exemplarily, in a case that the conductive semiconductor structure is electrically disposed on a part, in electrical contact with the conductive semiconductor structure, of the first doped region and/or the second doped region, when the back contact solar cell is an entire back contact solar cell, a quantity of the conductive semiconductor structures disposed on the back surface may be greater than or equal to 30 and less than or equal to 4000. When the back contact solar cell is a 1/N sliced back contact solar cell, a quantity of the conductive semiconductor structures disposed on the back surface may be greater than or equal to 30/N and less than or equal to 4000/N. N is a positive integer greater than or equal to 2. For example, in a case that the conductive semiconductor structure is electrically disposed on a part, in electrical contact with the conductive semiconductor structure, of the first doped region and/or the second doped region, when the back contact solar cell is an entire back contact solar cell, the quantity of the conductive semiconductor structures disposed on the back surface may be 30, 100, 500, 1000, 1500, 2000, 2500, 3000, 3500, or 4000. For example, in a case that the conductive semiconductor structure is electrically disposed on a part, in electrical contact with the conductive semiconductor structure, of the first doped region and/or the second doped region, when the back contact solar cell is a ½ sliced back contact solar cell, the quantity of the conductive semiconductor structures disposed on the back surface may be 15, 100, 300, 500, 1000, 1500, or 2000. In this case, when other factors are the same, compared with the insulation disposition of the conductive semiconductor structure on a part, in electrical contact with the conductive semiconductor structure, of the first doped region and/or the second doped region, the electrical disposition of the conductive semiconductor structure on the part, in electrical contact with the conductive semiconductor structure, of the first doped region and/or the second doped region implements a large effective electrical contact area corresponding to the conductive semiconductor structure. Based on this, in a case that the conductive semiconductor structure is electrically disposed on a part, in electrical contact with the conductive semiconductor structure, of the first doped region and/or the second doped region, the quantity of the conductive semiconductor structures disposed on the back surface is within the foregoing range, so that a small reduction amplitude of the reverse breakdown voltage corresponding to the back contact solar cell caused by a small quantity of the conductive semiconductor structures can be prevented, thereby ensuring that a risk of hot spots of the back contact solar cell can be reduced to be within an operating requirement. In addition, a low operating efficiency of the photovoltaic module including the back contact solar cell provided in this embodiment of the present application caused by disposition of a large quantity of conductive semiconductor structures can be further prevented.

Exemplarily, in a case that the conductive semiconductor structure is disposed by insulation on a part, in electrical contact with the conductive semiconductor structure, of the first doped region and/or the second doped region, when the back contact solar cell is an entire back contact solar cell, a quantity of the conductive semiconductor structures disposed on the back surface may be greater than or equal to 5000 and less than or equal to 8000. When the back contact solar cell is a 1/N sliced back contact solar cell, a quantity of the conductive semiconductor structures disposed on the back surface may be greater than or equal to 5000/N and less than or equal to 8000/N. N is a positive integer greater than or equal to 2. For example, in a case that the conductive semiconductor structure is disposed by insulation on a part, in electrical contact with the conductive semiconductor structure, of the first doped region and/or the second doped region, when the back contact solar cell is an entire back contact solar cell, the quantity of the conductive semiconductor structures disposed on the back surface may be 5000, 5500, 6000, 6500, 7000, 7500, or 8000. For example, in a case that the conductive semiconductor structure is disposed by insulation on a part, in electrical contact with the conductive semiconductor structure, of the first doped region and/or the second doped region, when the back contact solar cell is a ½ sliced back contact solar cell, the quantity of the conductive semiconductor structures disposed on the back surface may be 2500, 2800, 3000, 3200, 3500, 3800, or 4000. In this case, when other factors are the same, compared with the electrical disposition of the conductive semiconductor structure on a part, in electrical contact with the conductive semiconductor structure, of the first doped region and/or the second doped region, the insulation disposition of the conductive semiconductor structure on the part, in electrical contact with the conductive semiconductor structure, of the first doped region and/or the second doped region implements a small effective electrical contact area corresponding to the conductive semiconductor structure. Based on this, in a case that the conductive semiconductor structure is disposed by insulation on a part, in electrical contact with the conductive semiconductor structure, of the first doped region and/or the second doped region, a large quantity of conductive semiconductor structures may be properly disposed on the back surface, so that the reverse breakdown voltage of the back contact solar cell can be reduced to a target range. Based on this, the quantity of the conductive semiconductor structures disposed on the back surface is within the foregoing range, so that a small reduction amplitude of the reverse breakdown voltage corresponding to the back contact solar cell caused by a small quantity of the conductive semiconductor structures can be prevented, thereby ensuring that a risk of hot spots of the back contact solar cell can be reduced to be within an operating requirement. In addition, a low operating efficiency of the photovoltaic module including the back contact solar cell provided in this embodiment of the present application caused by disposition of a large quantity of conductive semiconductor structures can be further prevented.

Four specific embodiments and a comparative example of the back contact solar cell provided in this embodiment of the present application are described below with reference to FIG. 56 and Table 1. As shown in FIG. 11, in the back contact solar cell corresponding to Embodiment 1, the second conductive semiconductor portion 18 is disposed on both sides of each strip-shaped doped region 14 along the width direction. A quantity of the disposed second conductive semiconductor portions 18 is 6732, and a sum of effective electrical contact areas corresponding to all the conductive semiconductor structures 13 on the back surface is 242.4 mm2.

In the back contact solar cell corresponding to Embodiment 2, conductive semiconductor structures are disposed on both sides of an electrical connection point (the electrical connection point refers to a point at which an electrode structure is connected to a series interconnection member such as a soldering strip) along the extension direction of the strip-shaped doped region, the quantity of the disposed second conductive semiconductor portions is 672, and the sum of the effective electrical contact areas corresponding to all the conductive semiconductor structures on the back surface is 31.2 mm2.

Embodiment 3 is based on Embodiment 1. Along the width direction of the strip-shaped doped region, every seven strip-shaped doped regions are used as a next strip-shaped doped region, and second conductive semiconductor portions are disposed on both two sides along the width direction. Moreover, the quantity of the disposed second conductive semiconductor portions is 884, and the sum of the effective electrical contact areas corresponding to all the conductive semiconductor structures on the back surface is 31.8 mm2.

Embodiment 4 is based on Embodiment 3. The disposition area corresponding to the second conductive semiconductor portion is reduced. In this case, the quantity of the disposed second conductive semiconductor portions is still 884. However, the sum of the effective electrical contact areas corresponding to all the conductive semiconductor structures on the back surface is 7.96 mm2.

The comparative example is as shown in FIG. 1. The first doped region and the second doped region are completely isolated.

TABLE 1

Comparison of parameters of back contact solar cells corresponding to Embodiments 1 and 4

| Solution | Reverse saturation current A | Maximum reverse voltage V | Maximum hot spot temperature ° C. | Efficiency gain % |
|---|---|---|---|---|
| Comparative Example | 0.36 | 14.80 | 4.18 | / |
| Embodiment 1 | 19.91 | 4.01 | 1.24 | −0.152 |
| Embodiment 2 | 20.00 | 9.70 | 4.28 | −0.114 |
| Embodiment 3 | 20.00 | 7.14 | 1.89 | −0.166 |
| Embodiment 4 | 20.00 | 9.13 | 0.85 | −0.102 |

Figure 56:
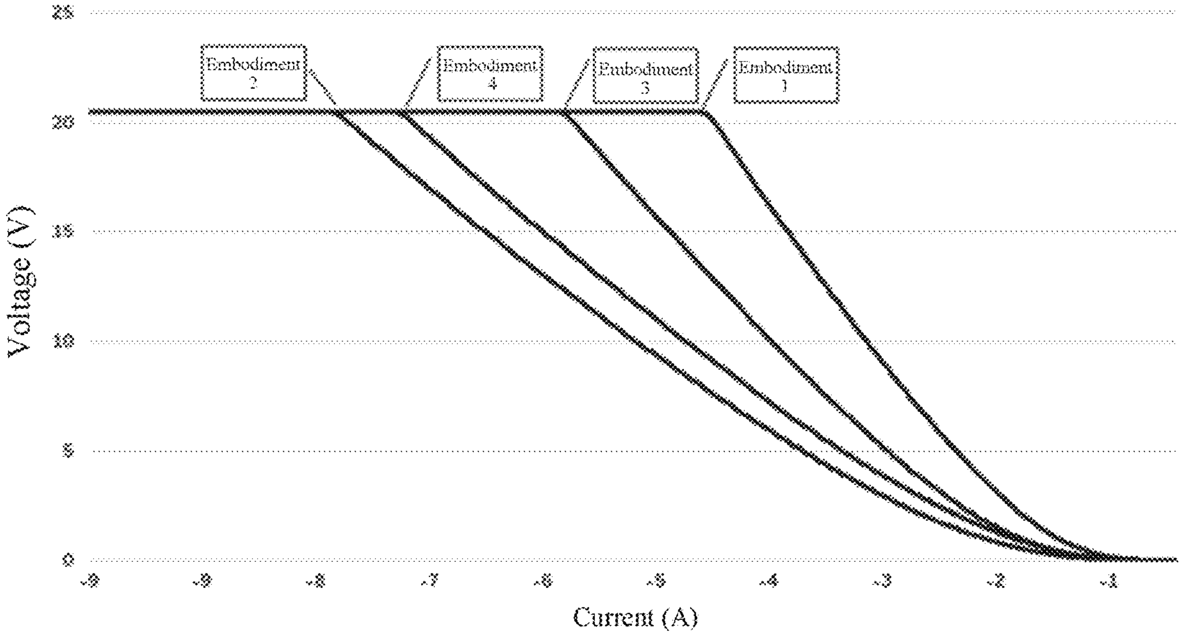
FIG. 56 is a graph of a relationship between a reverse current and a reverse voltage corresponding to Embodiments 1 to 4 according to an embodiment of the present application.
Figure 57:
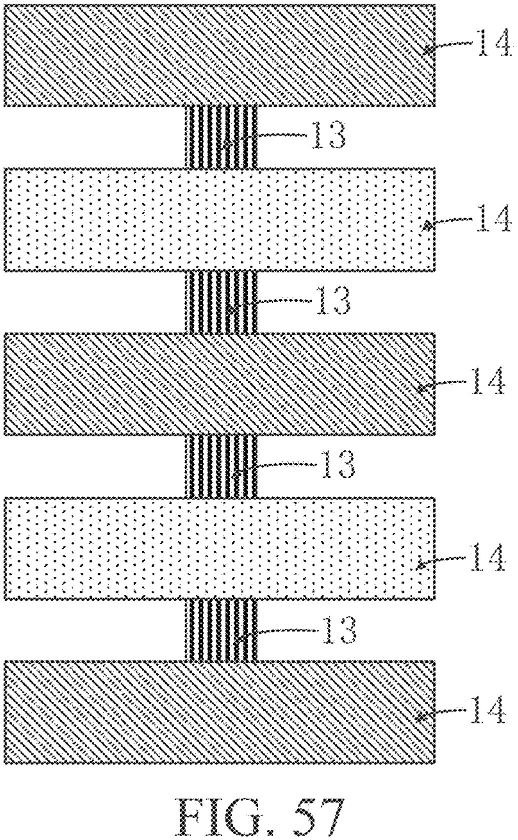
FIG. 57 is a fifth schematic distribution diagram of a conductive semiconductor structure between two adjacent strip-shaped doped regions having opposite conduction types in a back contact solar cell according to an embodiment of the present application.
Figure 58:
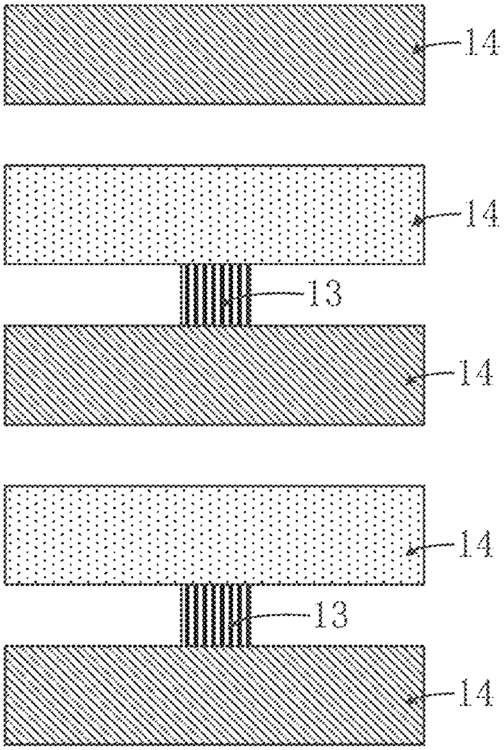
FIG. 58 is a sixth schematic distribution diagram of a conductive semiconductor structure between two adjacent strip-shaped doped regions having opposite conduction types in a back contact solar cell according to an embodiment of the present application.
Figure 59:
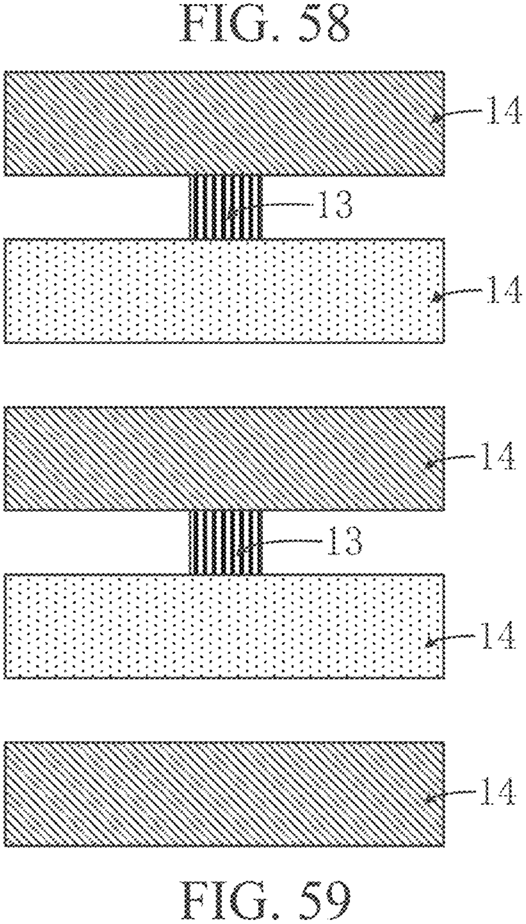
FIG. 59 is a seventh schematic distribution diagram of a conductive semiconductor structure between two adjacent strip-shaped doped regions having opposite conduction types in a back contact solar cell according to an embodiment of the present application.
Figure 60:
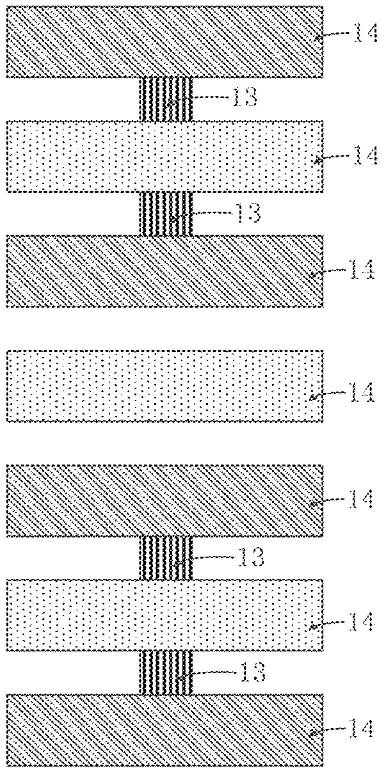
FIG. 60 is an eighth schematic distribution diagram of a conductive semiconductor structure between two adjacent strip-shaped doped regions having opposite conduction types in a back contact solar cell according to an embodiment of the present application.
Figure 61:
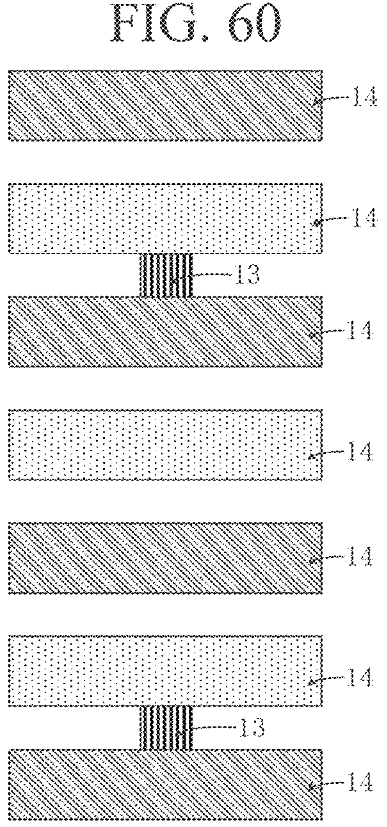
FIG. 61 is a ninth schematic distribution diagram of a conductive semiconductor structure between two adjacent strip-shaped doped regions having opposite conduction types in a back contact solar cell according to an embodiment of the present application.
Figure 62:
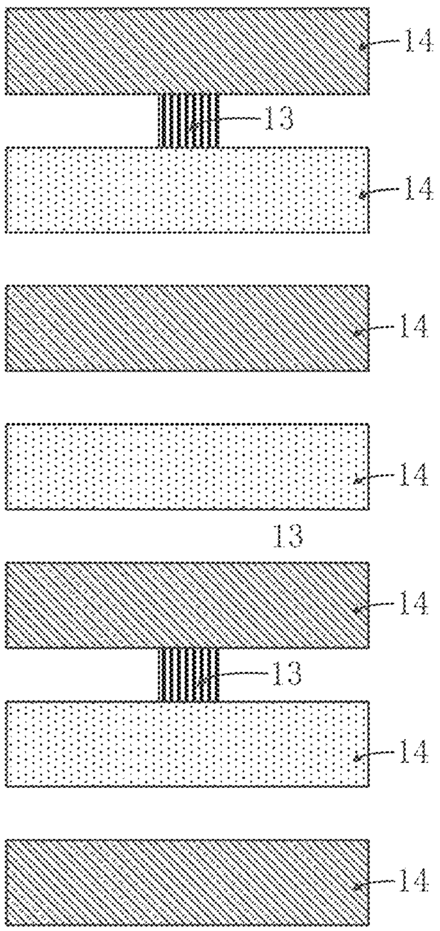
FIG. 62 is a tenth schematic distribution diagram of a conductive semiconductor structure between two adjacent strip-shaped doped regions having opposite conduction types in a back contact solar cell according to an embodiment of the present application.

It can be seen from data shown in FIG. 56 and Table 1 that because the conductive semiconductor structure is disposed, the maximum reverse voltage of the back contact solar cells corresponding to Embodiments 1 to 4 is less than the maximum reverse voltage corresponding to Comparative Example. In addition, the quantity of the conductive semiconductor structures in Embodiment 3 is less than the quantity of the disposed conductive semiconductor structures in Embodiment 1. Therefore, the maximum reverse voltage and the hot spot temperature of the back contact solar cell corresponding to Embodiment 3 are greater than the maximum reverse voltage and the hot spot temperature of the back contact solar cell corresponding to Embodiment 1. In addition, the disposition area of the conductive semiconductor structure in Embodiment 4 is smaller than the disposition area of the conductive semiconductor structure in Embodiment 3. Therefore, the maximum reverse voltage of the back contact solar cell corresponding to Embodiment 4 is greater than the maximum reverse voltage of the back contact solar cell corresponding to Embodiment 3.

With regard to a distribution case of different conductive semiconductor structures on the back surface, the position of each conductive semiconductor structure on the back surface may be randomly set. Preferably, as shown in FIG. 50 and FIG. 51, different conductive semiconductor structures 13 are evenly distributed on the back surface. In this case, reverse breakdown voltages of built-in diodes formed after the conductive semiconductor structures 13 are disposed between different regions of the first doped region and corresponding regions of the second doped region may be equal, so as to prevent a problem that the solar cell may be burned out due to local heat concentration when the back contact solar cell is blocked, and to further reduce a risk of hot spots of the photovoltaic module including the back contact solar cell provided in this embodiment of the present application.

In an actual application process, FIG. 57 to FIG. 62 show a plurality of alternative distribution manners of the conductive semiconductor structures 13 in different unit regions on the back surface. Different conductive semiconductor structures 13 may be evenly distributed on the back surface in at least a plurality of manners shown in FIG. 25 to FIG. 30. A distribution manner of different conductive semiconductor structures 13 on the back surface is not specifically limited in this embodiment of the present application.

Exemplarily, as shown in FIG. 50 and FIG. 51, different conductive semiconductor structures 13 may be distributed on the back surface in a matrix form. Adjacent rows of the conductive semiconductor structures 13 distributed in a matrix shape are aligned with or staggered from each other. In the conductive semiconductor structures 13 distributed in a matrix form, one conductive semiconductor structure 13 in each row is aligned with or staggered from a corresponding conductive semiconductor structure 13 in an adjacent row. Alternatively, in the conductive semiconductor structures 13 distributed in a matrix form, at least two conductive semiconductor structures 13 disposed oppositely in each row are aligned with or staggered from at least two conductive semiconductor structures 13 disposed oppositely in an adjacent row.

In this case, different conductive semiconductor structures 13 are distributed on the back surface regularly, and adjacent rows of the conductive semiconductor structures 13 in a matrix distribution are also aligned or staggered, so as to reduce difficulty in manufacturing the conductive semiconductor structures 13, and further evenly distribute the conductive semiconductor structures 13 on the back surface, thereby further preventing a problem that the solar cell may be burned out due to local heat concentration when the back contact solar cell is blocked.

In a case that adjacent rows of the conductive semiconductor structures distributed in a matrix form are staggered from each other, a staggered distance L between two adjacent rows of the conductive semiconductor structures may be any value greater than 0 and less than a geometrical center distance L1 between two adjacent conductive semiconductor structures in a same row.

Exemplarily, as shown in FIG. 51, in a case that the adjacent rows of the conductive semiconductor structures 13 distributed in a matrix form are staggered from each other, a staggered distance L between two adjacent rows of the conductive semiconductor structures 13 is equal to half a geometrical center distance L1 between two adjacent conductive semiconductor structures 13 in a same row. In this case, the distribution density of the conductive semiconductor structure 13 between different regions of the first doped region 11 and corresponding regions of the second doped region 12 may be approximately the same, so as to prevent a problem that the solar cell may be burned out due to local heat concentration when the back contact solar cell is blocked because there is a long region physically isolated by using an insulation channel or an insulation material between the first doped region 11 and the second doped region 12.

In an actual application process, as shown in FIG. 63, the back contact solar cell may further include a surface passivation layer 19 and an electrode structure 20. The surface passivation layer 19 is formed on at least the first doped region 11, the second doped region 12, and the conductive semiconductor structure 13. The electrode structure 20 extends through the surface passivation layer 19, and is separately in ohmic contact with the first doped region 11 and the second doped region 12. A part, electrically coupled to the first doped region 11, of the electrode structure 20 and a part, electrically coupled to the second doped region 12, of the electrode structure 20 are isolated from each other.

Specifically, materials and thicknesses of the surface passivation layer and the electrode structure are not specifically limited in this embodiment of the present application, provided that the surface passivation layer and the electrode structure can be applied to the back contact solar cell provided in this embodiment of the present application. In addition, as shown in FIG. 63, the conductive semiconductor structure 13 may be disposed on a part, in electrical contact with the conductive semiconductor structure, of the first doped region 11 and/or the second doped region 12. In this case, the conductive semiconductor structure 13 may also occupy a particular range of the part, in electrical contact with the conductive semiconductor structure, of the first doped region 11 and/or the second doped region 12, which may further affect manufacturing of the electrode structure 20. Based on this, it may be determined according to requirements on manufacturing precision of the electrode structure 20, contact performance of the electrode structure 20, and an effective electrical contact area corresponding to the conductive semiconductor structure 13 in an actual application scenario. This is not specifically limited herein.

Exemplarily, along a direction parallel to the back surface, a minimum spacing D4 between the electrode structure and a part, covering the conductive semiconductor structure, of the surface passivation layer may be greater than or equal to 30 μm and less than or equal to 250 μm. For example, along the direction parallel to the back surface, the minimum spacing D4 between the electrode structure and the part, covering the conductive semiconductor structure, of the surface passivation layer may be 30 μm, 50 μm, 80 μm, 100 μm, 150 μm, 200 μm, 220 μm, or 250 μm. In this case, in an actual application process, a device for manufacturing an electrode structure usually has processing errors, thus causing a target forming range of the electrode structure to deviate from an actual forming range. Based on this, the minimum spacing D4 between the electrode structure and the part, covering the conductive semiconductor structure, of the surface passivation layer is within the foregoing range, thereby preventing that the electrode structure is at least partially formed above the conductive semiconductor structure due to the small minimum spacing D4 and the collected carriers in the first doped region and/or the second doped region cannot be thus exported in time. In addition, a small width of the conductive semiconductor structure disposed on the first doped region and the second doped region due to the large minimum spacing D4 can be further prevented, thereby ensuring that each conductive semiconductor structure has a large effective electrical contact area, which is beneficial to reducing the reverse breakdown voltage of the back contact solar cell.

According to a second aspect, an embodiment of the present application provides a photovoltaic module. The photovoltaic module includes a solar cell according to the foregoing first aspect and various implementations of the first aspect.

For beneficial effects of the second aspect and various implementations of the second aspect in this embodiment of the present application, refer to the analysis of the beneficial effects of the first aspect and various implementations of the first aspect. Details are not described herein.

According to a third aspect, an embodiment of the present application further provides a method for manufacturing a back contact solar cell. The method for manufacturing a back contact solar cell includes the following steps.

First, a semiconductor substrate is provided.

Next, a first doped region and a second doped region are formed on a back surface of the semiconductor substrate. The first doped region and the second doped region are alternately spaced apart on the back surface of the semiconductor substrate, and the first doped region and the second doped region have opposite conduction types. A region located between the first doped region and the second doped region is a spacer region along an arrangement direction of the first doped region and the second doped region.

Next, a conductive semiconductor structure is formed on the back surface of the semiconductor substrate. The conductive semiconductor structure includes a first conductive semiconductor portion and a second conductive semiconductor portion in electrical contact with each other. The first conductive semiconductor portion is located in the spacer region, and a conduction type of the first conductive semiconductor portion is opposite to the conduction type of one of the first doped region and the second doped region. Only a part of the first doped region and only a part of the second doped region are at least electrically connected to the first conductive semiconductor portion, respectively. The second conductive semiconductor portion is disposed above a part, facing away from the semiconductor substrate, of the first doped region and/or the second doped region.

Specifically, the back surface of the semiconductor substrate may have a first region and a second region alternately spaced apart, and a spacer region located between the first region and the second region adjacent to the first region.

Boundaries between the first region, the second region, and the spacer region on the back surface of the semiconductor substrate are virtual boundaries, and subsequently the first doped region is formed in the first region. Therefore, a range of the first region on the back surface may be determined according to a forming range of the first doped region in an actual application scenario. Subsequently, the second doped region is formed in the second region. Therefore, a range of the second region on the back surface may be determined according to a forming range of the second doped region in an actual application scenario. Regarding the spacer region, after the ranges of the first region and the second region are determined, a range of the spacer region located between the first region and the second region adjacent to the first region is determined. For materials and sizes of the first doped region, the second doped region, and the conductive semiconductor structure, refer to the foregoing description. Details are not described herein.

In an actual manufacturing process, a manufacturing process of forming the first doped region, the second doped region, and the conductive semiconductor structure on the back surface of the semiconductor substrate is divided into the following two manufacturing processes:

The first manufacturing process includes: The first doped region is formed in the first region.

In an actual manufacturing process, an entire intrinsic semiconductor layer may be formed on the back surface by using a process such as chemical vapor deposition, and the intrinsic semiconductor layer is doped by diffusion or ion implantation to obtain a doped semiconductor material. Then, a laser etching process is used, or a process such as a dry etching process or a wet etching process is used under a masking action of a corresponding mask, to selectively etch the doped semiconductor material, to remove a part of the doped semiconductor material corresponding to the second region and the spacer region, so as to obtain the first doped region.

In a case that the intrinsic semiconductor layer is doped by diffusion and the intrinsic semiconductor layer is silicon, a side, facing away from the semiconductor substrate, of the first doped region is further formed with a conductive doped silicon glass layer or a doped silicon glass layer. In addition, when the manufactured back contact solar cell further includes a passivation layer located between the first doped region and the first region, before the foregoing intrinsic semiconductor layer is formed, an entire passivation material layer may be formed on the back surface by using a process such as chemical vapor deposition. Then, the foregoing passivation material layer is selectively etched at the same time of selectively etching the doped semiconductor material, to obtain a passivation layer located between the first doped region and the semiconductor substrate. Certainly, before the intrinsic semiconductor layer is formed, the passivation layer may be formed only in the first region by using a process such as deposition or etching.

Next, as shown in FIG. 11, an entire doped semiconductor material layer is formed in the first doped region 11, the spacer region, and the second region.

In an actual manufacturing process, an entire intrinsic semiconductor layer may be formed in the first doped region, the spacer region, and the second region by using a process such as chemical vapor deposition, and the intrinsic semiconductor layer is doped by diffusion or ion implantation to obtain a doped semiconductor material layer.

In a case that the intrinsic semiconductor layer is doped by diffusion and the intrinsic semiconductor layer is silicon, a side, facing away from the semiconductor substrate, of the doped semiconductor material layer is further formed with a doped silicon glass layer or a conductive doped silicon glass layer.

Next, as shown in FIG. 11, the doped semiconductor material layer is selectively etched to remove a part of the first doped region 11 and a part of the spacer region corresponding to the doped semiconductor material layer. The second doped region 12 and at least one conductive semiconductor structure 13 are formed from the selectively etched doped semiconductor material layer. The second doped region 12 is located in the second region. The second doped region 12 and the first doped region 11 have opposite conduction types, and the second doped region 12 and the conductive semiconductor structure 13 have a same conduction type. Only a part of the first doped region 11 and only a part of the second doped region 12 are respectively in electrical contact with at least one conductive semiconductor structure 13. The conductive semiconductor structure 13 includes a first conductive semiconductor portion 17 and a second conductive semiconductor portion 18 that are integrally continuous. The first conductive semiconductor portion 17 is located between the first doped region 11 and the second doped region 12. The second conductive semiconductor portion 18 is disposed above a part, facing away from the semiconductor substrate, of the first doped region 11.

In an actual application process, a laser etching process is used, or a process such as a dry etching process or a wet etching process is used under a masking action of a corresponding mask, to selectively etch the doped semiconductor material layer, to remove parts of the doped semiconductor material layer corresponding to a part of the first region and a part of the spacer region, so as to obtain the second doped region and the conductive semiconductor structure. A left schematic diagram in FIG. 11 is a schematic diagram of a selectively etched region (corresponding to a region in which a grid is located in the figure) after the doped semiconductor material layer is formed. A right schematic diagram in FIG. 11 is a schematic diagram after the second doped region and the conductive semiconductor structure are selectively etched.

It may be understood that under the manufacturing method, if the material of the first doped region is silicon and the first doped region is diffused by using a diffusion process, after the conductive semiconductor structure is formed, a doped silicon glass layer or a conductive doped silicon glass layer is provided between the second conductive semiconductor portion included in the conductive semiconductor structure and the first doped region located right below the conductive semiconductor structure. Alternatively, before the intrinsic semiconductor layer for manufacturing the second doped region and the conductive semiconductor structure is formed, the doped silicon glass layer or the conductive doped silicon glass layer located on the first doped region may be removed, so that the second conductive semiconductor portion included in the conductive semiconductor structure may be in direct contact with the first doped region located right below the conductive semiconductor structure. Alternatively, before the intrinsic semiconductor layer for manufacturing the second doped region and the conductive semiconductor structure is formed, the doped silicon glass layer or the conductive doped silicon glass layer located on the first doped region may be removed, and a corresponding film layer (for example, a transparent conductive layer) meeting an actual requirement is formed.

In addition, when the manufactured back contact solar cell further includes a passivation layer located between the second doped region and the second region, after the first doped region is formed, and before the intrinsic semiconductor layer for manufacturing the doped semiconductor material layer is formed, a process such as chemical vapor deposition may be used, to form an entire passivation material layer in the first doped region, the spacer region, and the second region. Then, the foregoing passivation material layer is selectively etched at the same time of selectively etching the doped semiconductor material layer, to obtain passivation layers located between the second doped region and the semiconductor substrate and between the conductive semiconductor structure and the semiconductor substrate. Certainly, before the intrinsic semiconductor layer is formed, the passivation layer may be formed only in the second region by using a process such as deposition or etching.

The second manufacturing process includes: The second doped region is formed in the first region. Next, an entire doped semiconductor material layer is formed in the second doped region, the spacer region, and the second region. Next, the doped semiconductor material layer is selectively etched to remove a part the doped semiconductor material layer located between a part of the second doped region and a part of the spacer region. The first doped region and at least one conductive semiconductor structure are formed from the selectively etched doped semiconductor material layer. The first doped region is located in the second region. The first doped region and the second doped region have opposite conduction types, and the first doped region and the conductive semiconductor structure have a same conduction type. Only a part of the first doped region and only a part of the second doped region are respectively in electrical contact with at least one conductive semiconductor structure. Each conductive semiconductor structure includes a first conductive semiconductor portion and a second conductive semiconductor portion that are integrally continuous. The first conductive semiconductor portion is located between the first doped region and the second doped region. The second conductive semiconductor portion is disposed above a part, facing away from the semiconductor substrate, of the second doped region.

For a specific manufacturing process of the second manufacturing method, refer to the specific manufacturing process of the first manufacturing method described above. A difference between the two manufacturing processes is that in the first manufacturing process, the conductive semiconductor structure and the second doped region are integrally continuous, and in the second manufacturing process, the conductive semiconductor structure and the first doped region are integrally continuous.

For beneficial effects of the third aspect and various implementations of the third aspect in this embodiment of the present application, refer to the analysis of the beneficial effects of the first aspect and various implementations of the first aspect. Details are not described herein.

In addition, in an actual application process, the conductive semiconductor structure may be independently formed on the semiconductor substrate with respect to the first doped region and the second doped region. Based on this, in an actual manufacturing process, processes such as deposition and selective etching may be used to form the first doped region in the first region on the back surface of the semiconductor substrate, and to form the second doped region in the second region on the back surface of the semiconductor substrate. In this case, the first doped region and the second doped region are alternately spaced apart. Then, a process such as deposition and etching is used, to form the conductive semiconductor structure at least in some spacer regions according to a requirement on a forming range of the conductive semiconductor structure in an actual application scenario.

In the foregoing descriptions, technical details such as patterning and etching of the layers are not described in detail. However, a person skilled in the art should understand that a layer, a region, and the like of a required shape may be formed through various technical means. In addition, to form the same structure, a person skilled in the art may further design a method that is not exactly the same as the method described above. In addition, although the embodiments are separately described above, this does not mean that the measures in the embodiments cannot be advantageously used in combination.

The embodiments of the present disclosure are described above. However, the embodiments are merely for illustrative purposes and are not intended to limit the scope of the present disclosure. The scope of the present disclosure is defined by the appended claims and equivalents thereof. A person skilled in the art may make various substitutes and modifications without departing from the scope of the present disclosure, and the substitutes and modifications shall fall within the scope of the present disclosure.

The invention claimed is:

1. A back contact solar cell, comprising: a semiconductor substrate, a first doped region, a second doped region, and at least one conductive semiconductor structure, wherein the first doped region and the second doped region are alternately spaced apart on a back surface of the semiconductor substrate, the first doped region and the second doped region having opposite conduction types, wherein a spacer region is located between the first doped region and the second doped region along an arrangement direction of the first doped region and the second doped region, wherein the first doped region and the second doped region each comprise a plurality of strip-shaped doped regions, wherein the conductive semiconductor structure comprises a first conductive semiconductor portion and a second conductive semiconductor portion in electrical contact with each other, wherein the first conductive semiconductor portion is located in the spacer region, and a conduction type of the first conductive semiconductor portion is opposite to a conduction type of one of the first doped region and the second doped region, wherein at least a part of the first doped region and at least a part of the second doped region are electrically connected to the first conductive semiconductor portion, wherein the second conductive semiconductor portion is disposed above a part of the first doped region and/or the second doped region, wherein the part of the first doped region and/or the second doped region faces away from the semiconductor substrate, wherein a width of a strip-shaped doped region in contact with the conductive semiconductor structure in the first doped region is D2, a width of a strip-shaped doped region in contact with the conductive semiconductor structure in the second doped region is D3, wherein a width of a part of the second conductive semiconductor portion is X1, wherein the part of the second conductive semiconductor portion is disposed above the strip-shaped doped regions comprised in the first doped region and/or above the strip-shaped doped regions comprised in the second doped region along a width direction of the strip-shaped doped regions, and wherein:

when the second conductive semiconductor portion is disposed above the strip-shaped doped regions comprised in the first doped region, $0.1D2 \leq X1 < 0.5D2$; and/or when the second conductive semiconductor portion is disposed above the strip-shaped doped regions comprised in the second doped region, $0.1D3 \leq X1 < 0.5D3$.

2. The back contact solar cell according to claim 1, comprising:

a contact surface between one of the first doped region and the second doped region that has a conduction type opposite to that of the conductive semiconductor structure, and the conductive semiconductor structure, wherein the contact surface comprises a side effective electrical contact surface, wherein a height of the side effective electrical contact surface is a side effective electrical contact height Z, and an extension direction of the side effective electrical contact surface is parallel to a thickness direction of the semiconductor substrate.

3. The back contact solar cell according to claim 1, wherein the strip-shaped doped regions comprised in the first doped region and the strip-shaped doped regions comprised in the second doped region are spaced apart in parallel, and wherein the first conductive semiconductor portion comprised in the conductive semiconductor structure is located between two adjacent strip-shaped doped regions respectively belonging to the first doped region and the second doped region, wherein a width direction of the conductive semiconductor structure is parallel to an extension direction of the strip-shaped doped regions.

4. The back contact solar cell according to claim 1, wherein the first doped region and the second doped region alternate interdigitatedly, wherein each of the first doped region and the second doped region comprises a plurality of strip-shaped doped regions and at least one connection region, wherein the strip-shaped doped regions comprised in the first doped region and the strip-shaped doped regions comprised in the second doped region are alternately spaced apart in parallel, wherein each connection region is electrically connected to the corresponding strip-shaped doped region having a same conduction type as the connection region, wherein an extension direction of the connection region is different from an extension direction of the strip-shaped doped regions;

wherein:

the first conductive semiconductor portion comprised in at least one conductive semiconductor structure is located between two adjacent strip-shaped doped regions respectively belonging to the first doped region and the second doped region, wherein a width direction of the conductive semiconductor structure is parallel to the extension direction of the strip-shaped doped regions; and/or the first conductive semiconductor portion comprised in at least one conductive semiconductor structure is located between one strip-shaped doped region comprised in one of the first doped region and the second doped region and an adjacent connection region comprised in the other doped region, wherein a width direction of the conductive semiconductor structure is parallel to a distribution direction of the strip-shaped doped regions having the opposite conduction types.

5. The back contact solar cell according to claim 3, wherein a width of the conductive semiconductor structure along an extension direction of the spacer region is W, wherein the second conductive semiconductor portion is in electrical contact with the corresponding strip-shaped doped regions, and wherein:

$X1 \leq W \leq 40X1$, and/or a side effective electrical contact height between the first doped region and the second doped region electrically connected to each other through the conductive semiconductor structure is Z, and $X1/1500 \leq Z \leq X1/400$.

6. The back contact solar cell according to claim 4, wherein a width of a part of the second conductive semiconductor portion is X2, wherein the part of the second conductive semiconductor portion is disposed above the strip-shaped doped regions comprised in the first doped region and/or above the strip-shaped doped regions comprised in the second doped region along the extension direction of the strip-shaped doped regions, and wherein:

when the second conductive semiconductor portion is disposed above the strip-shaped doped regions comprised in the first doped region, $0.1D2 \leq X2 \leq 1.2D2$; and/or when the second conductive semiconductor portion is disposed above the strip-shaped doped regions comprised in the second doped region, $0.1D3 \leq X2 \leq 1.2D3$.

7. The back contact solar cell according to claim 4, wherein a width of the connection regions in contact with the conductive semiconductor structure in the first doped region and the second doped region is W1, and wherein a width of a part of the second conductive semiconductor portion is X3, disposed above the connection region comprised in the first doped region and/or the connection region comprised in the second doped region along the extension direction of the strip-shaped doped regions, and $0.1W1 \leq X3 \leq 0.3W1$.

8. The back contact solar cell according to claim 4, wherein the first conductive semiconductor portion is located between one strip-shaped doped region comprised in one of the first doped region and the second doped region and an adjacent connection region comprised in the other doped region, wherein a width of the connection region comprised in one of the first doped region and the second doped region and in contact with the conductive semiconductor structure is W1, a length of the strip-shaped doped region comprised in the other of the first doped region and the second doped region and in contact with the conductive semiconductor structure is W2, and a width of a spacer region located between the first doped region and the second doped region is D1; and wherein a length of the conductive semiconductor structure along a width direction of the spacer region is D, and $$D1 \leq D \leq D1 + \frac{1}{2}W1 + \frac{1}{10}W2.$$

9. The back contact solar cell according to claim 1, wherein a width of the conductive semiconductor structure along an extension direction of the spacer region is W; and a side effective electrical contact height between the first doped region and the second doped region electrically connected to each other through the conductive semiconductor structure is Z; and wherein the second conductive semiconductor portion is insulated from the corresponding strip-shaped doped regions, and wherein $W/160000 \leq Z \leq W/25$.

10. The back contact solar cell according to claim 1, wherein the back contact solar cell comprises a plurality of conductive semiconductor structures, and wherein adjacent conductive semiconductor structures are spaced apart.

11. The back contact solar cell according to claim 10, wherein:

the back contact solar cell is an entire back contact solar cell, wherein a quantity of the conductive semiconductor structures comprised in the back contact solar cell is greater than or equal to 30 and is less than or equal to 8000; or back contact solar cell is a 1/N back contact solar cell, wherein a quantity of the conductive semiconductor structures comprised in the back contact solar cell is greater than or equal to 30/N and is less than or equal to 8000/N, wherein N is a positive integer greater than or equal to 2.

12. The back contact solar cell according to claim 10, wherein orthographic projection areas of the plurality of conductive semiconductor structures on the back surface are equal; and/or the plurality of conductive semiconductor structures are evenly distributed on the back surface.

13. The back contact solar cell according to claim 10, wherein the plurality of conductive semiconductor structures are distributed on the back surface in a matrix form, wherein adjacent rows of the conductive semiconductor structures distributed in the matrix form are aligned with or staggered from each other.

14. The back contact solar cell according to claim 13, wherein the adjacent rows of the conductive semiconductor structures distributed in the matrix form are staggered from each other, wherein a staggered distance between two adjacent rows of the conductive semiconductor structures is equal to half a geometrical center distance between two adjacent conductive semiconductor structures in a same row.

15. The back contact solar cell according to claim 1, wherein an orthographic projection area, on the back surface, of a part of at least one conductive semiconductor structure located between the first doped region and the second doped region is S1, an area of the back surface is S2, and a ratio of S1 to S2 is greater than or equal to $8.5\times10^{-7}\%$ and is less than or equal to $6.67\times10^{-1}\%$.

16. The back contact solar cell according to claim 1, wherein a width of a spacer region located between the first doped region and the second doped region is D1, a width of the conductive semiconductor structure along an extension direction of the spacer region is W, and $0.5D1 \leq W \leq 6D1$.

17. The back contact solar cell according to claim 1, wherein the back contact solar cell further comprises a surface passivation layer and an electrode structure, wherein the surface passivation layer is formed on at least the first doped region, the second doped region, and the conductive semiconductor structure, wherein the electrode structure extends through the surface passivation layer, and is separately in ohmic contact with the first doped region and the second doped region, wherein a first part of the electrode structure and a second part of the electrode structure are isolated from each other, wherein the first part of the electrode structure is electrically connected to the first doped region, and the second part of the electrode structure is electrically connected to the second doped region, and wherein along a direction parallel to the back surface, a minimum spacing between the electrode structure and a part of the surface passivation layer is greater than or equal to 30 μm and is less than or equal to 250 μm, wherein the part of the surface passivation layer covers the conductive semiconductor structure.

18. The back contact solar cell according to claim 1, wherein at least one of the first doped region, the second doped region, and the conductive semiconductor structure comprises a doped semiconductor layer located on the back surface of the semiconductor substrate, and wherein the back contact solar cell further comprises a passivation layer located between the semiconductor substrate and the doped semiconductor layer.

* * * * *